(12) United States Patent
Koyama et al.

(10) Patent No.: US 7,851,318 B2
(45) Date of Patent: Dec. 14, 2010

(54) SEMICONDUCTOR SUBSTRATE AND METHOD FOR MANUFACTURING THE SAME, AND METHOD FOR MANUFACTURING SEMICONDUCTOR DEVICE

(75) Inventors: Masaki Koyama, Atsugi (JP); Fumito Isaka, Zama (JP); Akihisa Shimomura, Isehara (JP); Junpei Momo, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/285,924

(22) Filed: Oct. 16, 2008

(65) Prior Publication Data
US 2009/0115029 A1    May 7, 2009

(30) Foreign Application Priority Data
Nov. 1, 2007    (JP) ............................. 2007-285591

(51) Int. Cl.
*H01L 21/331* (2006.01)
*H01L 21/8222* (2006.01)

(52) U.S. Cl. .................. 438/311; 438/509; 438/535; 438/663; 257/E21.17; 257/E21.077; 257/E21.267; 257/E21.218; 257/E21.229; 257/E21.115; 257/E21.247; 257/E21.248; 257/E21.321; 257/E21.304; 257/E21.333; 257/E21.475; 257/E21.517

(58) Field of Classification Search .................. 438/311, 438/197, 474, 475, 506, 508, 509, 513, 524, 438/535, 487, 663, 692, 680, 602, 603, 604, 438/752, 753, 933, 706, 745; 257/E21.077, 257/E21.115, E21.218, E21.229, E21.247, 257/E21.248, E21.267, E21.319, E21.304, 257/E21.321, E21.333, E21.475, E21.517
See application file for complete search history.

(56) References Cited

U.S. PATENT DOCUMENTS
5,374,564 A    12/1994    Bruel
(Continued)

FOREIGN PATENT DOCUMENTS
JP    11-097379    4/1999
(Continued)

*Primary Examiner*—David Nhu
(74) *Attorney, Agent, or Firm*—Eric J. Robinson; Robinson Intellectual Property Law Office, P.C.

(57) ABSTRACT

A semiconductor substrate is irradiated with accelerated hydrogen ions, thereby forming a damaged region including a large amount of hydrogen. After a single crystal semiconductor substrate and a supporting substrate are bonded to each other, the semiconductor substrate is heated, so that the single crystal semiconductor substrate is separated in the damaged region. A single crystal semiconductor layer which is separated from the single crystal semiconductor substrate is irradiated with a laser beam. The single crystal semiconductor layer is melted by laser beam irradiation, whereby the single crystal semiconductor layer is recrystallized to recover its crystallinity and to planarized a surface of the single crystal semiconductor layer. After the laser beam irradiation, the single crystal semiconductor layer is heated at a temperature at which the single crystal semiconductor layer is not melted, so that the lifetime of the single crystal semiconductor layer is improved.

39 Claims, 45 Drawing Sheets

U.S. PATENT DOCUMENTS

| | | | |
|---|---|---|---|
| 5,854,096 | A | 12/1998 | Ohtani et al. |
| 6,127,702 | A | 10/2000 | Yamazaki et al. |
| 6,184,068 | B1 | 2/2001 | Ohtani et al. |
| 6,271,101 | B1 | 8/2001 | Fukunaga |
| 6,326,248 | B1 | 12/2001 | Ohtani et al. |
| 6,335,231 | B1 | 1/2002 | Yamazaki et al. |
| 6,372,609 | B1 | 4/2002 | Aga et al. |
| 6,380,046 | B1 * | 4/2002 | Yamazaki .................. 438/409 |
| 6,388,652 | B1 | 5/2002 | Yamazaki et al. |
| 6,534,380 | B1 * | 3/2003 | Yamauchi et al. ........... 438/455 |
| 6,589,824 | B2 | 7/2003 | Ohtani et al. |
| 6,602,761 | B2 | 8/2003 | Fukunaga |
| 6,686,623 | B2 | 2/2004 | Yamazaki |
| 6,778,164 | B2 | 8/2004 | Yamazaki et al. |
| 6,803,264 | B2 | 10/2004 | Yamazaki et al. |
| 6,875,633 | B2 | 4/2005 | Fukunaga |
| 6,919,237 | B2 | 7/2005 | Ohtani et al. |
| 7,119,365 | B2 | 10/2006 | Takafuji et al. |
| 7,176,525 | B2 | 2/2007 | Fukunaga |
| 7,199,024 | B2 | 4/2007 | Yamazaki |
| 7,256,776 | B2 | 8/2007 | Yamazaki et al. |
| 7,470,575 | B2 | 12/2008 | Ohtani et al. |
| 2004/0104424 | A1 | 6/2004 | Yamazaki |
| 2005/0009252 | A1 | 1/2005 | Yamazaki et al. |
| 2006/0267152 | A1 * | 11/2006 | Forbes ...................... 257/617 |
| 2007/0063281 | A1 | 3/2007 | Takafuji et al. |
| 2007/0108510 | A1 | 5/2007 | Fukunaga |
| 2007/0173000 | A1 | 7/2007 | Yamazaki |
| 2007/0184632 | A1 | 8/2007 | Yamazaki et al. |
| 2007/0291022 | A1 | 12/2007 | Yamazaki et al. |
| 2009/0075460 | A1 | 3/2009 | Ohtani et al. |
| 2009/0170286 | A1 * | 7/2009 | Tsukamoto et al. ......... 438/458 |

FOREIGN PATENT DOCUMENTS

| | | |
|---|---|---|
| JP | 11-163363 | 6/1999 |
| JP | 2000-012864 | 1/2000 |
| JP | 2000-124092 | 4/2000 |
| JP | 2000-150905 | 5/2000 |
| JP | 2004-087606 | 3/2004 |
| JP | 2005-252244 | 9/2005 |

\* cited by examiner

FIG. 39A
FIG. 39B
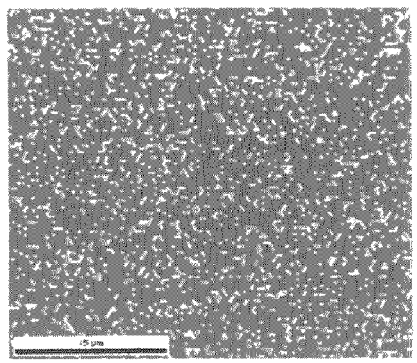
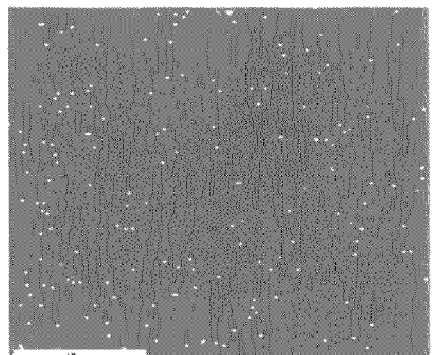
15 μm
15 μm
FIG. 39C
Gray Scale Map Type: <none>
Color Coded Map Type: Inverse Pole Figure [001]
Silicon
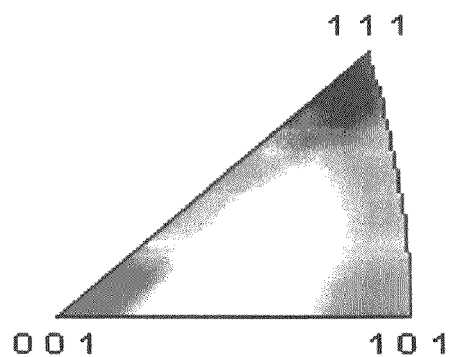
Boundaries: <none>

FIG. 51

| Acceleration voltage | H (element) ratio X:Y | H ion species ratio (X:Y/3) |
|---|---|---|
| 80kV | 01:44.1 | 01:14.7 |
| 60kV | 01:42.5 | 01:14.2 |
| 40kV | 01:43.5 | 01:14.5 |

SEMICONDUCTOR SUBSTRATE AND METHOD FOR MANUFACTURING THE SAME, AND METHOD FOR MANUFACTURING SEMICONDUCTOR DEVICE

The patent or application file contains at least one drawing executed in color. Copies of this patent or patent application publication with color drawing(s) will be provided by the Office upon request and payment of the necessary fee.

BACKGROUND OF THE INVENTION

1. Field of the Invention

The present invention relates to a method for manufacturing a semiconductor substrate to which a single crystal semiconductor layer is fixed with a buffer layer interposed therebetween and a method for manufacturing a semiconductor device.

2. Description of the Related Art

Integrated circuits have been developed, which use a semiconductor substrate called a silicon-on-insulator (hereinafter also referred to as an SOI) that has a thin single crystal semiconductor layer over an insulating surface, instead of a silicon wafer that is manufactured by thinly slicing an ingot of a single crystal semiconductor. An integrated circuit using an SOI substrate has been attracting attention because parasitic capacitance between drains of the transistors and the substrate can be reduced and thus the performance of the semiconductor integrated circuit is improved.

Known examples of SOI substrates are SIMOX substrates and bonded substrates. For example, an SOI structure of a SIMOX substrate is obtained by implantation of oxygen ions into a single crystal silicon substrate and by heat treatment performed at 1300° C. or higher to form a buried oxide (BOX) layer, whereby a single crystal silicon thin film is formed on the surface.

As another method for manufacturing SOI substrates, a hydrogen ion implantation separation method is known (for example, see Reference 1: Japanese Published Patent Application No. 2000-124092). The hydrogen ion implantation separation method is a method by which hydrogen ions are implanted into a silicon wafer to form a microbubble layer at a predetermined depth from the surface, and a thin silicon layer is bonded to another silicon wafer using the microbubble layer as a cleavage plane. In addition to the heat treatment for separation of a silicon layer, it is said that it is necessary to perform heat treatment in an oxidizing atmosphere to form an oxide film over the silicon layer, remove the oxide film, and perform heat treatment at 1000° C. to 1300° C. to increase bonding strength.

Further, a method for manufacturing an SOI substrate in which a single crystal silicon layer is bonded to a glass substrate is known (for example, see Reference 2: Japanese Published Patent Application No. 2005-252244). In Reference 2, as a method for manufacturing an SOI substrate which does not need heat treatment at a high temperature exceeding 800° C., an insulating substrate is irradiated with a laser beam in order to increase bonding strength. Further, in Reference 2, mirror polishing of a single crystal silicon layer which is performed after laser beam irradiation is mentioned as a preferred embodiment mode.

Furthermore, the present applicant has disclosed a method for manufacturing a semiconductor device using Smart Cut (registered trademark), in which a substrate having high heat resistance is used as a supporting substrate, in References 3 and 4 and has disclosed a method for manufacturing a semiconductor device using Smart Cut (registered trademark), in which a light transmitting substrate is used as a supporting substrate, in Reference 5 (Reference 3: Japanese Published Patent Application No. H 11-163363, Reference 4: Japanese Published Patent Application No. 2000-012864, and Reference 5: Japanese Published Patent Application No. 2000-150905).

SUMMARY OF THE INVENTION

Because a glass substrate has a larger area and is less expensive than a silicon wafer, a glass substrate is used as a supporting substrate, whereby an inexpensive large-area SOI substrate can be manufactured. However, a glass substrate has a strain point of 700° C. or lower and thus has low heat resistance. Therefore, a glass substrate cannot be heated at a temperature which exceeds its upper temperature limit, and the process temperature is limited to be 700° C. or lower. That is, there are also limitations on process temperatures for a process of removing a crystal defect at a separation plane and a step of planarizing a surface.

Removal of a crystal defect in a semiconductor layer that is bonded to a silicon wafer has been conventionally achieved by heating at a temperature of 1000° C. or higher; however, such a high temperature process cannot be employed for removal of a crystal defect in a semiconductor layer that is bonded to a glass substrate having a strain point of 700° C. or lower. That is, a recrystallization method has not been established, by which a single crystal semiconductor layer that is bonded to a glass substrate having a strain point of 700° C. or lower is recovered to a single crystal semiconductor layer having the same or substantially the same crystallinity as a single crystal semiconductor substrate before processing.

A glass substrate is more easily bent than a silicon wafer and has an undulating surface. In particular, it is difficult to perform treatment by mechanical polishing on a large-area glass substrate having a side that is longer than 30 cm. Accordingly, from the viewpoint of processing accuracy, yield, and the like, treatment by mechanical polishing on a separation plane is not recommended to be used for planarization treatment of a semiconductor layer that is bonded to a supporting substrate. Meanwhile, it is required to suppress unevenness on the surface of the separation plane in order to manufacture high-performance semiconductor elements. This is because when a transistor is manufactured using an SOI substrate, a gate electrode is formed over a semiconductor layer with a gate insulating layer interposed therebetween. Thus, if there is a large unevenness of the semiconductor layer, it is difficult to manufacture a gate insulating layer with high dielectric strength. Therefore, a thick gate insulating layer is needed for higher dielectric strength. Accordingly, large unevenness on the surface of the semiconductor layer causes a decrease in performance of the semiconductor elements such as a decrease in field-effect mobility, an increase in threshold voltage, and the like.

In this manner, when a substrate which has low heat resistance and is easily bent, such as a glass substrate, is used as a supporting substrate, a problem emerges in that it is difficult to improve surface unevenness of a semiconductor layer that is separated from a silicon wafer and fixed to the supporting substrate.

In view of such problems, an object of the present invention is to provide a method for manufacturing a semiconductor substrate and a semiconductor device, by which a high-performance semiconductor element can be formed even when a substrate having low heat resistance is used as a supporting substrate. Another object of the present invention is to provide a semiconductor substrate which allows manufacturing of a high-performance semiconductor element can be formed.

One aspect of a method for manufacturing a semiconductor substrate of the present invention includes the steps of preparing a single crystal semiconductor substrate and a supporting substrate; irradiating the single crystal semiconductor substrate with accelerated ions by an ion doping apparatus, whereby a damaged region is formed in a region of the single crystal semiconductor substrate at a predetermined depth from a surface of the single crystal semiconductor substrate; forming a buffer layer over at least one of the supporting substrate and the single crystal semiconductor substrate; disposing the supporting substrate and the single crystal semiconductor substrate in close contact with each other with the buffer layer interposed therebetween to bond a surface of the buffer layer to a surface disposed in close contact with the surface of the buffer layer, whereby the single crystal semiconductor substrate is fixed to the supporting substrate; causing a crack in the damaged region by heating of the single crystal semiconductor substrate to separate the single crystal semiconductor substrate from the supporting substrate, whereby the supporting substrate is formed, to which a single crystal semiconductor layer separated from the single crystal semiconductor substrate is fixed; irradiating the single crystal semiconductor layer with a laser beam to melt the single crystal semiconductor layer, whereby the single crystal semiconductor layer is recrystallized; and heating the recrystallized single crystal semiconductor layer at a temperature which is higher than or equal to 400° C. and does not melt the recrystallized single crystal semiconductor layer.

Another aspect of a method for manufacturing a semiconductor device of the present invention includes the steps of preparing a single crystal semiconductor substrate and a supporting substrate with a strain point of 700° C. or lower; irradiating the single crystal semiconductor substrate with accelerated ions by an ion doping apparatus, whereby a damaged region is formed in a region of the single crystal semiconductor substrate at a predetermined depth from a surface of the single crystal semiconductor substrate; forming a buffer layer over at least one of the supporting substrate and the single crystal semiconductor substrate; disposing the supporting substrate and the single crystal semiconductor substrate in close contact with each other with the buffer layer interposed therebetween to bond a surface of the buffer layer to a surface disposed in close contact with the surface of the buffer layer, whereby the single crystal semiconductor substrate is fixed to the supporting substrate; causing a crack in the damaged region by heating of the single crystal semiconductor substrate to separate the single crystal semiconductor substrate from the supporting substrate, whereby the supporting substrate is formed, to which a single crystal semiconductor layer separated from the single crystal semiconductor substrate is fixed; irradiating the single crystal semiconductor layer with a laser beam to melt the single crystal semiconductor layer, whereby the single crystal semiconductor layer is recrystallized; heating the recrystallized single crystal semiconductor layer at a temperature which is higher than or equal to 400° C. and lower than or equal to the strain point without melting the single crystal semiconductor layer; etching the heated single crystal semiconductor layer to be divided into a plurality of second single crystal semiconductor layers; forming a gate insulating layer over the plurality of second single crystal semiconductor layers; forming a gate electrode over the plurality of second single crystal semiconductor layers with the gate insulating layer interposed therebetween; and adding an impurity to be a donor or an acceptor to the plurality of second single crystal semiconductor layers.

One aspect of a semiconductor substrate of the present invention includes a supporting substrate with a strain point of 700° C. or lower, a buffer layer; and a single crystal semiconductor layer which is fixed to the supporting substrate with the buffer layer interposed therebetween, where the hydrogen concentration of the single crystal semiconductor layer is higher than or equal to $5\times10^{18}$ atoms/cm$^3$ and lower than or equal to $5\times10^{20}$ atoms/cm$^3$.

Here, the term "single crystal" means a crystal in which, when a certain crystal axis is focused, the direction of the crystal axis is oriented in the same direction in any portion of a sample and which has no crystal grain boundaries between crystals. Note that, in this specification, the single crystal includes a crystal in which the direction of crystal axes is uniform as described above and which has no grain boundaries even when it includes a crystal defect or a dangling bond.

Note that recrystallization of a layer including a crystal structure means that a layer including a crystal structure returns to a layer including a crystal structure again after being in a different state from the crystal structure (e.g., a liquid-phase state). Further, in this specification, re-single-crystallization means that a single crystal semiconductor is recrystallized and becomes a single crystal semiconductor.

In a semiconductor substrate and a method for manufacturing a semiconductor device of the present invention, by laser beam irradiation, a region irradiated with a laser beam in a single crystal semiconductor layer is melted from the surface partly in a depth direction. For example, the surface and a vicinity of the surface are melted. Alternatively, the region irradiated with the laser beam in the single crystal semiconductor layer is melted entirely in a depth direction.

In a semiconductor substrate and a method for manufacturing a semiconductor device of the present invention, it is preferable that a semiconductor layer be irradiated with a laser beam in an inert gas atmosphere. Alternatively, it is preferable that irradiation with a laser beam be performed with an inert gas blown on a region irradiated with a laser beam in an upper surface of the single crystal semiconductor layer. As an inert gas, a nitrogen gas or a rare gas can be used. An inert gas is a gas of a molecule or an atom which does not form an oxide film by reacting with a surface of a single crystal semiconductor layer in a laser beam irradiation process. For example, as the inert gas, a nitrogen gas ($N_2$ gas); a rare gas such as argon or xenon; and the like are given.

In the present invention, it is preferable that a substrate having a strain point of 650° C. to 700° C. be used as the supporting substrate. A glass substrate can be used as the supporting substrate. For example, a non-alkali glass substrate can be used.

In the present invention, the buffer layer can be formed with a film including a single layer or two or more layers. It is preferable that the buffer layer include a barrier layer which can prevent sodium from diffusing from the supporting substrate side. Further, it is preferable that the buffer layer include an insulating film that is in contact with the single crystal semiconductor layer and contains halogen such as chlorine or fluorine.

By a method for manufacturing a semiconductor substrate of the present invention, a single crystal semiconductor layer which is obtained by being separated from a single crystal semiconductor substrate can be recrystallized by being melted at a process temperature of 700° C. or lower, and its crystallinity can be recovered. In addition, the single crystal semiconductor layer which is obtained by being separated from the single crystal semiconductor substrate can be planarized at a process temperature of 700° C. or lower.

Further, after a single crystal semiconductor layer is melted by laser beam irradiation to be re-single-crystallized, heat treatment which does not make the single crystal semiconductor layer melted is performed, whereby the lifetime of the single crystal semiconductor layer which is re-single-crystallized can be improved.

Therefore, even if a substrate having low heat resistance is used as a supporting substrate, a high-performance semiconductor element can be formed by using a semiconductor substrate according to the present invention. For example, by using a light-transmitting glass substrate having a large area, a high-performance display device can be formed.

BRIEF DESCRIPTION OF THE DRAWINGS

This application is based on Japanese Patent Application serial no. 2007-285591 filed with Japan Patent Office on Nov. 1, 2007, the entire contents of which are hereby incorporated by reference.

In the accompanying drawings:

FIGS. 39A to 39C are IPF maps of single crystal silicon layers which are obtained from EBSP;

FIG. 51 is a table of fitting parameters (hydrogen element ratios and hydrogen ion species ratios) of the fitting functions shown in FIG. 48, FIG. 49, and FIG. 50;

DETAILED DESCRIPTION OF THE INVENTION

Embodiment Mode

Figure 1:
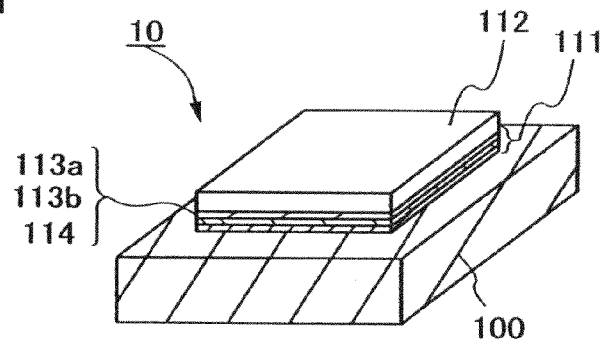
FIG. 1 is an external view showing an example of a structure of a semiconductor substrate.

The present invention will hereinafter be described. The present invention can be implemented in various different modes, and it is easily understood by those skilled in the art that various changes and modifications of the modes and details are possible without departing from the purpose and scope of the present invention. Therefore, the present invention is not construed as being limited to the description of the following Embodiment Modes and Embodiments. Further, the same reference numeral in different drawings represents the same component, and repeated description of a material, a shape, a manufacturing method, or the like is omitted.

Embodiment Mode 1

This embodiment mode describes a semiconductor substrate in which a single crystal semiconductor layer is fixed to a supporting substrate with a buffer layer interposed therebetween, and a method for manufacturing the semiconductor substrate.

FIG. 1 is a perspective view showing a structural example of a semiconductor substrate. A semiconductor substrate 10 is a substrate in which a single crystal semiconductor layer 112 is fixed to a supporting substrate 100 with a buffer layer 111 interposed therebetween. The single crystal semiconductor layer 112 is a layer formed by separating a single crystal semiconductor substrate. A surface of the buffer layer 111 and a surface of the supporting substrate 100 are bonded to each other, whereby the single crystal semiconductor layer 112 is fixed to the supporting substrate 100. The semiconductor substrate 10 is a substrate having a so-called SOI structure, in which a single crystal semiconductor layer is formed over an insulating layer.

The buffer layer 111 may have a single-layer structure or a multilayer structure in which two or more films are stacked. A film included in the buffer layer 111 is formed over a surface of the single crystal semiconductor substrate by film formation treatment. In this embodiment mode, the buffer layer 111 has a three-layer structure in which a second insulating layer 114, a first insulating layer 113b, and a first insulating layer 113a are stacked in this order from the supporting substrate 100 side.

In the semiconductor substrate 10 shown in FIG. 1, the second insulating layer 114 is a film functioning as a bonding layer. That is, a surface of the second insulating layer 114 and the surface of the supporting substrate 100 are bonded to each other, whereby the single crystal semiconductor layer 112 is fixed to the supporting substrate 100.

The first insulating layer 113a is an insulating film functioning as a barrier layer. The barrier layer is a film which prevents an impurity which reduces reliability of a semiconductor device, such as alkali metal or alkaline-earth metal (typically, sodium), from penetrating the single crystal semiconductor layer 112 from the supporting substrate 100 side, in manufacturing a semiconductor substrate and in manufacturing a semiconductor device using the semiconductor substrate. By forming a barrier layer, a semiconductor substrate and a semiconductor device can be prevented from being contaminated by an impurity. Accordingly, reliability of the semiconductor substrate and the semiconductor device can be improved.

The single crystal semiconductor layer 112 is a layer formed by thinning a single crystal semiconductor substrate. As the single crystal semiconductor substrate, a commercially available semiconductor substrate can be used; for example, a single crystal semiconductor substrate including an element belonging to Group 14, such as a single crystal silicon substrate, a single crystal germanium substrate, or a single crystal silicon germanium substrate, can be used. Alternatively, a compound semiconductor substrate of gallium arsenide, indium phosphide, or the like may be used.

A substrate having an insulating surface is used as the supporting substrate 100. In specific, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. Preferably, a glass substrate is used as the supporting substrate 100. It is preferable to use a glass substrate having a coefficient of thermal expansion which is higher than or equal to $25 \times 10^{-7}/°$ C. and lower than or equal to $50 \times 10^{-7}/°$ C. (more preferably, higher than or equal to $30 \times 10^{-7}/°$ C. and lower than or equal to $40 \times 10^{-7}/°$ C.) and a strain point which is higher than or equal to 580° C. and lower than or equal to 700° C., more preferably, higher than or equal to 650° C. and lower than or equal to 690° C. Furthermore, in order to suppress contamination of a semiconductor device, a non-alkali glass substrate is preferably used as the glass substrate. Materials of non-alkali glass substrates include glass materials such as aluminosilicate glass, aluminoborosilicate glass, and barium borosilicate glass. For example, it is preferable to use a non-alkali glass substrate (product name: AN100), a non-alkali glass substrate (product name: EAGLE2000 (registered trademark)), or a non-alkali glass substrate (product name: EAGLEXG (registered trademark)) as the supporting substrate 100.

The non-alkali glass substrate (product name: AN100) is a non-alkali glass substrate having the following physical values: specific gravity of 2.51 g/cm$^3$, a Poisson's ratio of 0.22, a Young's modulus of 77 GPa, a biaxial elasticity coefficient of 98.7 GPa, and a coefficient of thermal expansion of $38 \times 10^{-7}/°$ C.

The non-alkali glass substrate (product name: EAGLE2000 (registered trademark)) is a non-alkali glass substrate having the following physical values: specific gravity of 2.37 g/cm$^3$, a Poisson's ratio of 0.23, a Young's modulus of 70.9 GPa, a biaxial elasticity coefficient of 92.07 GPa, and a coefficient of thermal expansion of $31.8 \times 10^{-7}/°$ C.

As the supporting substrate 100, as well as the glass substrate, an insulating substrate which is formed of an insulator, such as a ceramic substrate, a quartz substrate, or a sapphire substrate; a conductive substrate which is formed of a conductor such as metal or stainless steel; a semiconductor substrate which is formed of a semiconductor such as silicon or gallium arsenide; or the like can be used. As the supporting substrate, a light-transmitting substrate such as a glass substrate or a quartz substrate is preferably used. By use of a light-transmitting substrate, the semiconductor substrate 10 which is suitable for manufacturing a display device can be manufactured.

Hereinafter, a method for manufacturing the semiconductor substrate 10 shown in FIG. 1 is described with reference to FIG. 3, FIGS. 4A to 4E, and FIGS. 5A to 5C.

Figure 3:
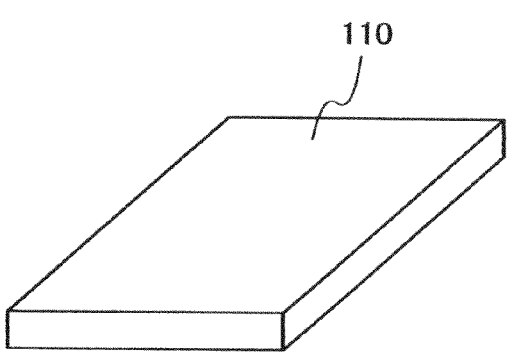
FIG. 3 is an external view showing a method for manufacturing a semiconductor substrate.

First, a single crystal semiconductor substrate 110 is prepared. The single crystal semiconductor substrate 110 is processed into a desired size and shape. FIG. 3 is an external view showing an example of a structure of the single crystal semiconductor substrate 110. In consideration of bonding to the supporting substrate 100 with a rectangular shape; a light exposure region of a light exposure apparatus such as a stepper which has a rectangular shape; and the like, the single crystal semiconductor substrate 110 preferably has a rectangular shape as shown in FIG. 3. Note that in the present specification, the rectangle includes a square unless otherwise specified.

Of course, the single crystal semiconductor substrate 110 is not limited to a substrate having the shape shown in FIG. 3, and single crystal semiconductor substrates with various shapes can be used for the single crystal semiconductor substrate 110. For example, a polygonal substrate such as a circular substrate, a pentagonal substrate, or a hexagonal substrate can be used. Of course, a circular single crystal semiconductor wafer which is commercially available can be used for the single crystal semiconductor substrate 110.

Circular single crystal semiconductor wafers include semiconductor wafers of silicon, germanium, and the like; compound semiconductor wafers of gallium arsenide, indium phosphide, and the like; and so on. A typical example of a single crystal semiconductor wafer is a single crystal silicon wafer, and circular wafers with a diameter of 5 inches (125 mm), with a diameter of 6 inches (150 mm), with a diameter of 8 inches (200 mm), with a diameter of 12 inches (300 mm), with a diameter of 400 mm, and with a diameter of 450 mm are known.

The rectangular single crystal semiconductor substrate 110 can be formed by cutting a circular single crystal semiconductor wafer. For cutting of the substrate, a cutting device such as a dicer or a wire saw, cutting using a laser beam, cutting using plasma, cutting using an electron beam, or an optional means for cutting can be used. Further, the rectangular single crystal semiconductor substrate 100 can be manufactured in such a way that an ingot for manufacturing a semiconductor substrate, which has not been sliced into substrates, is processed into a rectangular parallelepiped shape to have a rectangular shape in its cross section and the ingot having a rectangular parallelepiped shape is sliced.

Although the thickness of the single crystal semiconductor substrate 110 is not limited in particular, it is preferable to use the single crystal semiconductor substrate 110 with a large thickness because the larger number of the single crystal semiconductor layers 112 can be formed from one wafer with the use of the single crystal semiconductor substrate 110 with a larger thickness, in consideration of reusing the single crystal semiconductor substrate 110. Thicknesses of single crystal silicon wafers which are distributed in the market conform to the SEMI Standard, in which the thickness of a wafer with a diameter of 6 inches is set to be 625 µm, a thickness of a wafer with a diameter of 8 inches is set to be 725 µm, and a thickness of a wafer with a diameter of 12 inches is set to be 775 µm, for example. Note that thickness of wafer which conforms to the SEMI Standard includes a tolerance of ±25 µm. Of course, the thickness of the single crystal semiconductor substrate 110 to be a raw material is not limited to that defined by the SEMI Standard, and the thickness can be adjusted as appropriate when an ingot is sliced. Of course, when the single crystal semiconductor substrate 110 is reused, the thickness of the reused single crystal semiconductor substrate 110 becomes smaller than that defined by the SEMI Standard.

Note that, in the case where a substrate formed of a group 14 element having a diamond structure as a crystal structure, such as a single crystal silicon substrate, is used as the single crystal semiconductor substrate 110, the plane orientation of its main surface may be (100), (110), or (111). By use of the single crystal semiconductor substrate 110 with (100) orientation, the interface state density between the single crystal semiconductor layer 112 and an insulating layer formed on the surface thereof can be reduced, which is preferable for manufacture of a field effect transistor.

By use of the single crystal semiconductor substrate 110 having a (110) main surface, an element that forms the second insulating layer 114 is closely coupled with a group 14 element (e.g., silicon) that forms the single crystal semiconductor layer 112 at a bonding surface between the second insulating layer 114 and the single crystal semiconductor layer 112, whereby a bonding force between the second insulating layer 114 and the single crystal semiconductor layer 112 is improved.

By use of the single crystal semiconductor substrate 110 having a (110) main surface, atoms are more densely arranged on the main surface than on a surface with different plane orientation; therefore, planarity of the single crystal semiconductor layer 112 is improved. Accordingly, a transistor which is formed using the single crystal semiconductor layer 112 having a (110) main surface has excellent electrical characteristics such as a small subthreshold swing and a high field-effect mobility. Note that a single crystal semiconductor substrate having a (110) main surface has advantages over a single crystal semiconductor substrate having a (100) main surface in that it has a high Young's modulus and is likely to be cleaved.

Figure 4A:
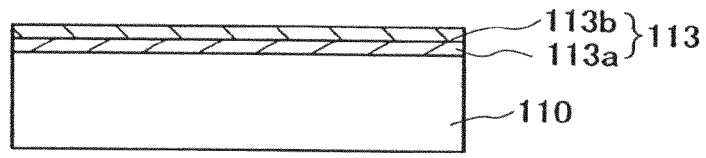
FIGS. 4A to 4E are cross-sectional views showing a method for manufacturing a semiconductor substrate.

First, the single crystal semiconductor substrate 110 is cleaned. Next, a first insulating layer 113 is formed over the single crystal semiconductor substrate 110 as shown in FIG. 4A. For the first insulating layer 113, a single-layer structure or a multilayer structure including two or more layers can be used. The thickness of the first insulating layer 113 can be set in the range of from 5 nm to 400 nm inclusive. As a film included in the first insulating layer 113, an insulating film containing silicon or germanium as its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including oxide of metal such as aluminum oxide, tantalum oxide, or hafnium oxide; an insulating film including nitride of metal such as aluminum nitride; an insulating film including oxynitride of metal such as an aluminum oxynitride film; or an insulating film including nitride oxide of metal such as an aluminum nitride oxide film can also be used.

An insulating film included in the first insulating layer 113 can be formed by a chemical vapor deposition (CVD) method, a sputtering method, an atomic layer epitaxy (ALE) method, a method for oxidizing or nitriding the single crystal semiconductor substrate 110, or the like. CVD methods include a low-pressure CVD method, a thermal CVD method, a plasma enhanced CVD method (hereinafter, referred to as a PECVD method), and the like. In a PECVD method, treatment is performed at a low temperature of 350° C. or lower and a deposition rate is higher than in other CVD methods; thus, a PECVD method is preferable.

Note that in this specification, the oxynitride refers to a substance which contains more oxygen atoms than nitrogen atoms; whereas the nitride oxide refers to a substance which contains more nitrogen atoms than oxygen atoms. For example, silicon oxynitride contains more oxygen than nitrogen and, in the case where measurements are performed using Rutherford backscattering spectrometry (RBS) and hydrogen forward scattering (HFS), includes oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen and, in the case where measurements are performed using RBS and HFS, includes oxygen, nitrogen, silicon, and hydrogen as composition ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The first insulating layer 113 preferably includes at least one layer of an insulating film to be a barrier layer for preventing penetration of sodium into the single crystal semiconductor layer 112. The number of barrier layers may be one, or larger than or equal to two. For example, in the case of using a substrate including an impurity which reduces reliability of a semiconductor device, such as alkali metal or alkaline-earth metal (typically, a glass substrate) for the supporting substrate 100, such impurities may be diffused from the supporting substrate 100 into the single crystal semiconductor layer 112 when the supporting substrate 100 is heated. Thus, by forming the barrier layer, such an impurity which reduces reliability of a semiconductor device, such as alkali metal or alkaline-earth metal, can be prevented from moving to the single crystal semiconductor layer 112. As a film functioning as the barrier layer, a silicon nitride film, a silicon nitride oxide film, an aluminum nitride film, an aluminum nitride oxide film, or the like can be given. By including such a film, the first insulating layer 113 can be made function as a barrier layer.

For example, in the case where the first insulating layer 113 has a single-layer structure, the first insulating layer 113 is preferably formed of a film functioning as a barrier layer. In this case, the first insulating layer 113 with a single-layer structure can be formed of a silicon nitride film, a silicon nitride oxide film, an aluminum nitride film, or an aluminum nitride oxide film which has a thickness of greater than or equal to 5 nm and less than or equal to 200 nm.

In the case of forming the first insulating layer 113 to be a film with a two-layer structure including one barrier layer, the upper layer is formed of a barrier layer for blocking an impurity such as sodium. The upper layer can be formed of a silicon nitride film, a silicon nitride oxide film, an aluminum nitride film, or an aluminum nitride oxide film which has a thickness of 5 nm to 200 nm. These films functioning as barrier layers have a high blocking effect for preventing impurity diffusion, but their internal stress is high. Therefore, as the lower insulating film which is in contact with the single crystal semiconductor substrate 110, a film with an effect of relieving the stress of the upper insulating film is preferably selected. As the insulating film having such an effect, a silicon oxide film, a silicon oxynitride film, a thermal oxide film formed by thermally oxidizing the single crystal semiconductor substrate 110, and the like are given. The thickness of the lower insulating film can be greater than or equal to 5 nm and less than or equal to 300 nm.

In this embodiment mode, the first insulating layer 113 has a two-layer structure including the first insulating layer 113a and the first insulating layer 113b. As a combination of the first insulating layer 113a and the first insulating layer 113b which makes the first insulating layer 113 function as a blocking film, for example, the following combinations are given: a silicon oxide film and a silicon nitride film, a silicon oxynitride film and a silicon nitride film, a silicon oxide film and a silicon nitride oxide film, and a silicon oxynitride film and a silicon nitride oxide film.

For example, as the lower insulating layer 113a, a silicon oxynitride film can be formed by a PECVD method with the use of $SiH_4$ and $N_2O$ for a process gas. Alternatively, as the first insulating layer 113a, a silicon oxide film can be formed by a PECVD method with the use of an organosilane gas and oxygen for a process gas. Alternatively, the first insulating layer 113a may be formed using an oxide film formed by oxidizing the single crystal semiconductor substrate 110.

As examples of the organosilane gas, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

The upper insulating layer 113b can be formed of a silicon nitride oxide film formed using $SiH_4$, $N_2O$, $NH_3$, and $H_2$ for a process gas by a PECVD method, or a silicon nitride film formed using $SiH_4$, $N_2$, $NH_3$, and $H_2$ for a process gas by a PECVD method.

For example, in the case where the first insulating layer 113a made of silicon oxynitride and the first insulating layer 113b made of silicon nitride oxide are formed by a PECVD method, the single crystal semiconductor substrate 110 is carried in a chamber of a PECVD apparatus. Then, $SiH_4$ and $N_2O$ are supplied to a chamber as a process gas for forming the first insulating layer 113a, and plasma of the process gas is produced, so that a silicon oxynitride film is formed over the single crystal semiconductor substrate 110. Next, a gas to be introduced into a chamber is changed to a process gas for forming the first insulating layer 113b. Here, $SiH_4$, $N_2O$, $NH_3$, and $H_2$ are used. Plasma of a mixed gas of these is produced, so that a silicon nitride oxide film is successively formed over the silicon oxynitride film. In the case of using a PECVD apparatus with a plurality of chambers, a silicon oxynitride film and a silicon nitride oxide film can be formed in different chambers. Of course, a silicon oxide film can be formed in the lower layer and a silicon nitride film can be formed in the upper layer by changing a gas to be introduced into a chamber.

The first insulating layer 113a and the first insulating layer 113b are formed in the manner described above, whereby the insulating layer 113 can be formed over each of the single crystal semiconductor substrates 110 with high throughput. Further, the first insulating layer 113a and the first insulating layer 113b can be formed without being exposed to the air; thus, an interface between the first insulating layer 113a and the first insulating layer 113b can be prevented from being contaminated by the air.

Alternatively, as the first insulating layer 113a, an oxide film formed by subjecting the single crystal semiconductor substrate 110 to thermal oxidation treatment can be used. Dry oxidation may be used as thermal oxidation treatment for forming the oxide film; however, preferably, a gas including halogen is added to an oxidizing atmosphere. By oxidizing the single crystal semiconductor substrate 110 in an atmosphere including halogen, an oxide film including halogen can be formed as the first insulating layer 113a. As the gas including halogen, one or more kinds of gases selected from HCl, HF, $NF_3$, HBr, $Cl_2$, $ClF_3$, $BCl_3$, $F_2$, $Br_2$, or the like can be used.

For example, heat treatment is carried out in an atmosphere containing HCl at a proportion of 0.5 vol % to 10 vol % (preferably, 3 vol %) with respect to oxygen at a temperature of 700° C. or higher. The thermal oxidation is preferably performed at a heating temperature of higher than or equal to 950° C. and lower than or equal to 1100° C. Treatment time may be 0.1 hour to 6 hours, preferably 0.5 hour to 1 hour. The thickness of the oxide film to be formed can be 10 nm to 1000 nm (preferably, 50 nm to 200 nm), and for example, the thickness can be 100 nm.

By oxidation treatment being performed at such a temperature range, a gettering effect with a halogen element can be obtained. The gettering particularly has an effect of removing a metal impurity. That is, with action of chlorine, an impurity such as metal turns into a volatile chloride and is released into a gas phase, thereby being removed from the single crystal semiconductor substrate 110. Further, a dangling bond in a surface of the single crystal semiconductor substrate 110 is terminated by the halogen element included in the oxide film; thus, local level density at an interface between the oxide film and the single crystal semiconductor substrate 110 can be reduced.

By thermal oxidation treatment in the atmosphere containing halogen, halogen can be contained in the oxide film. The halogen element is contained at a concentration of $1 \times 10^{17}$ atoms/cm$^3$ to $5 \times 10^{20}$ atoms/cm$^3$, whereby impurities such as metal can be trapped and can function as a protective film, which prevents contamination of the single crystal semiconductor layer 112, in the semiconductor substrate 10.

As a method for forming an oxide film on the single crystal semiconductor substrate 110, another method for thermal oxidation treatment in which heating is performed at 700° C. or higher can be used. For example, an oxide film on the single crystal semiconductor substrate 110 can be formed by plasma treatment using plasma including an oxygen radical (O radical) or a hydroxide radical (OH radical); high density plasma treatment; oxidizing treatment using ozone-containing water ($O_3$ water); or the like.

Note that because thermal oxidation treatment is a high-temperature process, thermal stress is likely to be generated; thus, a crystal defect such as dislocation slip is likely to be caused in the single crystal semiconductor substrate 110. Therefore, when the first insulating layer 113 is formed by oxidation treatment of the single crystal semiconductor substrate 110, treatment of a low-temperature process at 700° C. or lower, such as a CVD method, a sputtering method, oxidation treatment with ozone-containing water, or the like is more preferable than thermal oxidation treatment.

Figure 4B:
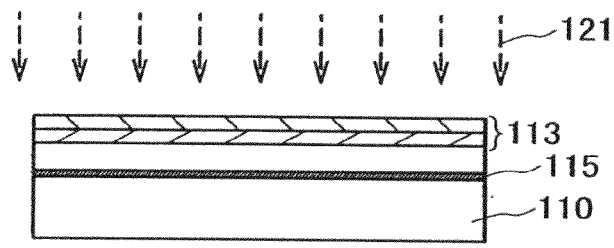

Next, the single crystal semiconductor substrate 110 is irradiated with ions having kinetic energy, whereby a damaged region 115 in which crystal structures are damaged is formed in the single crystal semiconductor substrate 110 at a predetermined depth. FIG. 4B is a cross-sectional view showing a process of forming the damaged region 115. As shown in FIG. 4B, the single crystal semiconductor substrate 110 is irradiated with accelerated ions 121 through the first insulating layer 113. Thus, ions are added to a region at a predetermined depth from a surface of the single crystal semiconductor substrate 110, so that the damaged region 115 can be formed. The ions 121 are ions which are obtained in such a manner that a source gas is excited to produce plasma of the source gas, and ions included in the plasma are extracted from the plasma by the action of electric field and accelerated.

The depth of the region where the damaged region 115 is formed can be adjusted by the acceleration energy of the ions 121 and the injection angle of the ions 121. The acceleration energy can be controlled by an acceleration voltage, a dosage, or the like. The damaged region 115 is formed in a region at a depth almost equal to the average depth of penetration of the ions 121. Therefore, the thickness of a single crystal semiconductor layer 117 which will be separated from the single crystal semiconductor substrate 110 is determined depending on the depth at which the ions 121 are added. The depth at which the damaged region 115 is formed is adjusted so that the thickness of the single crystal semiconductor layer is greater than or equal to 20 nm and less than or equal to 200 nm, preferably greater than or equal to 50 nm and less than or equal to 200 nm.

The damaged region 115 can be formed by ion doping treatment. The ion doping treatment can be performed using an ion doping apparatus. An ion doping apparatus is typically a non-mass-separation type apparatus for irradiating an object to be processed which is disposed in a chamber with all kinds of ions which are generated by plasma excitation of a process gas. The apparatus is called "non-mass-separation type apparatus" because an object to be processed is irradiated with all kinds of ions without mass-separating ions in plasma. In contrast, an ion implantation apparatus is a mass-separation type apparatus. An ion implantation apparatus is an apparatus for separating kinds of ions in plasma by mass and for irradiating an object to be processed with ions having a specific mass.

The main structure of an ion doping apparatus includes a chamber in which an object to be processed is disposed, an ion source for generating desired ions, and an acceleration mechanism for irradiating a process object with ions. The ion source has a gas supply device for supplying a source gas from which a desired kind of ions is generated; an electrode for producing plasma by exciting a source gas; and the like. As the electrode for producing plasma, a capacitively-coupled high-frequency discharge electrode, a filament electrode, or the like is used. The acceleration mechanism has electrodes such as an extraction electrode, an accelerating electrode, a decelerating electrode, and a ground electrode; a power source for supplying power to these electrodes; and the like. The electrodes included in the acceleration mechanism are provided with a number of openings or slits, through which ions that are generated from the ion source are accelerated. Note that the structure of an ion doping apparatus is not limited to the structure described above, and a mechanism according to need is provided.

In this embodiment mode, hydrogen is added to a semiconductor wafer by an ion doping apparatus. As a plasma source gas, a gas including hydrogen is supplied; for example, $H_2$ is supplied. A hydrogen gas is excited to produce plasma, and ions included in the plasma are accelerated without mass separation, so that the single crystal semiconductor substrate 110 is irradiated with the accelerated ions.

In the ion doping apparatus, the percentage of $H_3^+$ to the total quantity of ion species ($H^+$, $H_2^+$, and $H_3^+$) generated from a hydrogen gas is set to be higher than or equal to 50%. More preferably, the proportion of $H_3^+$ is set to be higher than or equal to 80%. Since mass separation is not performed in an ion doping apparatus, the percentage of one kind to plural kinds of ion species generated in plasma is preferably set to be higher than or equal to 50%, more preferably higher than or equal to 80%. By irradiation with ions having the same mass, ions can be added in a concentrated manner to the same depth in the single crystal semiconductor substrate 110.

In order to form the damaged region 115 in a shallow region, the acceleration voltage of the ions 121 needs to be low. However, by increasing the percentage of $H_3^+$ ions in the plasma, atomic hydrogen (H) can be added to the single crystal semiconductor substrate 110 efficiently. This is because mass of $H_3^+$ ions is three times as large as that of the $H^+$ ions; therefore, when one hydrogen atom is added to a region at the same depth, the acceleration voltage of $H_3^+$ ions can be three times as large as that of $H^+$ ions. When the acceleration voltage of ions can be higher, takt time of an ion irradiation process can be shortened, and productivity and throughput can be improved.

A process of irradiating the single crystal semiconductor substrate 110 with the ions 121 that are accelerated can also be performed with an ion implantation apparatus. The ion implantation apparatus is a mass-separation apparatus with which an object to be processed that is disposed in a chamber is irradiated with a specific ion species through mass separation of a plurality of ion species that are generated by plasma excitation of a source gas. Thus, when an ion implantation apparatus is used, $H^+$ ions and $H_2^+$ ions that are generated by excitation of a hydrogen gas are subjected to mass separation, and either $H^+$ ions or $H^{2+}$ ions are accelerated, with which the single crystal semiconductor substrate 110 is irradiated.

It is preferable that the damaged region 115 contain hydrogen (H) at $5 \times 10^{20}$ atoms/cm$^3$ or more. When a hydrogen-added region at locally high concentration is formed in the single crystal semiconductor substrate 110, the crystal structure is damaged and minute holes are formed, so that the damaged region 115 has a porous structure. Therefore, volume of minute holes formed in the damaged region 115 is changed by heat treatment at a comparatively low temperature (600° C. or lower), whereby the single crystal semiconductor substrate 110 can be cleaved along the damaged region 115. Note that the concentration of hydrogen included in the damaged region 115 is controlled by the dosage or the acceleration voltage of the ions 121, or the like.

In the case where the ions are added to the single crystal semiconductor substrate 110 by an ion doping apparatus using a hydrogen gas, the acceleration voltage can be higher than or equal to 10 kV and lower than or equal to 200 kV, and the dosage can be greater than or equal to $1 \times 10^{16}$ ions/cm$^2$ and less than or equal to $6 \times 10^{16}$ ions/cm$^2$. By adding hydrogen ions under this condition, the damaged region 115 can be formed in a region of the single crystal semiconductor substrate 110 at a depth of from 50 nm to 500 nm inclusive, though depending on a kind of ions and its proportion in the ions 121.

For example, in the case where the single crystal semiconductor substrate 110 is a single crystal silicon substrate; the first insulating layer 113a is a 50-nm-thick silicon oxynitride film; and the first insulating layer 113b is a 50-nm-thick silicon nitride oxide film, a single crystal semiconductor layer with a thickness of about 100 nm can be separated from the single crystal semiconductor substrate 110 under the following condition: a source gas is hydrogen, the acceleration voltage is 40 kV, and the dosage is $2.2 \times 10^{16}$ ions/cm$^2$. Alternatively, in the case where the first insulating layer 113a is a 100-nm-thick silicon oxynitride film and doped with hydrogen ions under the condition which is the same as that described above except that the first insulating layer 113a is the 100-nm-thick silicon oxynitride film, a single crystal semiconductor layer with a thickness of about 70 nm can be separated from the single crystal semiconductor substrate 110.

Helium (He) can also be used as the source gas of the ions 121. Most of the ion species produced by excitation of helium are $He^+$; therefore, the single crystal semiconductor substrate 110 can be irradiated with $He^+$ as the main ions 121 even by an ion doping method in which mass separation is not performed. Accordingly, minute holes can be formed efficiently in the damaged region 115 by an ion doping method. When the single crystal semiconductor substrate 110 is irradiated with ions by an ion doping method using helium, the acceleration voltage can be higher than or equal to 10 kV and lower than or equal to 200 kV, and the dosage can be set to be higher than or equal to $1 \times 10^{16}$ ions/cm$^2$ and lower than or equal to $6 \times 10^{16}$ ions/cm$^2$.

A halogen gas such as a chlorine gas ($Cl_2$ gas) or a fluorine gas ($F_2$ gas) can also be used as the source gas.

Figure 44:
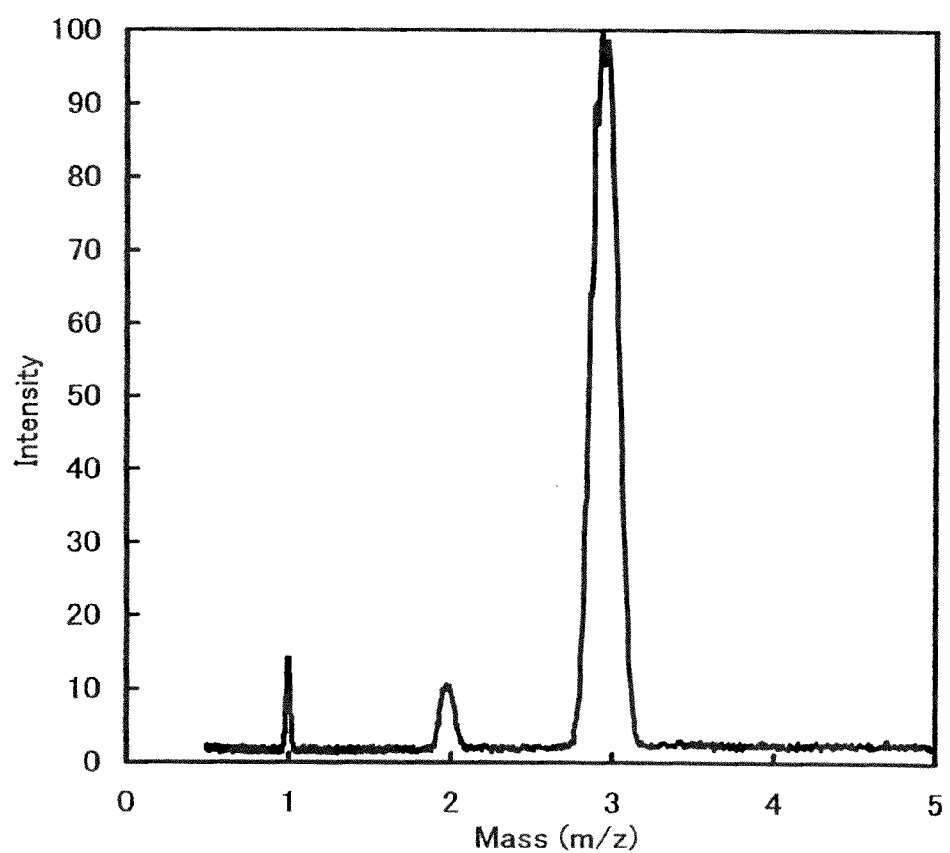
FIG. 44 is a graph showing the results of mass spectrometry of ion species generated from a $H_2$ gas with an ion doping apparatus.

An ion implantation apparatus and an ion doping apparatus are greatly different from each other in the proportion of hydrogen ion species $H^+$, $H_2^+$, and $H_3^+$ which are generated from a source gas. FIG. 44 is a graph illustrating the result of mass spectrometry of ion species that are generated from a 100% hydrogen gas (with the pressure of an ion source of $4.7 \times 10^{-2}$ Pa) by an ion doping apparatus. The horizontal axis represents masses of ion species. The mass 1 spectrum, the mass 2 spectrum, and the mass 3 spectrum correspond to $H^+$, $H_2^{+\dagger}$ and $H_3^+$, respectively. The vertical axis represents the intensity of a spectrum which corresponds to the number of ions. In FIG. 44, the number of ions with different masses is expressed as a relative proportion where the number of ions of the ion species with a mass of 3 is defined as 100. It can be seen from FIG. 44 that the ratio of hydrogen ion species that are generated in plasma, i.e., the ratio of $H^+$, $H_2^+$, and $H_3^+$, is about 1:1:8. It is confirmed, from a result of secondary ion mass spectrometry of hydrogen concentration distribution in a single crystal silicon wafer into which hydrogen ions are implanted with an ion doping apparatus, that $H_3^+$ accounts for about 80% in hydrogen ion species with which a single crystal silicon wafer is irradiated.

Figure 45:
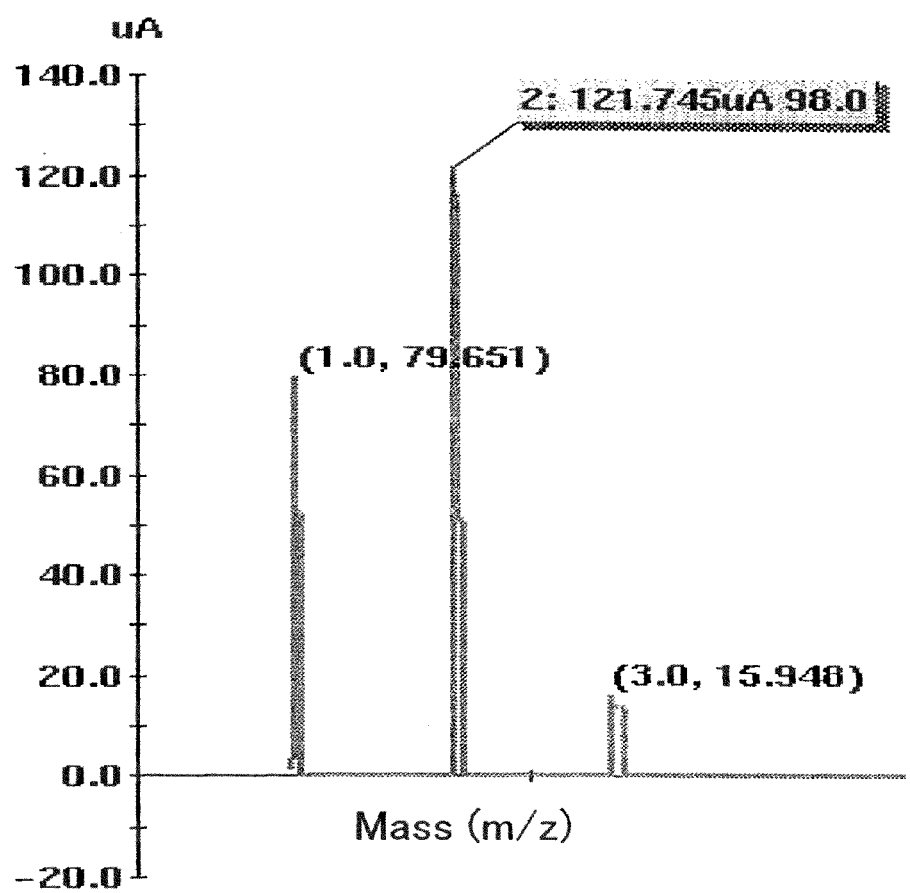
FIG. 45 is a graph showing the results of mass spectrometry of ion species generated from a $PH_3$ gas with an ion implantation apparatus.

FIG. 45 is a graph showing the results of mass spectrometry of ion species that are generated from $PH_3$ when the pressure of an ion source is about $3 \times 10^{-3}$ Pa by an ion implantation apparatus. As in FIG. 44, the horizontal axis represents masses of ion species. The mass 1 spectrum, the mass 2 spectrum, and the mass 3 spectrum correspond to $H^+$, $H_2^{+\dagger}$ and $H_3^+$, respectively. The vertical axis represents the intensity of a spectrum corresponding to the number of ions. It can be seen from FIG. 45 that the ratio of hydrogen ion species in plasma, i.e., the ratio between $H^+$, $H_2^+$, and $H_3^+$, is about 37:56:7. Note that although FIG. 45 shows the data obtained when the source gas is $PH_3$, the ratio between the hydrogen ion species is similar when a 100% $H_2$ gas is used as a source gas, as well. That is, the ratio between $H^+$, $H_2^+$, and $H_2^+$ which are generated from a hydrogen gas is about 37:56:7.

Therefore, the proportion of generated $H_3^+$ is only about 7% in hydrogen ion species $H^+$, $H_2^+$, and $H_3^+$ by an ion implantation apparatus. In contrast, the proportion of generated $H_3^+$ can be greater than or equal to 50%, and can be preferably about 80%, by an ion doping apparatus. Hereinafter, the reason why the proportion of generated $H_3^+$ is greatly different between an ion doping apparatus and an ion implantation apparatus is considered.

[Ions in Hydrogen Plasma]

Figure 46:
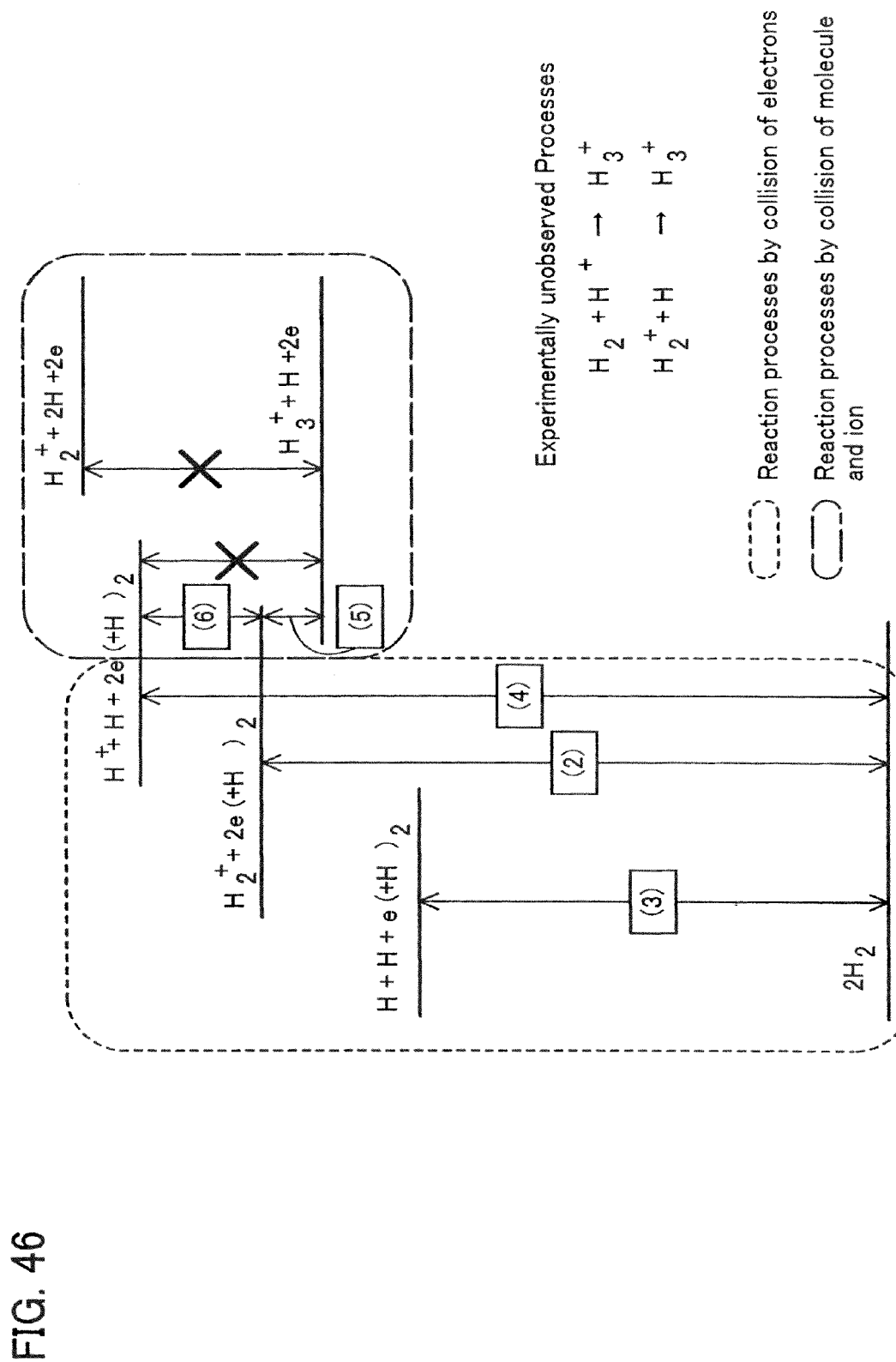
FIG. 46 is an energy diagram of a hydrogen molecule and hydrogen ions ($H^+$, $H_2^+$, and $H_3^+$)

In a hydrogen plasma, hydrogen ion species such as $H^+$, $H_2^+$, and $H_3^+$ are present. Here are listed reaction equations for reaction processes (formation processes, destruction processes) of the hydrogen ion species. FIG. 46 is an energy diagram which schematically shows some of the above reactions. Note that the energy diagram shown in FIG. 46 is merely a schematic diagram and does not depict the relationships of energies of the reactions exactly.

  (1)

  (2)

  (3)

  (4)

  (5)

  (6)

  (7)

  (8)

  (9)

[$H_3^+$ Formation Process]

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased. The amount of increase in the product on the right-hand side (rightmost side) of each reaction equation given above depends on the concentration of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy which is gained by a given charged particle before colliding with another particle is equal to the potential energy which is lost by transfer of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low. Even in a situation where the mean free path is short, the kinetic energy of a charged particle is high if the charged particle can gain a high amount of kinetic energy before collision. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high. In the opposite situation, the kinetic energy of $H_2^+$ is low. That is, because the reaction of the reaction equation (6) is the main reaction in the situation in which the electric field is high, the amount of $H_3^+$ tends to be decreased, and because the reaction of the reaction equation (5) is the main reaction in a situation in which the electric field is low, the amount of $H_3^+$ tends to be increased.

In the case of the ion source from which the data shown in FIG. 45 is obtained, $H_3^+$, of $H^+$, $H_2^+$, and $H_3^+$, is generated at a proportion of only about 7%. On the other hand, in the case of the ion source from which the data illustrated in FIG. 44 is obtained, the proportion of $H_3^+$ ions can be up to 50% or higher (in data shown in FIG. 44, about 80%). This is thought to result from the pressure and electric field inside a chamber, as described above.

[$H_3^+$ Irradiation Mechanism]

When a plasma that contains a plurality of ion species as shown in FIG. 44 is generated and a semiconductor substrate is irradiated with the generated ion species without any mass separation being performed, the surface of the semiconductor substrate is irradiated with each of $H^+$, $H_2^+$, and $H_3^+$ ions. In order to consider the mechanism, from the irradiation with ions to the formation of an ion implantation layer, the following five types of models (Models 1 to 5) are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

[Comparison of Simulation Results with Measured Values]

Based on Models 1 to 5 described above, the irradiation of a silicon substrate with hydrogen ion species was simulated. As simulation software, SRIM, the Stopping and Range of Ions in Matter, was used. SRIM which is an improved version of TRIM (the Transport of Ions in Matter) is simulation software for ion introduction processes by a Monte Carlo method. Note that SRIM is software intended for amorphous structures, but SRIM can be applied to cases where a silicon substrate is irradiated with the hydrogen ion species with high energy at a high dose. This is because the crystal structure of a silicon substrate changes into a non-single-crystal structure due to the collision of the hydrogen ion species with Si atoms.

Simulation results are shown below. In the simulation of this embodiment mode, a calculation based on Model 2 was performed with the $H_2^+$ replaced by $H^+$ that has twice the mass. Furthermore, a calculation based on Model 3 was performed with the $H_2^+$ replaced by $H^+$ that has half the kinetic energy, a calculation based on Model 4 was performed with the $H_3^+$ replaced by H+ that has three times the mass, and a calculation based on Model 5, with the $H_3^+$ replaced by $H^+$ that has one-third the kinetic energy.

Figure 47:
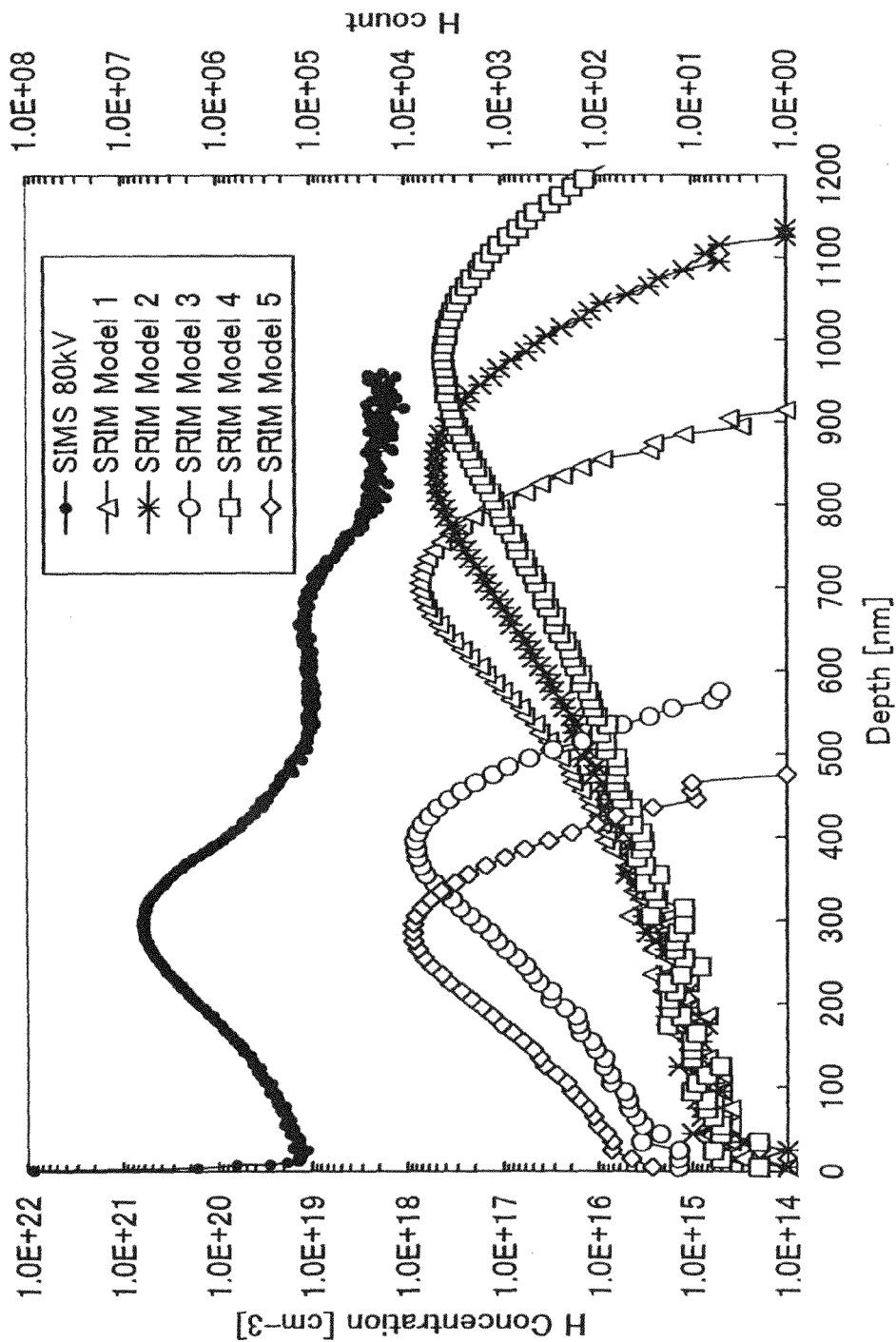
FIG. 47 is a graph of the profile (calculated values and measured values) of hydrogen in the depth direction when the acceleration voltage is 80 kV.

Distribution (Profile) of a hydrogen element (H) in a depth direction was calculated in cases where a silicon substrate was irradiated with the hydrogen ion species at acceleration voltage of 80 kV using Models 1 to 5. FIG. 47 shows the calculation results. In FIG. 47, measured values of the distribution in the depth direction of a hydrogen element (H) included in the Si substrate are also shown. The measured values are data measured by SIMS (Secondary Ion Mass Spectroscopy) (hereinafter, referred to as SIMS data). The sample measured by SIMS was a Si substrate which was irradiated with hydrogen ion species ($H^+$, $H_2^+$, $H_3$) produced under the conditions for measuring data of FIG. 44, at acceleration voltage of 80 kV.

In FIG. 47, the vertical axis of the graph of the measured values using the Models 1 to 5 is a right vertical axis representing the number of hydrogen atoms. The vertical axis of the graph of the SIMS data is a left vertical axis representing the hydrogen concentration. The horizontal axis of the graph of the calculated values and the SIMS data represents depth from the surface of the Si substrate. Comparison of the SIMS data, which is measured values, with the calculation results indicates that Models 2 and 4 obviously do not match the peaks of the SIMS data and a peak corresponding to Model 3 cannot be observed in the SIMS data. This result shows that the contribution of each of Models 2 to 4 is comparatively smaller than those of Models 1 and 5. Considering that the unit of the kinetic energy of ions is kiloelectron volts whereas the H—H bond energy is only about several electron volts, the small contribution of each of Models 2 and 4 is probably because $H_2^+$ and $H_2^+$ mostly split into $H^+$ or H by colliding with Si atoms. Accordingly, Models 2 to 4 will not be considered hereinafter. Next are described the simulation results obtained when a Si substrate was irradiated with the hydrogen ion species (irradiation with 100,000 atoms for H) at acceleration voltage of 80 kV, 60 kV and 40 kV, using Models 1 and 5.

Figure 48:
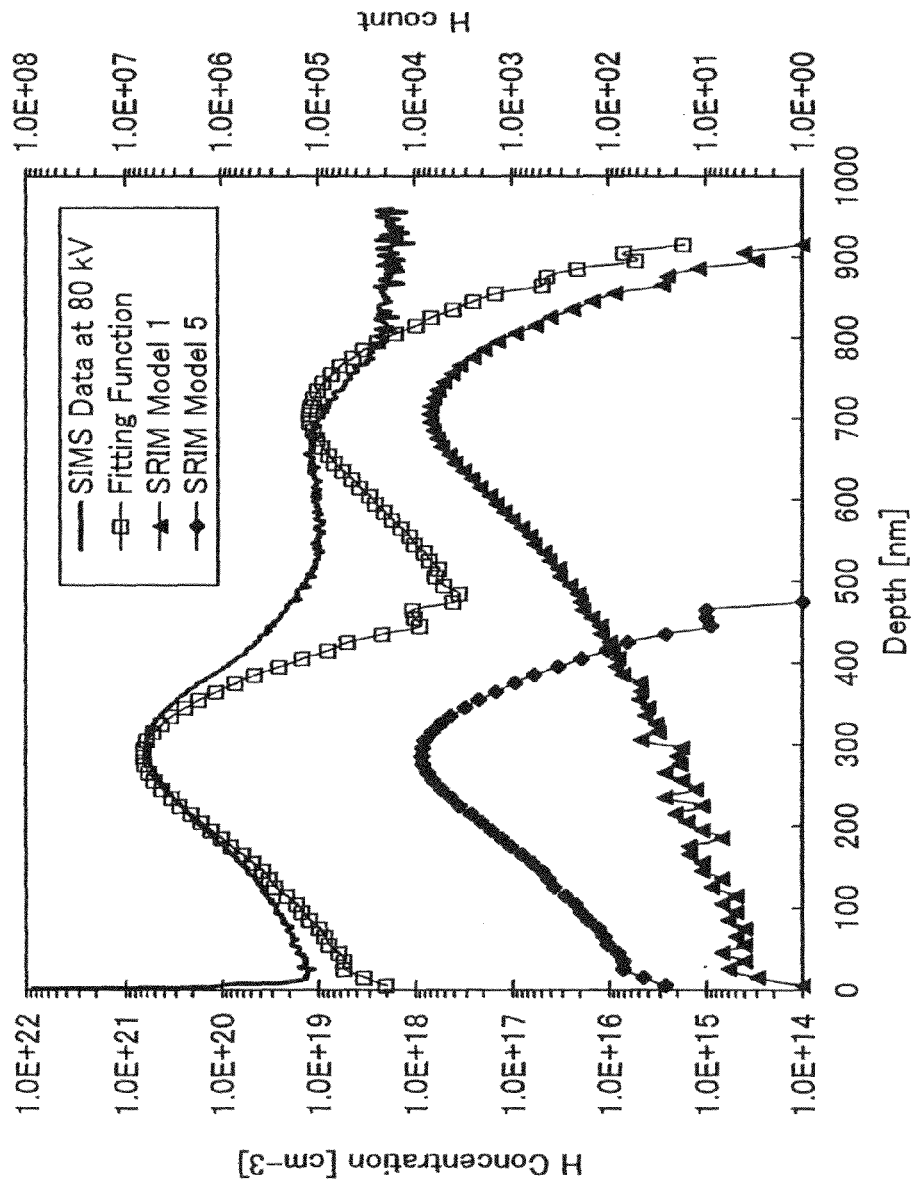
FIG. 48 is a graph of the profile (calculated values, measured values, and fitting function) of hydrogen in the depth direction when the acceleration voltage is 80 kV.
Figure 49:
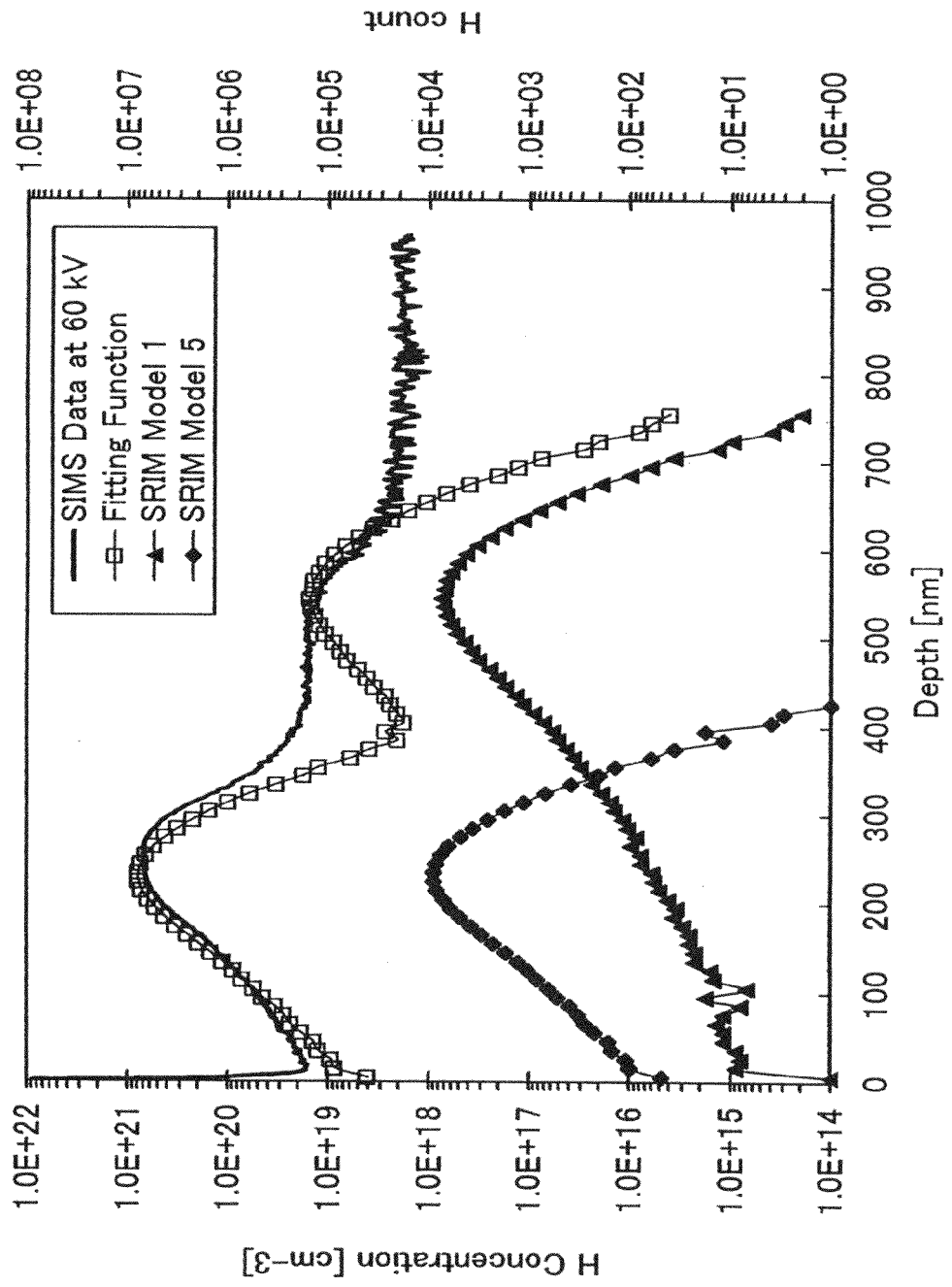
FIG. 49 is a graph of the profile (calculated values, measured values, and fitting function) of hydrogen in the depth direction when the acceleration voltage is 60 kV.
Figure 50:
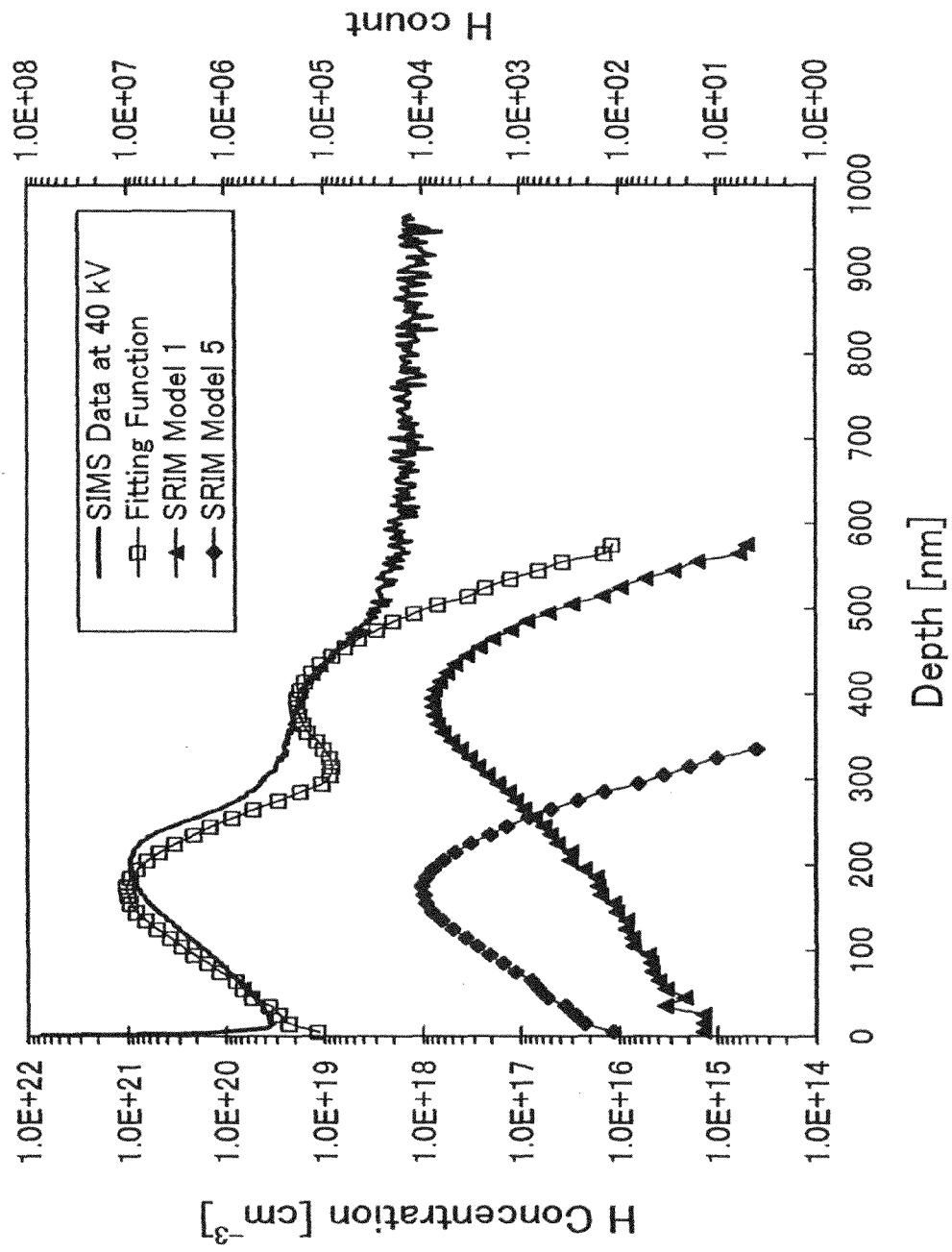
FIG. 50 is a graph of the profile (calculated values, measured values, and fitting function) of hydrogen in the depth direction when the acceleration voltage is 40 kV.

FIGS. 48, 49, and 50 each show the calculation results of a depth direction of hydrogen (H) included in the Si substrate. FIGS. 48, 49, and 50 show the calculation results in the case where the acceleration voltages are 80 kV, 60 kV, and 40 kV, respectively. Further, in FIGS. 48, 49, and 50, SIMS data as a measured value and a curve fitted to the SIMS data (hereinafter referred to as a fitting function) are also shown. The sample measured by SIMS was a Si substrate which was irradiated with hydrogen ion species ($H^+$, $H_2^+$, $H_3^+$) produced under the conditions for measuring data of FIG. 44, at acceleration voltage of 80 kV, 60 kV, or 40 kV. Note that the calculation values obtained using Models 1 and 5 are expressed on the vertical axis (right vertical axis) as the number of hydrogen atoms, and the SIMS data and the fitting function are expressed on the vertical axis (left vertical axis) as the concentration of hydrogen atoms. The horizontal axis represents depth from the surface of a Si substrate in the graph.

Here, the fitting function is obtained using the calculation formula (f1) given below, in consideration of Models 1 and 5. Note that, in the calculation formula (f1), X and Y represent fitting parameters and V represents volume.

[Fitting Function]=$X/V$×[Data of Model 1]+$Y/V$×[Data of Model 5]     (f1)

For determining the fitting function, the contribution of $H_2^+$ (i.e., Model 3) should be considered if the ratio between ion species used for actual irradiation ($H^+$:$H_2^+$:$H_3^+$ is about 1:1:8, FIG. 44) is taken into account; however, the contribution of $H_2^+$ is excluded from the consideration given here for the following reasons:

Because the amount of hydrogen introduced through the irradiation process represented by Model 3 is lower than that added through the irradiation process of Model 5, there is no significant influence even if Model 3 is excluded from the consideration (no peak corresponding to Model 3 appears in the SIMS data either; see FIG. 47).

Because the peak position of the profile of a hydrogen element in a Si substrate in the depth direction based on Model 3 is close to that of the profile in the depth direction based on Model 5 (see FIG. 47), the contribution of Model 3 is likely to be obscured by channeling (movement of atoms due to crystal lattice structure) that occurs in the irradiation process of Model 5. That is, it is difficult to estimate fitting parameters for Model 3. This is because this simulation assumes amorphous Si and the influence due to crystallinity is not considered.

FIG. 51 lists the fitting parameters of the calculation formula (f1). At any of the acceleration voltages, the ratio of the amount of H introduced to the Si substrate according to Model 1 to that introduced according to Model 5 is about 1:42 to 1:45 (the amount of H in Model 5, when the amount of H in Model 1 is defined as 1, is about 42 to 45, inclusive), and the ratio between ion species used for irradiation in the number, $H^+$ (Model 1) to that of $H_2^+$ (Model 5) is about 1:14 to 1:15 (the amount of $H_3^+$ in Model 5, when the amount of $H^+$ in Model 1 is defined as 1, is about 14 to 15, inclusive). Considering that Model 3 is not taken into account and the calculation assumes amorphous Si, it can be said that the ratio shown in FIG. 51 is close to that of the ratio between hydrogen ion species used for actual irradiation ($H^+$:$H_2^+$:$H_3^+$ is about 1:1:8, see FIG. 44).

[Effects of Use of $H_3^+$]

A plurality of benefits resulting from $H_3^+$ can be enjoyed by irradiation of a substrate with hydrogen ion species with a higher proportion of $H_3^+$ as shown in FIG. 44. For example, because $H_3^+$ splits into $H^+$, H, or the like to be introduced into a substrate, ion introduction efficiency can be improved compared with the case of irradiation mainly with $H^+$ or $H_2^+$. This leads to an improvement in an SOI substrate production efficiency. In addition, because the kinetic energy of $H^+$ or H after $H_2^+$ splits similarly tends to be low, $H_3^+$ is suitable for manufacture of thin semiconductor layers. Note that here, a method is described in which an ion doping apparatus that is capable of irradiation with the hydrogen ion species as shown in FIG. 44 is used in order to efficiently perform irradiation with $H_3^+$. Therefore, by irradiation with $H_3^+$ by use of such an ion doping apparatus, significant effects such as an improvement in semiconductor characteristics, an increase in area, a reduction in cost, and an improvement in production efficiency can be obtained. On the other hand, if first priority is given to irradiation with H3+, there is no need to interpret the present invention as being limited to the use of an ion doping apparatus.

From the above-described consideration, it is preferable to use an ion doping apparatus than an ion implantation apparatus for use to introduce more $H_3^+$ into the single crystal semiconductor substrate 110.

Further, in an ion do ping apparatus, utilization efficiency of a source gas is high because generated ion species are not separated by mass. Further, takt time can be easily shortened because irradiation with accelerated ions can be performed in a planar manner or in a linear manner. In contrast, an ion implantation apparatus has a feature that only a specific ion species can be introduced into a substrate by separating generated ions by mass. However, because of mass separation, utilization efficiency of ions generated from a source gas is lower than that in an ion doping apparatus. Further, in an ion implantation apparatus, ions are introduced by moving an ion beam with a point-like beam shape; thus, throughput is lowered, which becomes a problem in large-area treatment. Therefore, in terms of utilization efficiency of a source gas and large-area treatment, it is preferable to form the damaged region 115 in the single crystal semiconductor substrate 110 by irradiation with the ions 121 with the use of an ion doping apparatus.

Figure 4C:
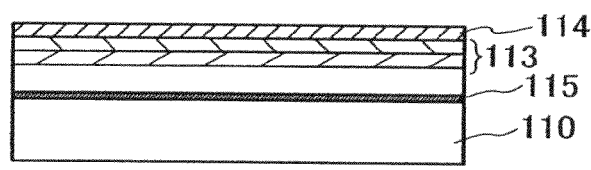

After forming the damaged region 115, the second insulating layer 114 is formed over the top surface of the first insulating layer 113 as shown in FIG. 4C. In a process for forming the second insulating layer 114, the heating temperature of the single crystal semiconductor substrate 110 is set at a temperature at which an element or a molecule which is added to the damaged region 113 is not precipitated, and the heating temperature is preferably 350° C. or lower. In other words, the damaged region 115 does not release gas at the heating temperature. Note that the second insulating layer 114 can be formed before formation of the damaged region 115. In this case, the process temperature at the time of forming the second insulating layer 114 can be set to 350° C. or higher.

The second insulating layer 114 is layer for forming a bonding surface, which is smooth and hydrophilic, on a surface of the single crystal semiconductor substrate 110. Therefore, the average of the roughness Ra of the second insulating layer 114 is preferably less than or equal to 0.7 nm, more preferably less than or equal to 0.4 nm. Further, the thickness of the second insulating layer 114 can be greater than or equal to 10 nm and less than or equal to 200 nm. The thickness of the second insulating layer 114 is preferably greater than or equal to 5 nm and less than or equal to 500 nm, more preferably greater than or equal to 10 nm and less than or equal to 200 nm.

As the second insulating layer 114, an insulating film formed by a chemical gas phase reaction is preferably used. For example, a silicon oxide film, a silicon oxynitride film, a silicon nitride oxide film, a silicon nitride film, or the like can be formed as the second insulating layer 114. In the case where a silicon oxide film is formed by a PECVD method as the second insulating layer 114, an organosilane gas and an oxygen ($O_2$) gas are preferably used for a source gas. By using organosilane for the source gas, a silicon oxide film having a smooth surface can be formed at a process temperature which is equal to or lower than 350° C. Alternatively, low temperature oxide (LTO) formed at a temperature higher than or equal to 200° C. and lower than or equal to 500° C. by a thermal CVD method can be used. LTO can be formed by using monosilane ($SiH_4$), disilane ($Si_2H_6$), or the like as a silicon source gas and using $NO_2$ or the like as an oxygen source gas.

For an example of the condition for forming the second insulating layer 114 formed of a silicon oxide film by using TEOS and $O_2$ for a source gas, TEOS is introduced at a flow rate of 15 sccm and $O_2$ is introduced at a flow rate of 750 sccm into a chamber. As a deposition pressure, a deposition temperature, an RF output, and power frequency, 100 Pa, 300° C., 300 W, and 13.56 MHz are respectively given.

Further, the order of a process shown in FIG. 4B and a process shown in FIG. 4C can be reversed. That is, the damaged region 115 can be formed in the single crystal semiconductor substrate 110 after the first insulating layer 113 and the second insulating layer 114 are formed. In this case, it is preferable to form the first insulating layer 113 and the second insulating layer 114 successively in the case where the first insulating layer 113 and the second insulating layer 114 can be formed by the same deposition apparatus.

Furthermore, a process shown in FIG. 4A and a process shown in FIG. 4C can be performed after a process shown in FIG. 4B is performed. That is, the first insulating layer 113 and the second insulating layer 114 can be formed after the damaged region 115 is formed by irradiating the single crystal semiconductor substrate 110 with the ions 121. In this case, it is preferable to form the first insulating layer 113 and the second insulating layer 114 successively in the case where the first insulating layer 113 and the second insulating layer 114 can be formed by the same deposition apparatus. Furthermore, before forming the damaged region 115, an oxide film can be formed over a surface of the single crystal semiconductor substrate 110 by oxidizing treatment in order to protect the surface of the single crystal semiconductor substrate 110, so that the single crystal semiconductor substrate 110 can be irradiated with ions through the oxide film. The oxide film is removed after forming the damaged region 115. Further, the first insulating layer 113 can be formed with the oxide film left.

Then, the single crystal semiconductor substrate 110 provided with the first insulating layer 113, the damaged region 115, and the second insulating layer 114, and the supporting substrate 100 are cleaned. This cleaning process can be performed in ultrasonic cleaning with pure water. The ultrasonic cleaning is preferably megahertz ultrasonic cleaning (megasonic cleaning). It is preferable to clean one of or both the single crystal semiconductor substrate 110 and the supporting substrate 100 with ozone-containing water after the ultrasonic cleaning. Through the cleaning with ozone-containing water, an organic substance can be removed and surface activation treatment which improves hydrophilicity of a surface of the second insulating layer 114 and the supporting substrate 100 can be performed. Alternatively, the cleaning treatment may be performed with oxygen-containing water, hydrogen-containing water, pure water, or the like instead of ozone-containing water. By performing such cleaning treatment, a bonding surface can be made hydrophilic, and OH groups in the bonding surface can be increased, whereby bond by hydrogen bonding can be further strengthened.

As the activation treatment performed on the surface of the second insulating layer 114 and the supporting substrate 100, cleaning with ozone-containing water, irradiation treatment with an atomic beam or an ion beam, plasma treatment, or radical treatment can be performed. When an atomic beam or an ion beam is used, a neutral atomic beam of an inert gas such as argon or an ion beam of an inert gas can be used. Such a surface treatment makes it possible to easily perform bonding between different kinds of materials even at a temperature of lower than 400° C.

Figure 4D:
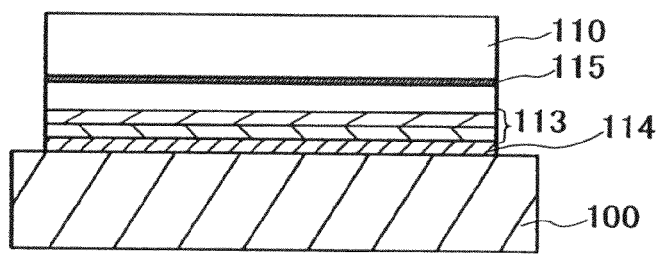

FIG. 4D is a cross-sectional view illustrating a bonding process. The supporting substrate 100 and the single crystal semiconductor substrate 110 are disposed in close contact with each other with the second insulating layer 114 interposed therebetween. In this embodiment mode, the surface of the supporting substrate 100 and the surface of the second insulating layer 114 are disposed in close contact with each other, and the disposed portions are bonded to each other. It is considered that the bonding force of a bond between the surface of the supporting substrate 100 and the surface of the second insulating layer 114 is under the action of Van der Waals force at the initial stage. By applying pressure to the surface of the second insulating layer 114 and the surface of the supporting substrate 100, hydrogen bonding is formed in the disposed portions. Thus, the surface of the second insulating layer 114 and the surface of the supporting substrate 100 can be bonded to each other more firmly.

Thus, a pressure of approximately 300 N/cm$^2$ to 15000 N/cm$^2$ is applied to a part of the edge of the single crystal semiconductor substrate 110. The pressure applied thereto is preferably from 1000 N/cm$^2$ to 5000 N/cm$^2$. The second insulating layer 114 and the supporting substrate 100 start to be gradually bonded together from the portion to which a pressure is applied, and the bonded portions are extended throughout an entire surface of the second insulating layer 114. Accordingly, the single crystal semiconductor substrate 110 is fixed to the supporting substrate 100. Since this bonding process does not need heat treatment and can be carried out at a room temperature, a low heat-resistant substrate with the upper temperature limit of 700° C. or lower, such as a glass substrate, can be used for the supporting substrate 100.

After the single crystal semiconductor substrate 110 is bonded to the supporting substrate 100, it is preferable to perform heat treatment or pressure treatment for increasing a bonding force between the supporting substrate 100 and the second insulating layer 114. The treatment temperature is set so that the damaged region 115 is not cracked and can be higher than or equal to a room temperature and lower than 400° C. Further, the single crystal semiconductor substrate 110 is bonded to the supporting substrate 100 while being heated within the temperature range, whereby a bonding force at the bonding interface between the supporting substrate 100 and the second insulating layer 114 can be made strong. Further, the pressure treatment is preferably performed so that a pressure is applied in a direction perpendicular to the bonding surface. For the heat treatment, a diffusion furnace, a heating furnace such as a resistance heating furnace, a rapid thermal anneal (RTA) apparatus, a microwave heating apparatus, or the like can be used.

Figure 4E:
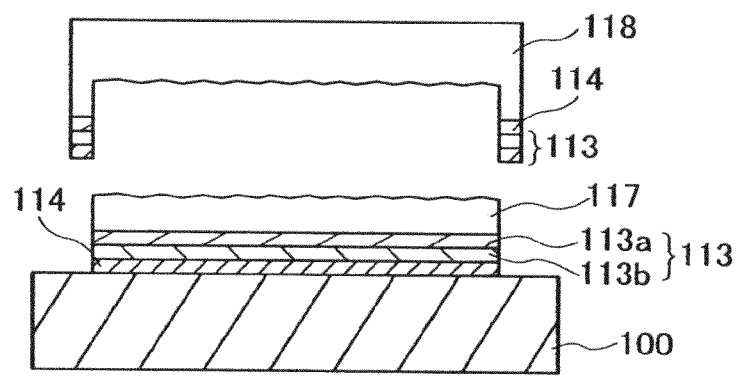

Next, heat treatment is performed, and separation is caused in the damaged region 115, so that the single crystal semiconductor layer 117 is separated from the single crystal semiconductor substrate 110. FIG. 4E illustrates a separation process for separating the single crystal semiconductor layer 117 from the single crystal semiconductor substrate 110. Reference numeral 118 denotes the single crystal semiconductor substrate 110 from which the single crystal semiconductor layer 117 has been separated.

By performing the heat treatment, the elements added by the ion doping are precipitated in the minute holes formed in the damaged region 115 due to increase of the temperature, whereby internal pressure increases. Due to the increase in pressure, volume of minute holes formed in the damaged region 115 is changed to cause the damaged region 115 to crack, whereby the single crystal semiconductor substrate 110 is cleaved along the damaged region 115. Since the second insulating layer 114 is bonded to the supporting substrate 100, the single crystal semiconductor layer 117 separated from the single crystal semiconductor substrate 110 is fixed to the supporting substrate 100. The temperature for the heat treatment for separating the single crystal semiconductor layer 117 from the single crystal semiconductor substrate 110 is set so as not to exceed the strain point of the supporting substrate 100.

For the heating treatment, a diffusion furnace, a heating furnace such as a resistance heating furnace, an RTA apparatus, a microwave heating apparatus, or the like can be used.

A heating furnace is an apparatus for heating an object to be processed mainly by radiation from a furnace heated by a resistance heater or the like.

An RTA apparatus is a heating apparatus utilizing lamp light. As an RTA apparatus, a lamp rapid thermal anneal (LRTA) apparatus and a gas rapid thermal anneal (GRTA) apparatus are given. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed by thermal radiation using light emitted from the above-described lamp and by conduction of heat from a gas heated by light emitted from a lamp. As the gas, an inert gas which does not react with an object to be processed by heat treatment, like nitrogen or a rare gas such as argon is used. Further, an LRTA apparatus or a GRTA apparatus may have not only a lamp but also a device for heating an object to be processed by conduction of heat or radiation of heat from a heater such as a resistance heater.

A microwave heating apparatus is an apparatus for heating an object to be processed by radiation of a microwave. A microwave heating apparatus may be provided with a device for heating an object to be processed by conduction of heat or radiation of heat from a heater such as a resistance heater.

By use of a heating apparatus such as an RTA apparatus, a temperature of the single crystal semiconductor substrate 110 bonded to the supporting substrate 100 is increased to a temperature range of from 400° C. to the strain point of the supporting substrate, inclusive. For example, the upper limit of the heating temperature can be 650° C.

In the case of using a GRTA apparatus, a heating temperature is set to be higher than or equal to 550° C. and lower than or equal to 650° C., and treatment time is set to be longer than or equal to 0.5 minute and shorter than or equal to 60 minutes, for example. In the case of using a resistance heating apparatus, a heating temperature is set to be higher than or equal to 550° C. and lower than or equal to 650° C., and treatment time is set to be longer than or equal to 2 hours and shorter than or equal to 4 hours. In the case of using a microwave heating apparatus, a microwave with a frequency of 2.45 GHz is emitted for a period longer than or equal to 10 minutes and shorter than or equal to 20 minutes, for example.

A specific method of heat treatment using a vertical furnace having a resistance heater is described. First, the supporting substrate 100 bonded to the single crystal semiconductor substrate 110 is disposed on a boat of a vertical furnace. The boat is transferred to a chamber of the vertical furnace. First, the inside of the chamber is set to a vacuum state by evacuation in order to suppress oxidation of the single crystal semiconductor substrate 110. The degree of vacuum is set to be approximately 5×10$^{-3}$ Pa. After setting the chamber to a vacuum state, nitrogen is supplied to the chamber, so that the chamber is made to have a nitrogen atmosphere under the atmospheric pressure. During this process, the temperature is increased to 200° C.

After the chamber is made to have a nitrogen atmosphere under the atmospheric pressure, heating is performed at a temperature of 200° C. for 2 hours. Then, the temperature is increased to 400° C. over 1 hour. When the state at a temperature of 400° C. becomes stable, the temperature is increased to 600° C. over 1 hour. When the state at a temperature of 600° C. becomes stable, heat treatment is performed at 600° C. for 2 hours. Then, the temperature is decreased to 400° C. over 1 hour, and after 10 to 30 minutes, the boat is transferred from the inside of the chamber. Under the atmospheric atmosphere, the single crystal semiconductor substrate 118 and the supporting substrate 100 to which the single crystal semiconductor layer 117 is bonded are cooled on the boat.

In the heat treatment using the resistance heating furnace, heating treatment for increasing a bonding force between the second insulating layer 114 and the supporting substrate 100 and heat treatment for causing separation in the damaged region 115 are successively performed. In the case of performing these two heat treatments with the use of different apparatuses, the following process can be performed, for example. First, heat treatment is performed at a treatment temperature of 200° C. for 2 hours in a resistance heating furnace. Then, the supporting substrate 100 and the single crystal semiconductor substrate 110, which are bonded together, are transferred from the furnace. Then, heat treatment is performed at a treatment temperature higher than or equal to 600° C. and lower than or equal to 700° C. for 1 minute to 30 minutes inclusive, using an RTA apparatus. Thus, the single crystal semiconductor substrate 110 is cleaved along the damaged regions 115.

In order that the second insulating layer 114 and the supporting substrate 100 are firmly bonded together by low-temperature treatment at a temperature of 700° C. or lower, it is preferable that an OH group or a water molecule ($H_2O$) is present on the surface of the second insulating layer 114 or the surface of the supporting substrate. This is because the second insulating layer 114 and the supporting substrate 100 start bonding to each other by formation of a covalent bond (covalent bond between an oxygen molecule and a hydrogen molecule) or hydrogen bonding by the OH group or the water molecule.

Accordingly, the surface of the second insulating layer 114 and the surface of the supporting substrate 100 are preferably activated to be hydrophilic. Further, the second insulating layer 114 is preferably formed by such a method as to contain oxygen or hydrogen. For example, when a silicon oxide film, a silicon oxynitride film, a silicon nitride oxide film, a silicon nitride film, or the like is formed by a PECVD method at a treatment temperature of 400° C. or lower, the film can contain hydrogen. For formation of the silicon oxide film or the silicon oxynitride film, $SiH_4$ and $N_2O$ may be used, for example, for a process gas. For formation of the silicon nitride oxide film, $SiH_4$, $NH_3$, and $N_2O$ may be used, for example, for a process gas. For formation of the silicon nitride film, $SiH_4$ and $NH_3$ may be used, for example, for a process gas. Further, it is also preferable to use a compound including an OH group such as TEOS (chemical formula: $Si(OC_2H_5)_4$) as a source material in formation by a PECVD method.

Here, treatment at a process temperature of 700° C. or lower is referred to as low-temperature treatment because the treatment is performed at a temperature of lower than or equal to the strain point of a glass substrate. In addition, in contrast to this embodiment mode, in forming an SOI substrate by Smart Cut (registered trademark), heat treatment at 800° C. or higher is performed in order to bond a single crystal silicon layer and a single crystal silicon wafer, and heat treatment at a temperature higher than the strain point of a glass substrate is required. Accordingly, treatment at a process temperature of 700° C. or lower is referred to as low-temperature treatment.

As illustrated in FIG. 4E, a peripheral portion of the single crystal semiconductor substrate 110 is not bonded to the supporting substrate 100 in many cases. The reasons include that the damaged region 115 is not easily separated in the peripheral portion of the single crystal semiconductor substrate 110 where the supporting substrate 100 and the second insulating layer 114 are not disposed in close contact with each other because the peripheral portion of the single crystal semiconductor substrate 110 is chamfered or the peripheral portion of the second insulating layer 114 is damaged or contaminated when the single crystal semiconductor substrate 110 is moved. Therefore, in some cases, the single crystal semiconductor layer 117 that has a smaller size than the single crystal semiconductor substrate 110 is bonded to the supporting substrate 100, a projecting portion is formed on the periphery of the single crystal semiconductor substrate 118, and portions of the first insulating layer 113b, the first insulating layer 113a, and the second insulating layer 114 which are not bonded to the supporting substrate 100 remain over the projecting portion.

Figure 5A:
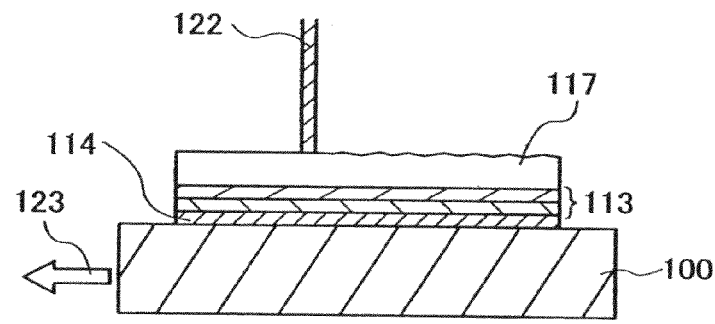
FIGS. 5A to 5C are cross-sectional views showing a method for manufacturing a semiconductor substrate.

The crystallinity of the single crystal semiconductor layer 117 disposed in close contact with the supporting substrate 100 is impaired by formation of the damaged region 115, cleavage along the damaged region 115, and the like. In other words, crystal defects such as dislocation or crystal microdefects such as dangling bonds which have not been seen in the single crystal semiconductor substrate 110 before processing are produced in the single crystal semiconductor layer 117. In addition, the surface of the single crystal semiconductor layer 117 is a separation face from the single crystal semiconductor substrate 110 and thus planarity thereof is impaired. In order to recover the crystallinity of the single crystal semiconductor layer 117, the single crystal semiconductor layer 117 is melted and recrystallized by being irradiated with a laser beam. In addition, in order to planarize its surface, the single crystal semiconductor layer 117 is irradiated with a laser beam, so that the single crystal semiconductor layer 117 is melted. FIG. 5A illustrates the laser irradiation treatment process.

As shown in FIG. 5A, the single crystal semiconductor layer 117 is scanned with the laser beam 122 such that the entire separation face of the single crystal semiconductor layer 117 is irradiated with the laser beam 122. The scanning with the laser beam 122 is conducted, for example, by moving the supporting substrate 100 to which the single crystal semiconductor layer 117 is fixed, instead of moving the laser beam 122. An arrow 123 denotes the movement direction of the supporting substrate 100.

When irradiated with the laser beam 122, the single crystal semiconductor layer 117 absorbs the laser beam 122, and the temperature of a portion irradiated with the laser beam 122 is increased. When the temperature of this portion becomes equal to or higher than the melting point of the single crystal semiconductor substrate 110, the portion is melted. After irradiation with the laser beam 122 is stopped, the temperature of the melted portion of the single crystal semiconductor layer 117 is decreased, and the melted portion is solidified and recrystallized with time. By scanning with the laser beam 122, the entire surface of the single crystal semiconductor layer 117 is irradiated with the laser beam 122. Alternatively, only a region of the single crystal semiconductor layer 117 that needs re-single-crystallization may be selectively irradiated with the laser beam 122.

Figure 5B:
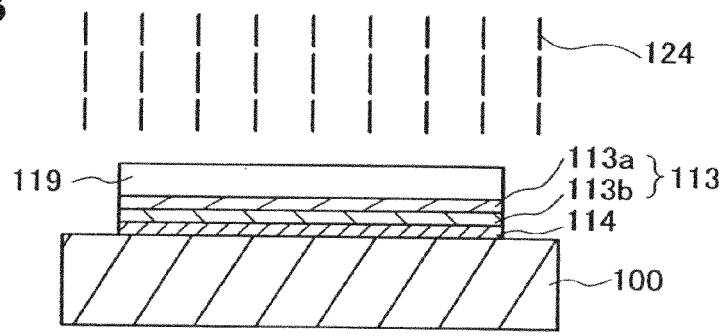

FIG. 5B shows a cross-sectional view of a structure of the semiconductor substrate 10 after the laser irradiation step. A single crystal semiconductor layer 119 is the single crystal semiconductor layer 117 which has undergone re-single-crystallization. An external view of FIG. 5B is shown in FIG. 1.

The single crystal semiconductor layer 119 which has been subjected to a laser irradiation process has higher crystallinity than the single crystal semiconductor layer 117. In addition, planarity can be improved by the laser irradiation process. This is because microdefects, such as a dangling bond in the single crystal semiconductor layer or a defect which is present at an interface between the single crystal semiconductor layer and a buffer layer, can be repaired by melting the single crystal semiconductor layer 117. Note that the crystallinity of the single crystal semiconductor layer can be evaluated by measurement of an electron backscatter diffraction pattern (electron backscatter pattern (EBSP)), measurement of an X-ray diffraction pattern, observation using an optical microscope and an electron microscope, measurement of a Raman spectroscopic spectrum, or the like. Further, the planarity of the surface of the single crystal semiconductor layer can be evaluated by observation using an atomic force microscope, for example.

By irradiation with the laser beam 122, a region irradiated with the laser beam 122 in the single crystal semiconductor layer 117 is partially or completely melted. Note that a completely melted state of the single crystal semiconductor layer 117 means that the entire layer from its upper surface to lower surface is melted. In a stacked structure of FIG. 5A, a completely melted state means that the single crystal semiconductor layer 117 is melted into a liquid state from its upper surface to the interface with the first insulating layer 113. Meanwhile, to partially melt the single crystal semiconductor layer 117 means melting the single crystal semiconductor layer 117 so that the depth of a melted portion is shallower than that of the interface with the first insulating layer 113 (the thickness of the single crystal semiconductor layer 117). In other words, a partially melted state of the single crystal semiconductor layer 117 means a state in which the upper portion is melted into a liquid phase and the lower portion is not melted and remains as a solid-phase single crystal semiconductor.

When the single crystal semiconductor layer 117 is partially melted by being irradiated with the laser beam 122, planarization is advanced due to surface tension of a semiconductor that is changed into a liquid phase. At the same time, cooling of the single crystal semiconductor layer 117 is advanced due to thermal diffusion to the supporting substrate 110. In the single crystal semiconductor layer 117, temperature gradient is generated in the depth direction. The solid-liquid interface is moved from the supporting substrate 100 side to the surface of the single crystal semiconductor layer 117, and recrystallization occurs. A so-called longitudinal growth occurs. This recrystallization is advanced using as a seed a lower region which is not melted.

The lower solid-phase portion is single crystal and has uniform crystal orientation; thus, no crystal grain boundary is formed therein and the single crystal semiconductor layer 119 after laser irradiation process can be a single crystal semiconductor layer without any crystal grain boundary. The upper melted portion is recrystallized by being solidified, and a single crystal semiconductor which has the same crystal orientation as the single crystal semiconductor in the lower portion which remains in a solid phase is formed. Therefore, in the case where a single crystal silicon wafer whose main surface is oriented along the (100) plane is used as the single crystal semiconductor substrate 110, a main surface of the single crystal semiconductor layer 117 is oriented along the (100) plane, and a main surface of the single crystal semiconductor layer 112 which is partially melted by laser irradiation process and is recrystallized is oriented along the (100) plane.

Furthermore, when the single crystal semiconductor layer 117 is completely melted by being irradiated with the laser beam 122, planarization is advanced due to surface tension of a semiconductor that is changed into a liquid phase. In the completely melted region, crystal growth occurs in the process of solidification from the single crystal semiconductor which is adjacent to the melted region, and lateral growth occurs. A portion which is not melted is single crystal and has uniform crystal orientation; thus, no crystal grain boundary is formed therein and the single crystal semiconductor layer 119 after laser irradiation process can be a single crystal semiconductor layer without any crystal grain boundary. That is, the completely melted region is recrystallized by being solidified, and a single crystal semiconductor which has the same crystal orientation as the single crystal semiconductor in the portion which is adjacent and not melted is formed. Therefore, in the case where a single crystal silicon wafer whose main surface is oriented along the (100) plane is used as the single crystal semiconductor substrate 110, a main surface of the single crystal semiconductor layer 117 is oriented along the (100) plane, and a main surface of the single crystal semiconductor layer 119 which is completely melted by laser irradiation process and is recrystallized is oriented along the (100) plane.

By complete melting or partial melting of the single crystal semiconductor layer 117 through irradiation with the laser beam 122, the single crystal semiconductor layer 119 having a flat surface can be formed. The reason is as follows. A melted portion of the single crystal semiconductor layer 117 is liquid and thus changes its shape by the action of surface tension so as to minimize its surface area. That is, a liquid portion changes its shape so as to have no depressed and protruding portions, and this liquid portion is then solidified and recrystallized. Accordingly, the single crystal semiconductor layer 119 having a planarized surface can be formed.

By planarization of the surface of the single crystal semiconductor layer 112, the thickness of a gate insulating film which is formed over the single crystal semiconductor layer 119 can be made small to approximately 5 nm to 50 nm. Accordingly, a transistor having high ON current can be formed while gate voltage is kept low.

In conventional techniques for manufacturing an SOI substrate, mechanical polishing is needed to planarize a single crystal semiconductor layer. In contrast, laser irradiation treatment of this embodiment mode realizes two important treatments, planarization of a single crystal semiconductor layer and formation of a single crystal semiconductor layer with excellent crystallinity. The laser irradiation treatment of this embodiment mode is not assumed in conventional techniques for manufacturing an SOI substrate and is a completely novel technique.

When irradiation with the laser beam 122 is performed, the temperature of the single crystal semiconductor layer 117 can be set to a room temperature or a temperature lower than or equal to the strain point of the supporting substrate. The single crystal semiconductor layer 117 which is fixed to the supporting substrate 100 can be heated, so that the temperature of the single crystal semiconductor layer 117 can be increased to a temperature higher than a room temperature. The heating temperature is lower than or equal to the strain point of the supporting substrate 100, and can be higher than or equal to 200° C. and lower than or equal to 650° C.

By heating of the supporting substrate to which the single crystal semiconductor layer is fixed, in irradiation with a laser beam, the energy needed for melting of the single crystal semiconductor layer 117 can be reduced. Accordingly, the width of the beam shape of the laser beam 122 (the length in a scanning direction) can be increased, or the overlap percentage of the laser beam 122 can be decreased. Thus, a scanning rate can be increased. As a result, cycle time for processing of one substrate is shortened; thus, throughput of a laser irradiation process is improved. It is considered that the energy of the laser beam can be reduced because the length of time that the single crystal semiconductor layer 117 is melted by one shot of a pulse is increased by heating.

Lasers can be classified into pulsed lasers, continuous wave lasers, and quasi-continuous wave lasers according to their emission mode. It is recommended to use a pulsed laser to perform re-single-crystallization of a melted portion of the single crystal semiconductor layer 117. When a pulsed laser is used, a region which is irradiated with one pulse (one shot) of a laser beam is melted, solidified, and recrystallized by the time it is irradiated with the subsequent pulse. In other words, a region which is melted by being irradiated with one pulse is recrystallized and returns to a solid-phase state by the time it is irradiated with the subsequent pulse. Thus, the most stable state when a region which is melted with a laser beam emitted from a pulsed laser is solidified is a single crystal structure that is obtained through crystal growth from a single crystal which is not melted.

On the other hand, in the case of a continuous wave laser, laser beam irradiation is not intermittent but constant. Thus, by scanning with a laser beam, the interface between a melted region (a liquid-phase region) and a solid-phase region is moved in that direction. Therefore, when the melted region is solidified, uniform crystal growth is unlikely to occur; the orientation of crystal axes does not become uniform; and grain boundaries are likely to be generated. The same applies to quasi-continuous wave lasers.

Accordingly, in a laser irradiation process, re-single-crystallization of the single crystal semiconductor layer 117 can be performed with higher reproducibility when a pulsed laser is used. As a pulsed laser, a laser having a repetition rate of less than 10 MHz, preferably 10 kHz or less can be used. When the repetition rate is less than 10 MHz, a region can be melted and solidified with every shot of a laser beam before being irradiated with the subsequent shot. In addition, the pulse width of a laser beam which is emitted from a pulsed laser can range from 10 nsec to 500 nsec.

Examples of the pulsed laser that is used for the laser irradiation step of FIG. 5A include excimer lasers such as a XeCl laser and a KrF laser and gas lasers such as an Ar laser and a Kr laser. Other examples that can be used are solid-state lasers such as a YAG laser, a $YVO_4$ laser, a YLF laser, a $YAlO_3$ laser, a $GdVO_4$ laser, a KGW laser, a KYW laser, and a $Y_2O_3$ laser. As the laser beam, a fundamental wave, a harmonic (such as a second harmonic, a third harmonic, or a fourth harmonic) of any of these lasers can be used. Some of these solid-state lasers can be either a continuous wave laser or a quasi-continuous wave laser even when using the same laser medium.

As a laser that emits the laser beam 122, a laser whose emission wavelength is in the range from the ultraviolet region to the visible light region is selected. The wavelength of the laser beam 122 is a wavelength that is absorbed by the single crystal semiconductor layer 117. The wavelength can be determined in consideration of the skin depth of laser light, and the like. For example, the wavelength can be in the range of 250 nm to 700 nm.

The energy of the laser beam 122 can be determined in consideration of the wavelength of the laser beam 122, the skin depth of the laser beam 122, the thickness of the single crystal semiconductor layer 117, and the like. When a pulsed laser is used, the energy density of the laser beam 122 can be set, for example, in the range of 300 $mJ/cm^2$ to 700 $mJ/cm^2$ inclusive.

Irradiation with the laser beam 122 may be performed either in the atmospheric atmosphere without any control or in an inert gas atmosphere. It is confirmed that each of the atmospheric atmosphere and an inert gas atmosphere is effective for recovery of crystallinity and planarization of the single crystal semiconductor layer 117. It is also confirmed that an inert gas atmosphere is more preferable than the atmospheric atmosphere. An inert gas atmosphere such as nitrogen is more effective than the atmospheric atmosphere in improving planarity of the single crystal semiconductor layer 117. In addition, deformation such as a crack is less likely to be generated in an inert gas atmosphere than in the atmospheric atmosphere, and the energy of the laser beam 122 to reduce crystal defects and to achieve planarization can be selected from a wider range.

In order to perform irradiation with the laser beam 122 in an inert gas atmosphere, irradiation with the laser beam 122 may be performed in an airtight chamber. By supply of an inert gas into this chamber, irradiation with the laser beam 122 can be performed in an inert gas atmosphere. When a chamber is not used, a surface of the single crystal semiconductor layer 117 is irradiated with the laser beam 122 while an inert gas is blown onto the irradiated surface. Accordingly, irradiation with the laser beam 122 in an inert gas atmosphere can be achieved.

An inert gas refers to a gas of molecules or atoms that do not form an oxide film by reacting with a surface of a single crystal semiconductor layer in a laser beam irradiation process. Examples of inert gases include a nitrogen gas ($N_2$ gas), a rare gas such as argon and xenon, and the like. The concentration of oxygen in an inert gas is preferably 30 ppm or lower, more preferably, 10 ppm or lower.

When the laser irradiation process is performed in an airtight chamber, the pressure inside the chamber is reduced to a vacuum. Accordingly, an effect similar to that produced by performing a laser irradiation process in an inert gas atmosphere can be obtained. It is preferable that the pressure inside the chamber be 12 Pa or lower or the partial pressure of oxygen be 30 ppm or lower. It is more preferable that the pressure inside the chamber be 4 Pa or lower or the partial pressure of oxygen be 10 ppm or lower.

Further, the laser beam 122 is made to pass through an optical system so that the laser beam 122 on a surface to be irradiated has a linear or rectangular beam shape. Accordingly, irradiation with the laser beam 122 can be performed with high throughput.

Before the single crystal semiconductor layer 117 is irradiated with the laser beam 122, an oxide film such as a natural oxide film, which is formed on the surface of the single crystal semiconductor layer 117, is removed. This is because there is a case where a sufficient planarization effect is not obtained when the single crystal semiconductor layer 117 is irradiated with the laser beam 122 in the presence of an oxide film on the surface of the single crystal semiconductor layer 117. The oxide film can be removed by treatment of the single crystal semiconductor layer 117 with hydrofluoric acid. Treatment with hydrofluoric acid is desirably performed until the surface of the single crystal semiconductor layer 117 becomes water repellent. When the single crystal semiconductor layer 117 has water repellency, it can be confirmed that the oxide film is removed from the single crystal semiconductor layer 117.

The irradiation step with the laser beam 122 of FIG. 5A can be performed as follows. First, the single crystal semiconductor layer 117 is treated with a 100-fold diluted hydrofluoric acid for 110 seconds to remove the oxide film on the surface. Next, the supporting substrate 100 to which the single crystal semiconductor layer 117 is bonded is placed on a stage of a laser irradiation apparatus. In the case of heating the single crystal semiconductor layer 117, with a heating unit such as a resistance heating apparatus which is provided in the stage, the single crystal semiconductor layer 117 is heated to a temperature in the range of 200° C. to 650° C. inclusive. For example, the single crystal semiconductor layer 117 is heated to 500° C.

As a laser which emits the laser beam 122, a XeCl excimer laser (with a wavelength of 308 nm, a pulse width of 25 nsec, and a repetition rate of 60 Hz) is used. Through an optical system, a section of the laser beam 122 is formed into a linear shape of 300 mm×0.34 mm. The single crystal semiconductor layer 117 is irradiated with the laser beam 122 while the single crystal semiconductor layer 117 is scanned with the laser beam 122. Scanning with the laser beam 122 can be conducted by moving the stage of the laser irradiation apparatus, and the movement rate of the stage corresponds to the scanning rate of the laser beam. The scanning rate of the laser beam 122 is adjusted so that the same irradiation region of the single crystal semiconductor layer 117 is irradiated with 1 to 20 shots of the laser beam 122. The number of shots of the laser beam 122 is preferably greater than or equal to 1 and less than or equal to 11. By being irradiated with one shot of the laser beam 122, the single crystal semiconductor layer 117 can be melted, whereby it can be re-single-crystallized and its surface can be planarized. The smaller the number of shots, the more shortened the takt time of laser irradiation treatment can be.

Heat treatment which causes melting by irradiation with the laser beam 122 is performed, and heat treatment which does not cause melting is subsequently performed, whereby a more-complete single crystal semiconductor layer can be obtained. By using the semiconductor substrate 10, to which the single crystal semiconductor layer 112 with such excellent crystallinity is fixed, a transistor with high ON current and high electron field mobility can be formed.

Before the single crystal semiconductor layer 117 is irradiated with the laser beam 122, the single crystal semiconductor layer 117 can be etched. The damaged region 115 which remains on the separation face of the single crystal semiconductor layer 117 can be removed by this etching. By removal of the damaged region 115, a surface planarization effect and a crystallinity recovery effect which are produced by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbr.: TMAH) solution.

In the case where this etching is performed, it is also preferable that an oxide film such as a natural oxide film, which is formed on the surface of the single crystal semiconductor layer 117 after the etching, be removed before the single crystal semiconductor layer 117 is irradiated with the laser beam 122. The oxide film can be removed by treatment of the single crystal semiconductor layer 117 with hydrofluoric acid.

After the irradiation with the laser beam 122, heat treatment for heating at a temperature at which the single crystal semiconductor layer 119 is not melted is performed. FIG. 5B is a cross-sectional view for illustrating the heat treatment process. FIG. 5B shows the state that the single crystal semiconductor layer 119 is heated by radiation of an electromagnetic wave 124. Heating of the single crystal semiconductor layer 119 is not limited to the radiation of the electromagnetic wave 124, and the single crystal semiconductor layer 119 can be heated by conduction of heat. Of course, the single crystal semiconductor layer 119 can be heated by a combination of radiation and conduction of heat.

Figure 5C:
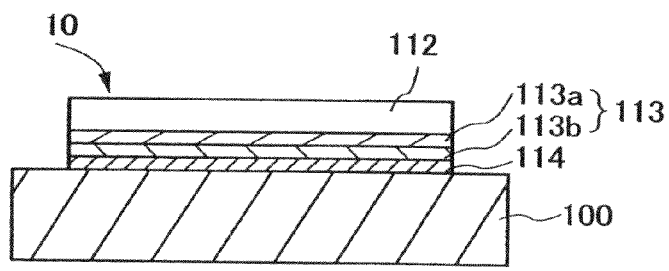

FIG. 5C is a cross-sectional view showing a structure of a semiconductor substrate which has been subjected to heat treatment, in which the single crystal semiconductor layer 112 corresponds to the single crystal semiconductor layer 119 heated at a temperature at which the single crystal semiconductor layer is not melted. Note that FIG. 1 is an external view of FIG. 5C.

For the heating treatment shown in FIG. 5B, a diffusion furnace, a heating furnace such as a resistance heating furnace, an RTA apparatus, a microwave heating apparatus, or the like can be used.

In order to repair a defect or the like of the single crystal semiconductor layer 119, the single crystal semiconductor layer 119 is heated to a temperature of higher than or equal to 400° C. The heating temperature is a temperature at which the single crystal semiconductor layer 119 is not melted and which is lower than or equal to the strain point of the supporting substrate 100. The heating temperature is preferably higher than or equal to 500° C.; for example, the heating temperature can be higher than or equal to 500° C. and lower than or equal to 650° C. More preferably, the single crystal semiconductor layer 119 is heated at a temperature of higher than or equal to 550° C.

An atmosphere of the heat treatment can be an atmosphere of an inert gas. An inert gas refers to a gas of a molecule or an atom which does not form an oxide film by reaction with a surface of the single crystal semiconductor layer in this heat treatment. For example, an inert gas includes a nitrogen gas ($N_2$ gas), a rare gas such as argon or xenon, or the like. Further, the oxygen concentration in an inert gas atmosphere is preferably lower than or equal to 30 ppm, more preferably lower than or equal to 10 ppm. Furthermore, by setting an atmosphere of the heat treatment to a low-pressure state (vacuum state), oxidation of the surface of the single crystal semiconductor layer can be prevented. The pressure is preferably $1 \times 10^{-3}$ Pa to $5 \times 10^{-3}$ Pa.

By heat treatment, the lifetime of the single crystal semiconductor layer 112 can be improved more than that of the single crystal semiconductor layer 119 which is not subjected to heat treatment. Although the reason is not obvious, it is considered that the lifetime of the single crystal semiconductor layer 112 is improved because a microdefect inside the single crystal semiconductor layer 119, which has not been repaired in a laser irradiation process, is repaired and a dangling bond at the interface between the buffer layer 111 and the single crystal semiconductor layer 119 is repaired by heat treatment in which the single crystal semiconductor layer 119 is not melted. In order to obtain an effect of improvement of the lifetime, the heating temperature is set to be higher than or equal to 400° C., preferably higher than or equal to 500° C., more preferably higher than or equal to 550° C.

By irradiation of a semiconductor (silicon) with light, electrons and holes (carriers) are generated in the semiconductor. Then, electrons and holes are recombined and annihilated. An average lifetime in which the carriers are generated, recombined, and annihilated is referred to as a lifetime. A lifetime is also referred to as a recombination lifetime or a carrier lifetime. The longer the lifetime, the smaller the quantity of a defect and an impurity in the semiconductor is. Thus, by use of the single crystal semiconductor layer with a long lifetime, a highly reliable transistor with excellent electric characteristic can be manufactured.

As described above, in this embodiment mode, the single crystal semiconductor layer 112 with a more-complete single crystal structure can be formed by heat treatment with the use of irradiation with the laser beam 122, which causes melting, and by subsequent heat treatment which does not cause melting. From the semiconductor substrate 10 to which the single crystal semiconductor layer 112 with such excellent crystallinity is fixed, a transistor with high ON current and high field-effect mobility can be formed.

Further, in the case where hydrogen ions are added to the single crystal semiconductor substrate 110 by an ion doping method using a hydrogen gas as a source gas in order to form the damaged region 115 as shown in FIG. 4B, hydrogen is also included at a high concentration in the single crystal semiconductor layer 117 separated from the single crystal semiconductor substrate 110. The hydrogen concentration of the single crystal semiconductor layer 112 after the laser irradiation process of FIG. 5A and the heat treatment of FIG. 5B is lower than that of the single crystal semiconductor layer 117. However, by setting a process temperature to be 700° C. or lower, the hydrogen concentration of the single crystal semiconductor layer 112 can be higher than or equal to $5 \times 10^{18}$ atom/cm$^3$ and lower than or equal to $5 \times 10^{20}$ atom/cm$^3$. The hydrogen concentration is preferably higher than or equal to $1 \times 10^{19}$ atom/cm$^3$ and lower than or equal to $1 \times 10^{20}$ atom/cm$^3$. The hydrogen concentration of the single crystal semiconductor layer 112 is easily varied if the hydrogen concentration becomes high, which may cause reduction of reliability of a semiconductor device.

In the case where the heat treatment of FIG. 5B is performed by, for example, a resistance heating furnace, the single crystal semiconductor layer 119 is heated at a process temperature of 500° C. for 1 hour; then, the heating temperature is increased to a temperature of higher than or equal to 550° C. and lower than or equal to 650° C., and heating is performed at the temperature for 4 hours. Alternatively, the single crystal semiconductor layer 119 is heated at a process temperature of 500° C. for 1 hour; then, the heating temperature is increased to 600° C., and heating is performed at 600° C. for 4 hours. In the case of using an RTA apparatus, heat treatment is performed in which a process temperature is higher than or equal to 600° C. and lower than or equal to 700° C. and process time is longer than or equal to 0.5 minute and shorter than or equal to 30 minutes.

After the single crystal semiconductor layer 117 is irradiated with the laser beam 122, the single crystal semiconductor layer 119 may be thinned by etching. The thickness of the single crystal semiconductor layer 119 can be determined in accordance with characteristics of an element to be formed with the single crystal semiconductor layer 112. In order to form a thin gate insulating layer with excellent step coverage over the surface of the single crystal semiconductor layer 112 which is bonded to the supporting substrate 100, the thickness of the single crystal semiconductor layer 119 is preferably 50 nm or less and may be 5 nm or more and 50 nm or less. The process for thinning is preferably performed before the heat treatment of FIG. 5B. This is because damage of the single crystal semiconductor layer 119 by etching in the process for thinning can be recovered by the heat treatment of FIG. 5B.

The etching for thinning the single crystal semiconductor layer 119 can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

Because the processes from FIGS. 4A to 4E and FIGS. 5A to 5C can be performed at a temperature of 700° C. or lower, a glass substrate having a strain point of 700° C. or lower can be used as the supporting substrate 100. Thus, an inexpensive glass substrate can be used, whereby material cost of the semiconductor substrate 10 can be reduced.

Note that, by using the method of this embodiment mode, a plurality of single crystal semiconductor layers 112 can also be bonded to one piece of the supporting substrate 100. A plurality of single crystal semiconductor substrates 110 each having the structure of FIG. 4C are formed through the processes of FIGS. 4A to 4C. Then, the process of FIG. 4D is repeated a plurality of times, thereby bonding the plurality of single crystal semiconductor substrates 110 to one piece of the supporting substrate 100. After that, through the processes of FIG. 4E and FIGS. 5A to 5C, it is possible to manufacture a semiconductor substrate 20 including the supporting substrate 100 to which a plurality of single crystal semiconductor layers 112 is bonded as shown in FIG. 2.

In order to manufacture the semiconductor substrate 20, it is preferable that a glass substrate of 300 mm×300 mm or larger be used as the supporting substrate 100. As a large-area glass substrate, a mother glass substrate which is developed for production of liquid crystal panels is preferred. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like.

By the use of a large-area substrate like a mother glass substrate as the supporting substrate 100, an SOI substrate having a larger area can be obtained. If an SOI substrate having a larger area can be obtained, a number of chips such as ICs or LSIs can be manufactured from one SOI substrate and a larger number of chips can be manufactured from one substrate. Accordingly, productivity can be drastically improved.

Figure 2:
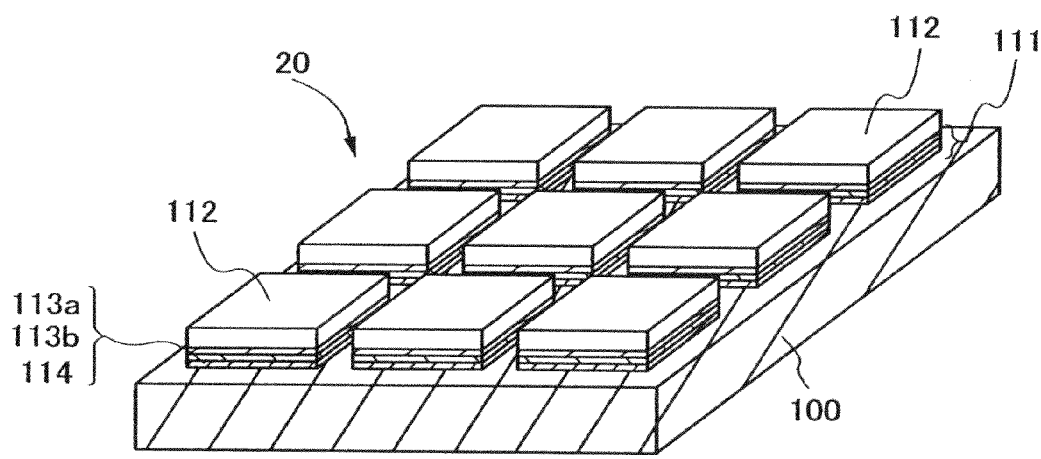
FIG. 2 is an external view showing an example of a structure of a single crystal semiconductor substrate.

As in the semiconductor substrate 20 of FIG. 2, in the case where the supporting substrate 100 is a supporting substrate which is easily bendable and brittle like a glass substrate, it is very difficult to employ polishing treatment for planarization of the plurality of single crystal semiconductor layers 112 which are bonded to one supporting substrate. In this embodiment mode, this planarization treatment is performed by irradiation treatment with the laser beam 122. Accordingly, the single crystal semiconductor layers 117 which are fixed to one supporting substrate 100 can be planarized without applying any force that may damage the supporting substrate 100 and without heating the supporting substrate 100 at a temperature exceeding its strain point. That is, laser beam irradiation treatment is very important treatment in the manufacturing process of the semiconductor substrate 20 to which a plurality of single crystal semiconductor layers 112 are fixed as shown in FIG. 2. That is, disclosed in this embodiment mode is that the laser beam irradiation treatment is not assumed in conventional techniques for manufacturing an SOI substrate and is a completely novel technique.

As described in this embodiment mode, the present invention provides a novel, innovate technique with respect to a method for forming a single crystal semiconductor layer with improved lifetime which includes hydrogen at a concentration of $5 \times 10^{18}$ atoms/cm$^3$ or higher over a glass substrate, by a laser treatment process in which recrystallization by melting the single crystal semiconductor layer and planarization are performed and by subsequent heat treatment which does not cause melting. Further, this embodiment mode provides a technique for fixing to a glass substrate a single crystal semiconductor layer which includes hydrogen at a concentration of $5 \times 10^{18}$ atoms/cm$^3$ or higher. By forming a semiconductor device including a transistor with the use of the semiconductor substrate of this embodiment mode, a high-performance, multifunction semiconductor device can be manufactured.

Note that the method for manufacturing a semiconductor substrate of this embodiment mode can be combined with any of methods for manufacturing a semiconductor substrate in other embodiment modes and methods for manufacturing a semiconductor device in other embodiment modes.

Embodiment Mode 2

This embodiment mode describes a semiconductor substrate in which a single crystal semiconductor layer is fixed to a supporting substrate with a buffer layer interposed therebetween, and a method for manufacturing the semiconductor substrate. Further, this embodiment mode describes a method for manufacturing the semiconductor substrate by forming a buffer layer over a supporting substrate.

Figure 6:
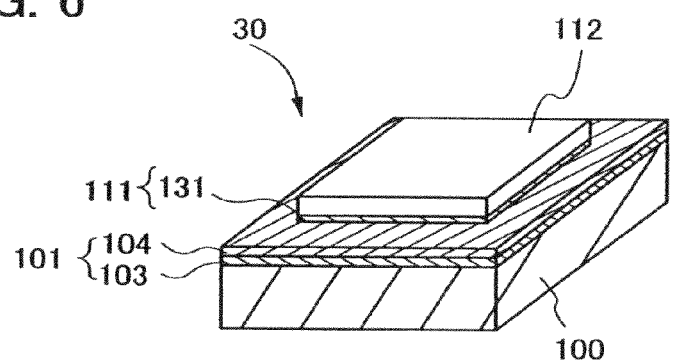
FIG. 6 is an external view showing an example of a structure of a semiconductor substrate.

FIG. 6 is a perspective view showing a structural example of a semiconductor substrate. In a semiconductor substrate 30, a single crystal semiconductor layer 112 is bonded to a supporting substrate 100. The single crystal semiconductor layer 112 is a layer formed by thinning a single crystal semiconductor substrate, and is fixed to the supporting substrate 100 with a buffer layer 111 and a buffer layer 101 interposed therebetween. The semiconductor substrate 30 is a substrate having a so-called SOI structure, in which a single crystal semiconductor layer is formed over an insulating layer. A surface of the buffer layer 101 formed over the supporting substrate 100 and a surface of the buffer layer 111 formed on the single crystal semiconductor layer 112 are bonded to each other, whereby the single crystal semiconductor layer 112 is fixed to the supporting substrate 100.

The buffer layer 101 is a film having a single-layer structure or a film having a multilayer structure in which two or more films are stacked. A film included in the buffer layer 101 is formed over a surface of the supporting substrate 100 by film formation treatment. In this embodiment mode, the buffer layer 101 is a film having a two-layer structure in which an insulating layer 103 and an insulating layer 104 are stacked in this order from the supporting substrate 100 side. In this embodiment mode, the insulating layer 103 which is disposed in close contact with the supporting substrate 100 is made to function as a barrier layer. The buffer layer 111 is a film having a single-layer structure or a film having a multilayer structure in which two or more films are stacked. A film included in the buffer layer 111 is formed over a surface of the single crystal semiconductor substrate by film formation treatment. In this embodiment mode, the buffer layer 111 has a single-layer structure, which is formed of an insulating layer 131.

Hereinafter, a method for manufacturing the semiconductor substrate 30 shown in FIG. 6 is described with reference to FIG. 8, FIGS. 9A to 9E, and FIGS. 10A to 10C.

Figure 8:
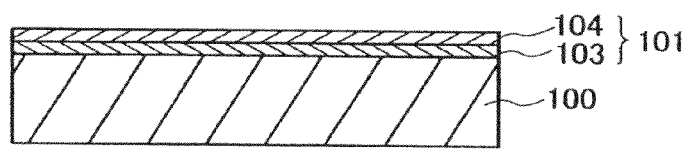
FIG. 8 is a cross-sectional view showing a method for manufacturing a semiconductor substrate.

First, a process for forming the buffer layer 101 over the supporting substrate 100 is described. FIG. 8 is a cross-sectional view for illustrating a process for forming the buffer layer 101. As a film included in the buffer layer 101, an insulating film containing silicon or germanium as its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including oxide of metal such as aluminum oxide, tantalum oxide, or hafnium oxide; an insulating film including nitride of metal such as aluminum nitride; an insulating film including oxynitride of metal such as aluminum oxynitride; or an insulating film including nitride oxide of metal such as aluminum nitride oxide can also be used. The insulating film included in the buffer layer 101 can be formed by a CVD method, a sputtering method or the like.

The buffer layer 101 preferably includes a barrier layer for preventing sodium from penetrating the single crystal semiconductor layer 112. The number of barrier layers may be one, or larger than or equal to two. For example, in the case of using a substrate including an impurity which reduces reliability of a semiconductor device, such as alkali metal or alkaline-earth metal, in the supporting substrate 100, such impurities may be diffused from the supporting substrate 100 into the single crystal semiconductor layer 112 when the supporting substrate 100 is heated. By forming the barrier layer in the buffer layer 101, such an impurity which reduces reliability of a semiconductor device, such as alkali metal or alkaline-earth metal, can be prevented from moving to the single crystal semiconductor layer 112. As a film functioning as the barrier layer, a silicon nitride film, a silicon nitride oxide film, an aluminum nitride film, an aluminum nitride oxide film, or the like can be given. By including such a film, the buffer layer 101 can be made to function as a barrier layer.

For example, in the case where the buffer layer 101 has a single-layer structure, the buffer layer 101 is preferably formed of a film functioning as a barrier layer. In this case, the buffer layer 101 with a single-layer structure can be formed of a silicon nitride film, a silicon nitride oxide film, an aluminum nitride film, or an aluminum nitride oxide film which has a thickness of greater than or equal to 5 nm and less than or equal to 200 nm.

In the case where the buffer layer 101 has a two-layer structure including one barrier layer, a film disposed in close contact with the supporting substrate 100 is formed of a barrier layer for blocking an impurity such as sodium. In this embodiment mode, the insulating layer 103 is formed of an insulating film formed as a barrier layer. The insulating layer 103 can be formed of a silicon nitride film, a silicon nitride oxide film, an aluminum nitride film, or an aluminum nitride oxide film which has a thickness of 5 nm to 200 nm.

These films functioning as a barrier layer have a high blocking effect for preventing impurity diffusion in addition to high internal stress. Therefore, as the insulating layer 104 disposed in close contact with the insulating layer 103, a film with an effect of relieving the stress of the buffer layer 101 is preferably formed. As the insulating film having such an effect, a silicon oxide film, a silicon oxynitride film, and the like is given. The thickness of the insulating layer 104 can be greater than or equal to 5 nm and less than or equal to 300 nm. Since the upper surface of the insulating layer 104 is to be a bonding surface, the average of the roughness Ra of the upper surface of the insulating layer 104 is preferably less than or equal to 0.7 nm, more preferably less than or equal to 0.4 nm. Further, the thickness of the insulating layer 104 can be greater than or equal to 10 nm and less than or equal to 200 nm. The thickness of the insulating layer 104 is preferably greater than or equal to 5 nm and less than or equal to 500 nm, more preferably greater than or equal to 10 nm and less than or equal to 200 nm.

For example, the insulating layer 103 can be formed of a silicon oxynitride film by a PECVD method with the use of $SiH_4$ and $N_2O$ for a process gas. Further, as the insulating layer 104, a silicon oxide film can be formed by a PECVD method with the use of an organosilane gas and oxygen for a process gas.

For example, in the case where the first insulating layer 103 made of silicon nitride oxide and the insulating layer 104 made of silicon oxynitride are formed by a PECVD method, the supporting substrate 100 is carried to a chamber of a PECVD apparatus. Then, $SiH_4$, $N_2O$, $NH_3$, $H_2$, and $N_2O$ are supplied to the chamber as a process gas for forming the insulating layer 103, and plasma of the process gas is produced, so that a silicon nitride oxide film is formed over the supporting substrate 100. Next, gas introduced into the chamber is changed to a process gas for forming the insulating layer 104. Here, $SiH_4$ and $N_2O$ are used. Plasma of a mixed gas of these is produced, so that a silicon oxynitride film is successively formed over the silicon nitride oxide film. In the case of using a PECVD apparatus with a plurality of chambers, a silicon oxynitride film and a silicon nitride oxide film can be formed in different chambers. Of course, a silicon oxide film can be formed in the lower layer and a silicon nitride film can be formed in the upper layer by changing a gas to be introduced into a chamber.

The insulating layer 103 and the insulating layer 104 are successively formed in the manner described above, whereby the buffer layer 101 can be formed over each of a plurality of supporting substrates 100 with high throughput. Further, the insulating layer 103 and the insulating layer 104 can be formed without being exposed to the air; thus, an interface between the insulating layer 103 and the insulating layer 104 can be prevented from being contaminated by the air.

Figure 9A:
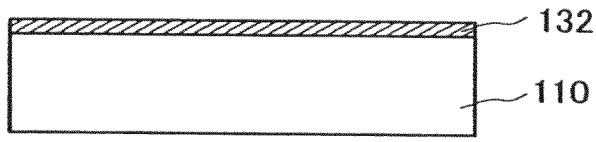
FIGS. 9A to 9E are cross-sectional views showing a method for manufacturing a semiconductor substrate.

Next, a method for treating the single crystal semiconductor substrate 110 is described with reference to FIGS. 9A to 9E. First, in a manner similar to Embodiment Mode 1, the single crystal semiconductor substrate 110 is cleaned. Then, as shown in FIG. 9A, a protection film 132 is formed over a surface of the single crystal semiconductor substrate 110. The protection film 132 is formed with aims of preventing the single crystal semiconductor substrate 110 from being contaminated by impurities such as metal in an ion irradiation process, preventing the surface of the single crystal semiconductor substrate 110 from being damaged due to shock of ions at the irradiation in an ion irradiation process, and the like. This protection film 132 can be formed by a CVD method or the like by depositing an insulating material such as silicon oxide, silicon nitride, silicon nitride oxide, or silicon oxynitride. Alternatively, the protection film 132 can be formed by oxidizing or nitriding the single crystal semiconductor substrate 110. For example, the protection film 132 formed of an oxide film by oxidation of the single crystal semiconductor substrate 110 can be formed by thermal oxidation treatment (dry oxidation treatment or water vapor oxidation treatment) or oxidation treatment using ozone-containing water. In the case of using dry oxidation treatment, it is preferable to add a gas including halogen to an oxidizing atmosphere. As a gas including halogen, one or more kinds of gases selected from HCl, HF, $NF_3$, HBr, $Cl_2$, $ClF_3$, $BCl_3$, $F_2$, $Br_2$, and the like can be used.

Figure 9B:
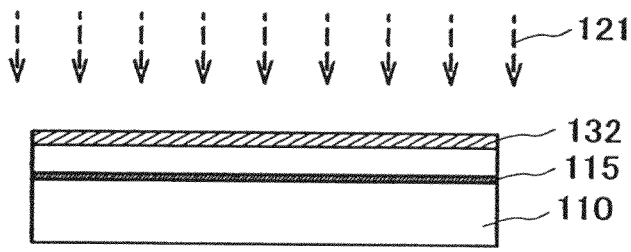

Next, as shown in FIG. 9B, the single crystal semiconductor substrate 110 is irradiated with ions 121 which are accelerated by an electric field, through the protection film 132, thereby forming a damaged region 115 in the single crystal semiconductor substrate 110 at a predetermined depth from the surface thereof. This process can be performed in a manner similar to a method for forming the damaged region 115 in Embodiment Mode 1.

Figure 9C:
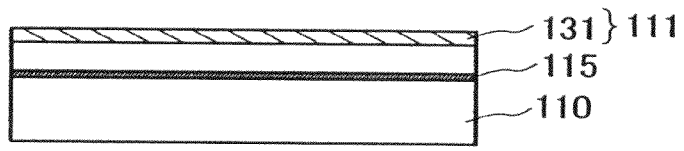

After the damaged region 115 is formed, the protection film 132 is removed. Next, as shown in FIG. 9C, an insulating layer 131 which forms the buffer layer 111 is formed over the upper surface of the single crystal semiconductor substrate 110. The insulating layer 131 can be formed in a manner similar to the first insulating layer 113a in FIG. 4A. Alternatively, the insulating layer 131 can be formed by subjecting the single crystal semiconductor substrate 110 to oxidation treatment. The process temperature of the oxidation treatment is set at a temperature at which an element or a molecule which is added to the damaged region 115 is not precipitated, and the heating temperature is preferably lower than or equal to 350° C. For oxidation treatment at such a low temperature, oxidation treatment using ozone-containing water, oxidation treatment using plasma treatment or high-density plasma treatment, or the like can be used.

The insulating layer 131 is layer for forming a bonding surface, which is smooth and hydrophilic, on a surface of the single crystal semiconductor substrate 110. Therefore, the average of the roughness Ra of a surface of the insulating layer 131 is preferably less than or equal to 0.7 nm, more preferably less than or equal to 0.4 nm. Further, the thickness of the insulating layer 131 can be greater than or equal to 10 nm and less than or equal to 200 nm. The thickness of the insulating layer 131 is preferably greater than or equal to 5 nm and less than or equal to 500 nm, more preferably greater than or equal to 10 nm and less than or equal to 200 nm.

As the insulating layer 131, an insulating film formed by a chemical gas phase reaction can be used. For example, a silicon oxide film, a silicon oxynitride film, a silicon nitride oxide film, a silicon nitride film, or the like can be formed as the insulating layer 131. In the case where a silicon oxide film is formed by a PECVD method as the insulating layer 131, an organosilane gas and an oxygen ($O_2$) gas are preferably used for a source gas. By using organosilane for the source gas, a silicon oxide film having a smooth surface can be formed at a process temperature which is equal to or lower than 350° C. Alternatively, low temperature oxide (LTO) formed at a temperature higher than or equal to 200° C. and lower than or equal to 500° C. by a thermal CVD method can be used. LTO can be formed by using monosilane ($SiH_4$), disilane ($Si_2H_6$), or the like as a silicon source gas and using dinitrogen monoxide ($N_2O$) or the like as an oxygen source gas.

For an example of the condition for forming the insulating layer 131 formed of a silicon oxide film by using TEOS and $O_2$ for a source gas, TEOS is introduced at a flow rate of 15 sccm and $O_2$ is introduced at a flow rate of 750 sccm into a chamber. As a deposition pressure, a deposition temperature, an RF output, and power frequency, 100 Pa, 300° C., 300 W, and 13.56 MHz are respectively given as examples.

Then, the single crystal semiconductor substrate 110 provided with the damaged region 115 and the buffer layer 111, and the supporting substrate 100 provided with the buffer layer 101 are cleaned. This cleaning process can be performed by ultrasonic cleaning with pure water. The ultrasonic cleaning is preferably megahertz ultrasonic cleaning (megasonic cleaning). It is preferable to clean both or one of the single crystal semiconductor substrate 110 and the supporting substrate 100 with ozone-containing water after the ultrasonic cleaning. Through the cleaning with ozone-containing water, an organic substance can be removed and surface activation treatment which improves hydrophilicity of the buffer layer 101 and the buffer layer 111 can be performed.

As the surface activation treatment performed on the buffer layer 101 and the buffer layer 111, cleaning with ozone-containing water, irradiation treatment with an atomic beam or an ion beam, plasma treatment, or radical treatment can be performed. When irradiation treatment with an atomic beam or an ion beam is performed, a neutral atomic beam or an ion beam is generated by exciting a rare gas such as argon.

Figure 9D:
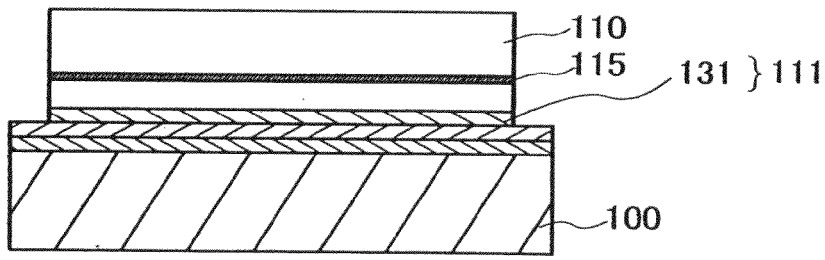

FIG. 9D is a cross-sectional view illustrating a bonding process. This bonding process can be carried out in a manner similar to the bonding process shown in FIG. 4D. The supporting substrate 100 and the single crystal semiconductor substrate 110 are disposed in close contact with each other with the buffer layer 101 and the buffer layer 111 interposed therebetween, so that the surface of the buffer layer 101 and the surface of the buffer layer 111 are bonded to each other. In such a manner, the single crystal semiconductor substrate 110 is fixed to the supporting substrate 100.

After the single crystal semiconductor substrate 110 is bonded to the supporting substrate 100, it is preferable to perform heat treatment for increasing a bonding force at a bonding interface between the buffer layer 101 and the buffer layer 111. A process temperature is set so that the damaged region 115 is not cracked, and can be higher than or equal to 200° C. and lower than or equal to 450° C.

Figure 9E:
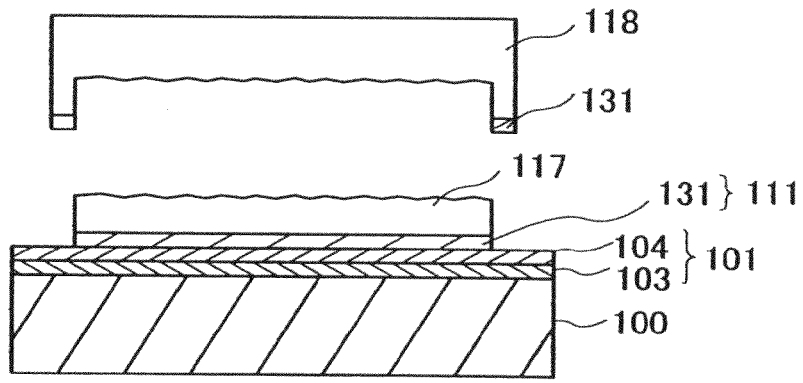

Next, heat treatment is performed, and separation is caused in the damaged region 115, so that the single crystal semiconductor layer 117 is separated from the single crystal semiconductor substrate 110. FIG. 9E illustrates a separation process for separating the single crystal semiconductor layer 117 from the single crystal semiconductor substrate 110. This process can be carried out in a manner similar to the separation process of FIG. 4E.

By performing the heat treatment, volume of minute holes formed in the damaged region 115 is changed to cause the damaged region 115 to crack, whereby the single crystal semiconductor substrate 110 is separated along the damaged region 115; thus, the single crystal semiconductor layer 117 separated from the single crystal semiconductor substrate 110 is fixed to the supporting substrate 100 as shown in FIG. 9E.

Figure 10A:
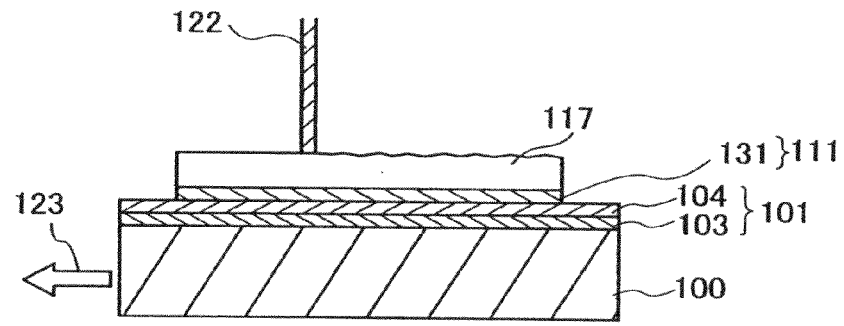
FIGS. 10A to 10C are cross-sectional views showing a method for manufacturing a semiconductor substrate.

Next, as shown in FIG. 10A, the single crystal semiconductor layer 117 disposed in close contact with the supporting substrate 100 is irradiated with a laser beam 122. This laser irradiation process can be carried out in a manner similar to the laser irradiation process of Embodiment Mode 1 (see FIG. 5A). The single crystal semiconductor layer 117 is scanned with the laser beam 122 such that the separation surface of the single crystal semiconductor layer 117 is irradiated with the laser beam 122. In such a manner, the single crystal semiconductor layer 117 is melted, whereby the single crystal semiconductor layer 119 which is re-single-crystallized and the surface of which is planarized is formed.

When irradiation with the laser beam 122 is performed, the single crystal semiconductor layer 177 fixed to the supporting substrate 100 is heated to increase the temperature of the single crystal semiconductor layer 117. The heating temperature can be higher than or equal too 200° C. and lower than or equal to the strain point of the supporting substrate 100. The heating temperature is preferably higher than or equal to 400° C., more preferably higher than or equal to 450° C. In specific, the heating temperature is preferably higher than or equal to 400° C. and lower than or equal to 670° C., more preferably higher than or equal to 450° C. and lower than or equal to 650° C.

By heating of a single crystal semiconductor layer, microdefects such as dangling bonds in the single crystal semiconductor layer or defects at the interface between the single crystal semiconductor layer and a base film can be removed; thus, a more-complete single crystal semiconductor layer can be obtained. With the use of the semiconductor substrate 30 in which the single crystal semiconductor layer 112 having a smaller number of crystal defects, such as dislocation, or crystal microdefects, such as dangling bonds, is fixed, a transistor with high ON current and high field-effect mobility can be formed.

Note that before the single crystal semiconductor layer 117 is irradiated with the laser beam 122, the single crystal semiconductor layer 117 can be etched. It is preferable that the damaged region 115 which remains on the separation face of the single crystal semiconductor layer 117 can be removed by this etching. By removal of the damaged region 115, a surface planarization effect and a crystallinity recovery effect which are produced by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbr.: TMAH) solution.

After the single crystal semiconductor layer 117 is irradiated with the laser beam 122, the single crystal semiconductor layer 112 may be thinned by etching. The thickness of the single crystal semiconductor layer 112 can be determined in accordance with characteristics of an element to be formed with the single crystal semiconductor layer 112. In order to form a thin gate insulating layer with excellent step coverage over the surface of the single crystal semiconductor layer 112 which is bonded to the supporting substrate 100, the thickness of the single crystal semiconductor layer 112 is preferably greater than or equal to 50 nm, and may be greater than or equal to 5 nm and less than or equal to 50 nm.

This etching for thinning the single crystal semiconductor layer 112 can be performed by using a dry etching method or a wet etching method. Examples of etching gases that can be used in a dry etching method include chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

Figure 10B:
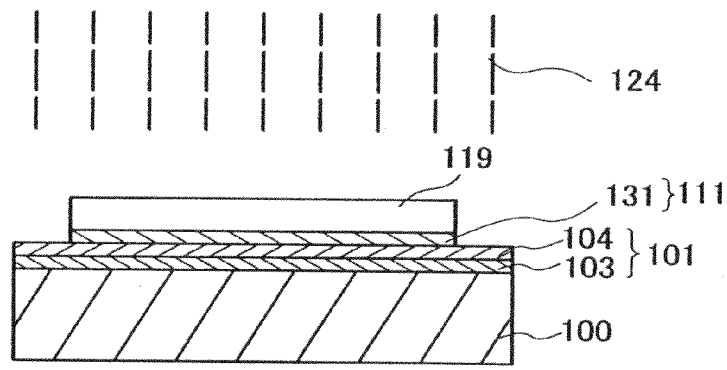

Next, in order to perform repair of a defect or the like of the single crystal semiconductor layer 119, heat treatment is performed at a temperature at which the single crystal semiconductor layer 119 is not melted. FIG. 10B is a cross-sectional view showing heating of the single crystal semiconductor layer 119 by radiation of an electromagnetic wave 124. This heat treatment can be performed in a manner similar to the heat treatment in Embodiment Mode 1 (see FIG. 5B). By the heat treatment at 400° C. or higher, the lifetime of the single crystal semiconductor layer 112 can be improved.

Figure 10C:
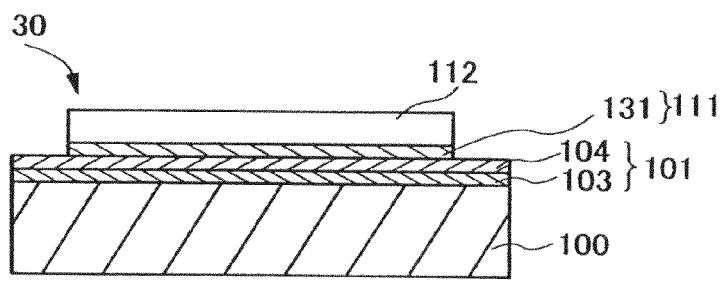

Through the above-described processes, the semiconductor substrate 30 in which the single crystal semiconductor layer 112 is fixed to the supporting substrate 100 with the buffer layer 101 and the buffer layer 111 interposed therebetween is manufactured (see FIG. 10C and FIG. 6).

Further, in the case where hydrogen ions are added to the single crystal semiconductor substrate 110 by an ion doping method using a hydrogen gas as a source gas in order to form the damaged region 115 as shown in FIG. 9B, hydrogen is also included at a high concentration in the single crystal semiconductor layer 117 separated from the single crystal semiconductor substrate 110. The hydrogen concentration of the single crystal semiconductor layer 112 after the heat treatment of FIG. 10B is lower than that of the single crystal semiconductor layer 117. However, by setting a process temperature to be 700° C. or lower, the hydrogen concentration of the single crystal semiconductor layer 112 can be from $5\times10^{18}$ atom/cm$^3$ to $5\times10^{20}$ atom/cm$^3$. The hydrogen concentration of the single crystal semiconductor layer 112 is preferably higher than or equal to $1\times10^{19}$ atom/cm$^3$ and lower than or equal to $1\times10^{20}$ atom/cm$^3$. The hydrogen concentration of the single crystal semiconductor layer 112 is easily varied if the hydrogen concentration becomes high, which may cause reduction of reliability of a semiconductor device.

Because the processes from FIGS. 9A to 9E and FIGS. 10A to 10C can be performed at a temperature of 700° C. or lower, a glass substrate having an upper temperature limit of 700° C. or lower can be used as the supporting substrate 100. Thus, an inexpensive glass substrate can be used, whereby material cost of the semiconductor substrate 30 can be reduced.

The semiconductor substrate 30 of this embodiment mode is different from the semiconductor substrate 10 (see FIG. 1) of Embodiment Mode 1 in that the surface of the supporting substrate 100 is covered with the buffer layer 101. Therefore, an effect of preventing contamination of the single crystal semiconductor layer 112 can be enhanced more than the semiconductor substrate 10 of Embodiment Mode 1 by providing a barrier layer in the buffer layer 101 of the semiconductor substrate 30.

Note that, by using the method of this embodiment mode, a plurality of single crystal semiconductor layers 112 can also be bonded to one piece of the supporting substrate 100. As shown in FIG. 8, the supporting substrate 100 provided with the buffer layer 101 is prepared. The buffer layer 101 preferably includes a layer functioning as a barrier layer. The processes of FIGS. 9A to 9C are repeated, thereby preparing a plurality of single crystal semiconductor substrates 110 each provided with the buffer layer 111 and the damaged region 115. Then, the plurality of single crystal semiconductor substrates 110 each having the structure of FIG. 9C are bonded to the supporting substrate 100 provided with the buffer layer 101. After that, through the processes of FIG. 9E and FIGS. 10A and 10B, it is possible to manufacture a semiconductor substrate 40 to which a plurality of single crystal semiconductor layers 112 are bonded to one supporting substrate, which is the supporting substrate 100, as shown in FIG. 7.

In order to manufacture the semiconductor substrate 40, it is preferable that a glass substrate of 300 mm×300 mm or larger be used as the supporting substrate 100. As a large-area glass substrate, a mother glass substrate which is developed for production of liquid crystal panels is preferred. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like.

By the use of a large-area substrate like a mother glass substrate as the supporting substrate 100, an SOI substrate having a larger area can be obtained. If an SOI substrate having a larger area can be obtained, a number of chips such as ICs or LSIs can be manufactured from one SOI substrate and a larger number of chips can be manufactured from one substrate. Accordingly, productivity can be drastically improved.

Figure 7:
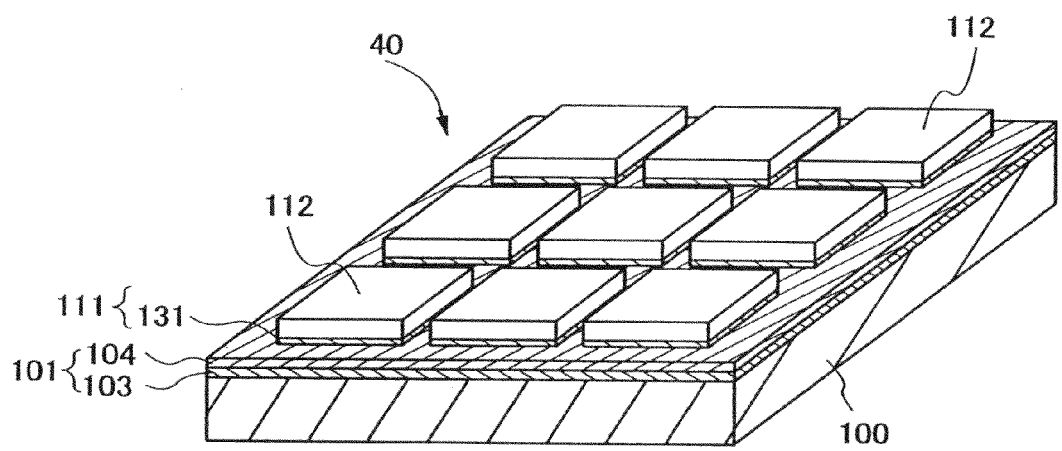
FIG. 7 is an external view showing an example of a structure of a single crystal semiconductor substrate.

As in the semiconductor substrate 40 of FIG. 7, in the case of using a supporting substrate which is easily bendable and brittle like a glass substrate, it is very difficult to employ polishing treatment for planarization of the plurality of single crystal semiconductor layers which are bonded to one supporting substrate. In this embodiment mode, this planarization treatment is performed by irradiation treatment with the laser beam 122. Accordingly, the plurality of single crystal semiconductor layers 117 which are fixed to one supporting substrate 100 can be planarized without applying any force that may damage the supporting substrate 100 and without heating the supporting substrate 100 at a temperature exceeding its strain point. That is, laser beam irradiation treatment is very important treatment in the manufacturing process of the semiconductor substrate 40 to which a plurality of single crystal semiconductor layers are fixed as shown in FIG. 7.

As described in this embodiment mode, the present invention provides a novel, innovate technique with respect to a method for forming a single crystal semiconductor layer with improved lifetime which includes hydrogen at a concentration of $5 \times 10^{18}$ atoms/cm$^3$ or higher over a glass substrate, by a laser treatment process in which recrystallization by melting the single crystal semiconductor layer and planarization are performed and by subsequent heat treatment which does not cause melting. Further, this embodiment mode provides a technique for fixing a single crystal semiconductor layer which includes hydrogen at a concentration of $5 \times 10^{18}$ atoms/cm$^3$ or higher to a glass substrate. By forming a semiconductor device including a transistor with the use of the semiconductor substrate of this embodiment mode, a high-performance, multifunction semiconductor device with can be manufactured.

Note that the method for manufacturing a semiconductor substrate of this embodiment mode can be combined with any of methods for manufacturing a semiconductor substrate in other embodiment modes and methods for manufacturing a semiconductor device in other embodiment modes.

Embodiment Mode 3

This embodiment mode describes a semiconductor substrate in which a single crystal semiconductor layer is fixed to a supporting substrate with a buffer layer interposed therebetween, and a method for manufacturing the semiconductor substrate. This embodiment mode describes a method for fixing to a supporting substrate a plurality of single crystal semiconductor layers which are separated from one semiconductor substrate.

Figure 11A:
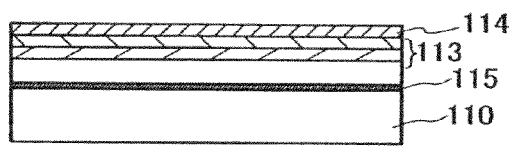
FIGS. 11A to 11E are cross-sectional views and a plan view which show a method for manufacturing a semiconductor substrate.

First, the single crystal semiconductor substrate 110 is subjected to processes shown in FIGS. 4A to 4D of Embodiment Mode 1. FIG. 11A is a cross-sectional view of the single crystal semiconductor substrate 110 after being processed.

Figure 11B:
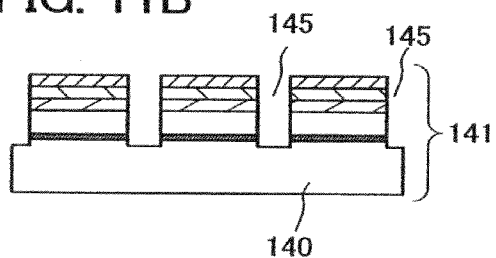

Next, in order to fix single crystal semiconductor layers which are divided into plural pieces to the supporting substrate by cleavage along the damaged regions 115, the buffer layer 111 and the single crystal semiconductor substrate 110 are etched to form a groove 145. FIG. 11B is a cross-sectional view of the single crystal semiconductor substrate 110 provided with the groove 145, and FIG. 11E is a plan view of FIG. 11B. A cross-sectional view taken along cutting line x-x in FIG. 11E corresponds to FIG. 11B.

A single crystal semiconductor substrate 140 corresponds to the single crystal semiconductor substrate 110 provided with the groove 145. The single crystal semiconductor substrate 140 has a plurality of projections. The bottom surface of the groove 145 is set below the level of the damaged regions 115, so that the damaged regions 115 are included in the projections. Thus, the divided single crystal semiconductor layers can be fixed to the supporting substrate. Note that the single crystal semiconductor substrate 140 provided with the buffer layers 111 is referred to as a single crystal semiconductor substrate 141.

Figure 11C:
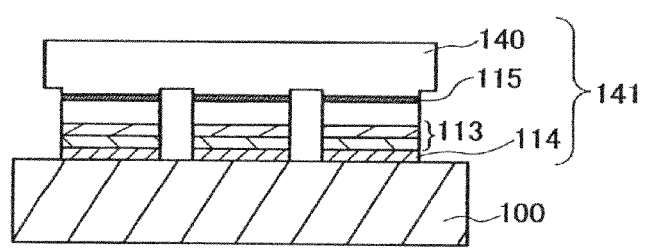

Next, the single crystal semiconductor substrate 141 and the supporting substrate 100 are bonded to each other as shown in FIG. 11C after the single crystal semiconductor substrate 141 and the supporting substrate 100 are cleaned. This process can be carried out in a manner similar to Embodiment Mode 1.

Figure 11D:
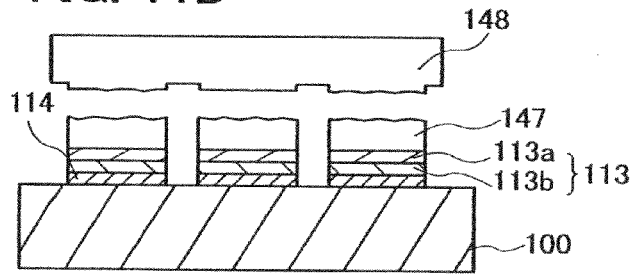
Figure 11E:
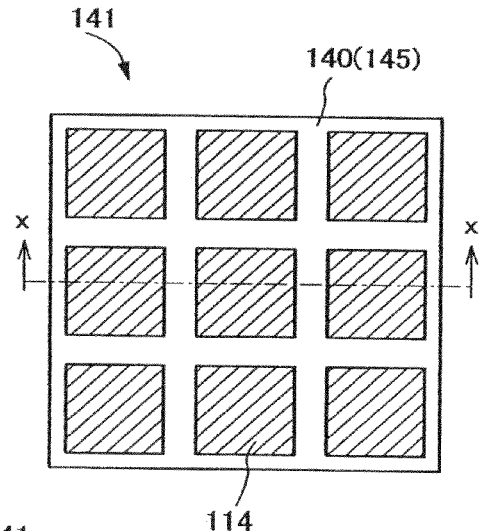

Next, as shown in FIG. 11D, separation is made to occur in the damaged region 115 of the single crystal semiconductor substrate 140 by heat treatment. Since the groove 145 is formed in the single crystal semiconductor substrate 141; a plurality of single crystal semiconductor layers 147 are fixed to the supporting substrate 100 with the buffer layers 111 interposed therebetween. A single crystal semiconductor substrate 148 is the single crystal semiconductor substrate 140 from which the single crystal semiconductor layers 147 has been separated. Heat treatment for cleaving the single crystal semiconductor substrate 140 can be performed in a manner similar to Embodiment Mode 1.

Figure 12A:
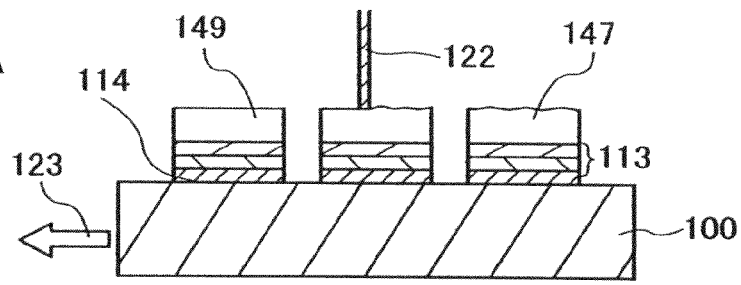
FIGS. 12A to 12D are cross-sectional views and a plan view which show a method for manufacturing a semiconductor substrate.

Next, as shown in FIG. 12A, the single crystal semiconductor layer 147 disposed in close contact with the supporting substrate 100 is irradiated with the laser beam 122. This laser irradiation process can be carried out in a manner similar to the laser irradiation process of Embodiment Mode 1 (see FIG. 5A). The single crystal semiconductor layer 147 is scanned with the laser beam 122 such that the separation surface of the single crystal semiconductor layer 147 is irradiated with the laser beam 122. By the irradiation with the laser beam 122, the single crystal semiconductor layer 147 is melted, thereby being re-single-crystallized and planarized; thus, the single crystal semiconductor layer 149 is formed. Further, in a manner similar to Embodiment Mode 1, the single crystal semiconductor layer 147 can be subjected to etching treatment before a laser beam irradiation process.

Figure 12B:
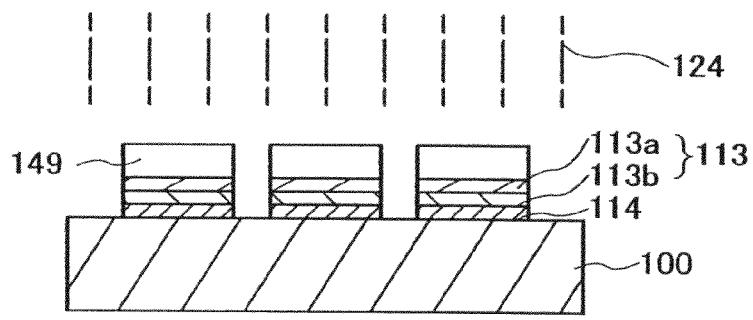

Next, in order to perform repair of a defect or the like of the single crystal semiconductor layer 149, heat treatment is performed at a temperature at which the single crystal semiconductor layer 149 is not melted. FIG. 12B is a cross-sectional view showing heating of the single crystal semiconductor layer 149 by radiation of an electromagnetic wave 124. Note that heating of the single crystal semiconductor layer 149 is not necessarily performed with radiation of the electromagnetic wave 124. This heat treatment can be performed in a manner similar to the heat treatment in Embodiment Mode 1 (see FIG. 5B). By the heat treatment at 400° C. or higher, the lifetime of the single crystal semiconductor layer 142 can be improved. Further, in a manner similar to Embodiment Mode 1, the single crystal semiconductor layer 149 can be subjected to etching treatment before a heat treatment process.

Figure 12C:
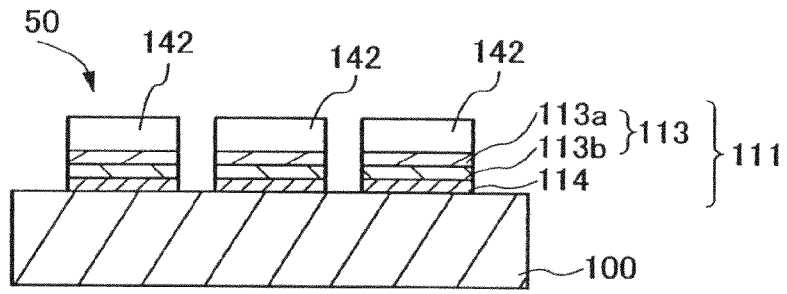
Figure 12D:
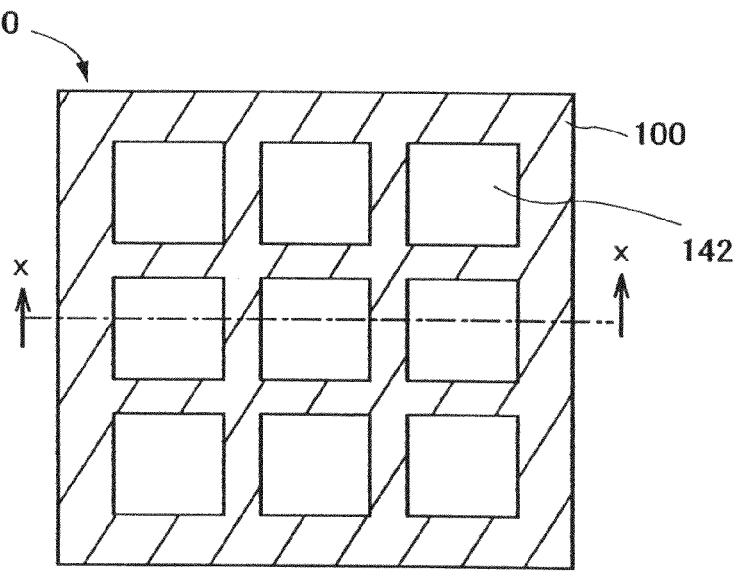

Through the above-described processes, a semiconductor substrate 50 in which the plurality of single crystal semiconductor layers 142 are fixed to the supporting substrate 100 with the buffer layer 111 interposed therebetween is manufactured (see FIG. 12C). FIG. 12D is a plan view of the semiconductor substrate 50 and FIG. 12C is a cross-sectional view taken along cutting line x-x in FIG. 12D.

Further, also in this embodiment mode, in the case where hydrogen ions are added to the single crystal semiconductor substrate 110 by an ion doping method using a hydrogen gas as a source gas in order to form the damaged region 115, hydrogen is also included at a high concentration in the single crystal semiconductor layer 147 separated from the single crystal semiconductor substrate 110. The hydrogen concentration of the single crystal semiconductor layer 142 of FIG. 12C after the heat treatment is lower than that of the single crystal semiconductor layer 147. However, by setting a process temperature to be 700° C. or lower, the hydrogen concentration of the single crystal semiconductor layer 142 can be higher than or equal to $5 \times 10^{18}$ atom/cm$^3$ and lower than or equal to $5 \times 10^{20}$ atom/cm$^3$. The hydrogen concentration of the single crystal semiconductor layer 142 is preferably higher than or equal to $1 \times 10^{19}$ atom/cm$^3$ and lower than or equal to $1 \times 10^{20}$ atom/cm$^3$. The hydrogen concentration of the single crystal semiconductor layer 142 is easily varied if the hydrogen concentration becomes high, which may cause reduction of reliability of a semiconductor device.

As described in this embodiment mode, the present invention provides a novel, innovate technique with respect to a method for forming a single crystal semiconductor layer with improved lifetime over a glass substrate, by a laser treatment process in which recrystallization by melting the single crystal semiconductor layer and planarization are performed and by subsequent heat treatment which does not cause melting. Further, this embodiment mode provides a technique for fixing to a glass substrate a single crystal semiconductor layer which includes hydrogen at a concentration of $5 \times 10^{18}$ atoms/cm$^3$ or higher. By forming a semiconductor device including a transistor with the use of the semiconductor substrate of this embodiment mode, a high-performance, multifunction semiconductor device can be manufactured.

Note that the method for manufacturing a semiconductor substrate of this embodiment mode can be combined with any of methods for manufacturing a semiconductor substrate and methods for manufacturing a semiconductor device which are described in other embodiment modes. For example, also in this embodiment mode, the buffer layer 101 can be formed over the supporting substrate 100 as described in Embodiment Mode 2.

Embodiment Mode 4

This embodiment mode describes a semiconductor substrate in which a single crystal semiconductor layer is fixed to a supporting substrate with a buffer layer interposed therebetween, and a method for manufacturing the semiconductor substrate. This embodiment mode describes a method for fixing a plurality of single crystal semiconductor layers to a supporting substrate by bonding a plurality of single crystal semiconductor substrates to the supporting substrate.

Figure 13A:
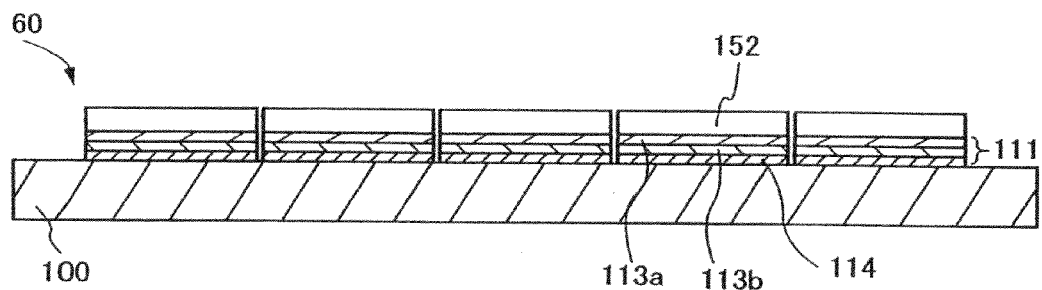
FIGS. 13A and 13B are a cross-sectional view and a plan view, respectively, which show an example of a structure of a semiconductor substrate.
Figure 13B:
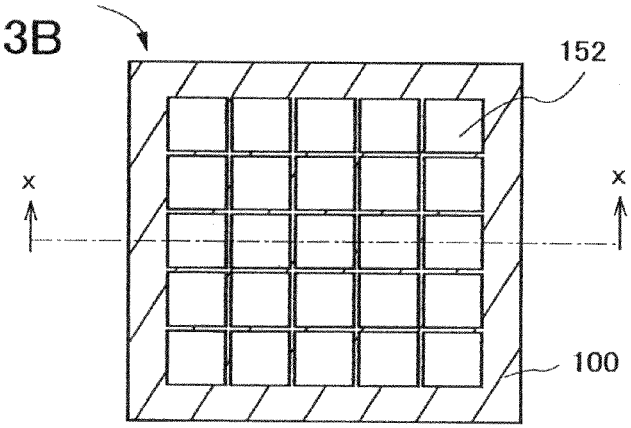

FIG. 13A is a cross-sectional view showing a structural example of a semiconductor substrate, and FIG. 13B is a plan view of FIG. 13A. A cross-sectional view taken along cutting line x-x in FIG. 13B corresponds to FIG. 13A. In this embodiment mode, 25 of single crystal semiconductor layers 152 are fixed to one supporting substrate 100 with the buffer layer 111 interposed therebetween. The single crystal semiconductor layers 152 are layers separated from the single crystal semiconductor substrate 110. Other parts except for that are similar to the semiconductor substrate 10 of Embodiment Mode 1. Hereinafter, a method for manufacturing a semiconductor substrate of this embodiment mode is described with reference FIGS. 14A to 14C, FIGS. 15A to 15D, and FIGS. 16A to 16B.

Figure 14A:
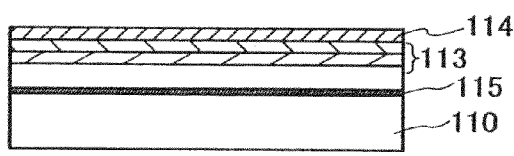
FIGS. 14A to 14C are cross-sectional views and a plan view which show a method for manufacturing a semiconductor substrate.

First, the single crystal semiconductor substrate 110 is subjected to processes shown in FIGS. 4A to 4D of Embodiment Mode 1. FIG. 14A is a cross-sectional view of the single crystal semiconductor substrate 110 after being processed.

Figure 14B:
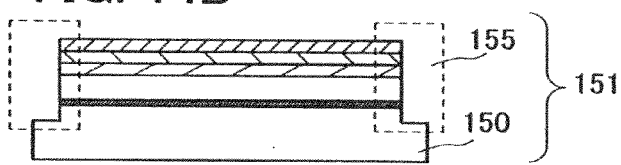
Figure 14C:
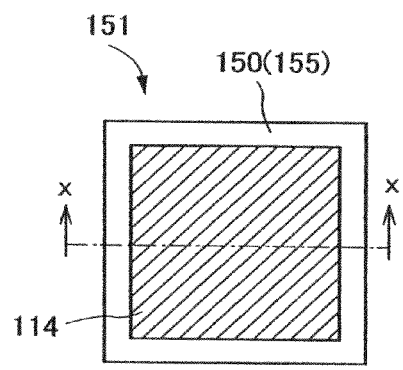

Next, as shown in FIG. 14B, the periphery of the buffer layer 111 and the single crystal semiconductor substrate 110 is etched, so that a step 155 is formed in the periphery. The step 155 is formed so that the plurality of single crystal semiconductor layers 152 which are separated by cleavage along the damaged regions 115 are fixed to the supporting substrate 100. FIG. 14B is a cross-sectional view of the single crystal semiconductor substrate 110 provided with the step 155, and FIG. 14C is a plan view of FIG. 14B. A cross-sectional view taken along cutting line x-x in FIG. 14C corresponds to FIG. 14B.

A single crystal semiconductor substrate 150 corresponds to the single crystal semiconductor substrate 110 provided with the step 155. The single crystal semiconductor substrate 150 has a projection including the damaged region 115. That is, the single crystal semiconductor substrate 110 is etched so that the bottom of the step 155 is below the level of the damaged region 115. Accordingly, in a semiconductor substrate 60, a distance between adjacent single crystal semiconductor layers 152 can be easily reduced. Note that the single crystal semiconductor substrate 150 provided with the buffer layer 111 is referred to as a single crystal semiconductor substrate 151.

Figure 15A:
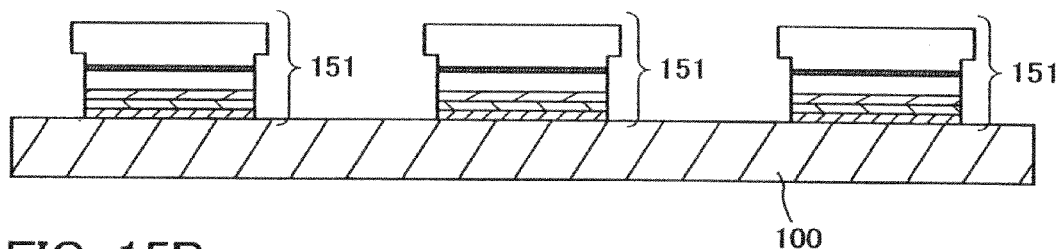
FIGS. 15A to 15D are cross-sectional views showing a method for manufacturing a semiconductor substrate.

Next, a plurality of single crystal semiconductor substrates 151 and the supporting substrate 100 are bonded to each other as shown in FIG. 15A after the single crystal semiconductor substrate 151 and the supporting substrate 100 are cleaned. Although this process can be carried out in a manner similar to Embodiment Mode 1, the process is different from that in Embodiment Mode 1 in that a plurality of single crystal semiconductor substrates 151 are bonded. The plurality of single crystal semiconductor substrates 151 are bonded to the supporting substrate 100 with a space of one single crystal semiconductor substrate left therebetween, so as not to be adjacent to each other.

Figure 15B:
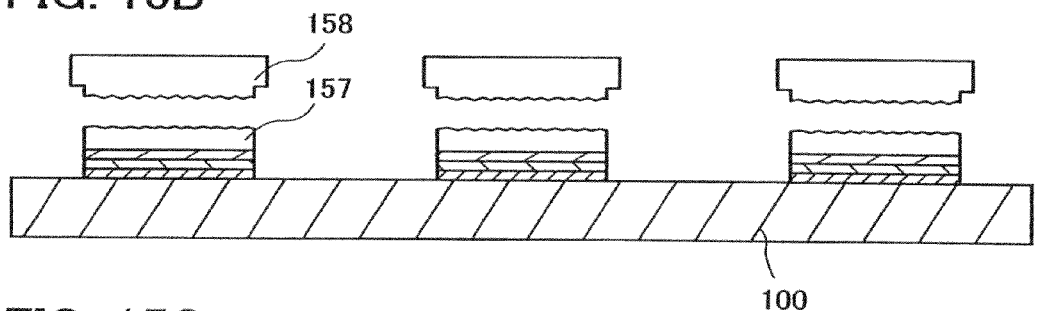

Next, as shown in FIG. 15B, separation is made to occur in the damaged region 115 of the single crystal semiconductor substrate 151 by heat treatment. This heat treatment can be carried out in a manner similar to Embodiment Mode 1. A single crystal semiconductor substrate 158 is the single crystal semiconductor substrate 150 from which the single crystal semiconductor layer 157 has been separated.

Figure 15C:
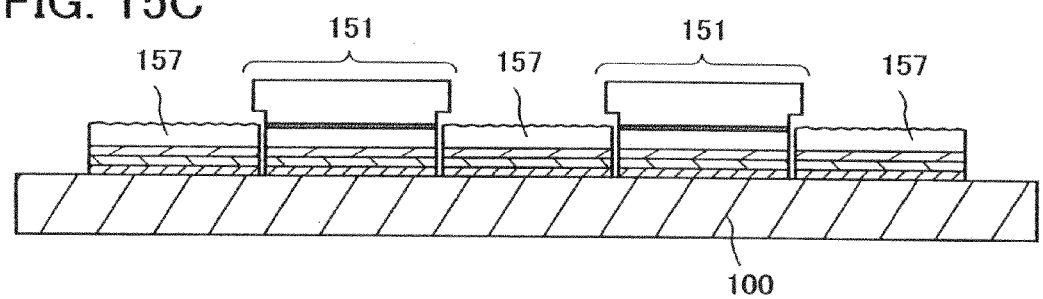
Figure 15D:
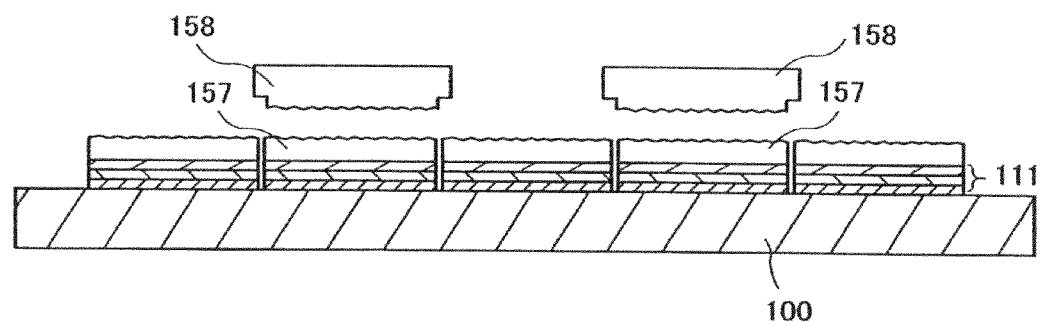

Further, as shown in FIG. 15C, each of a plurality of single crystal semiconductor substrates 151 is bonded to the supporting substrate 100 between the single crystal semiconductor layers 157. Then, as shown in FIG. 15D, separation is made to occur in the damaged region 115 of the single crystal semiconductor substrate 151 by heat treatment. This heat treatment can be performed in a manner similar to Embodiment Mode 1. By performing processes of FIGS. 15A to 15D repeatedly, the plurality of single crystal semiconductor layers 157 can be fixed to one supporting substrate 100 to be adjacent to each other. By forming the step 155 in the periphery of the single crystal semiconductor substrate 151, the single crystal semiconductor substrates 151 can be easily bonded to the supporting substrate 100 without being in contact with the single crystal semiconductor layers 157, as shown in FIG. 15C. Note that in this embodiment mode, it is not necessary to form the step 155 in every single crystal semiconductor substrate 151. For example, the single crystal semiconductor substrate 110 having the structure shown in FIG. 14A, which is not provided with the step 155, can be bonded in FIG. 15A By forming the step 155, a distance between two adjacent single crystal semiconductor layers 157 can be easily reduced.

Figure 16A:
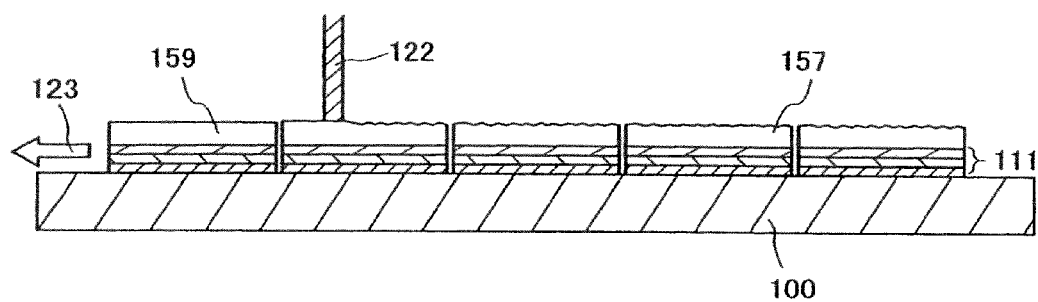
FIGS. 16A and 16B are cross-sectional views showing a method for manufacturing a semiconductor substrate.

Next, as shown in FIG. 16A, the plurality of single crystal semiconductor layer 157 disposed in close contact with the supporting substrate 100 are irradiated with the laser beam 122. This laser irradiation process can be carried out in a manner similar to the laser irradiation process of Embodiment Mode 1 (see FIG. 5A). The single crystal semiconductor layer 157 is scanned with the laser beam 122 such that the separation surface of the single crystal semiconductor layer 157 is irradiated with the laser beam 122. By the irradiation with the laser beam 122, the single crystal semiconductor layer 157 is melted, thereby being recrystallized. Thus, the single crystal semiconductor layer 159 in which crystallinity is improved and the surface is planarized is formed. Further, in a manner similar to Embodiment Mode 1, the single crystal semiconductor layer 157 can be subjected to etching treatment.

Figure 16B:
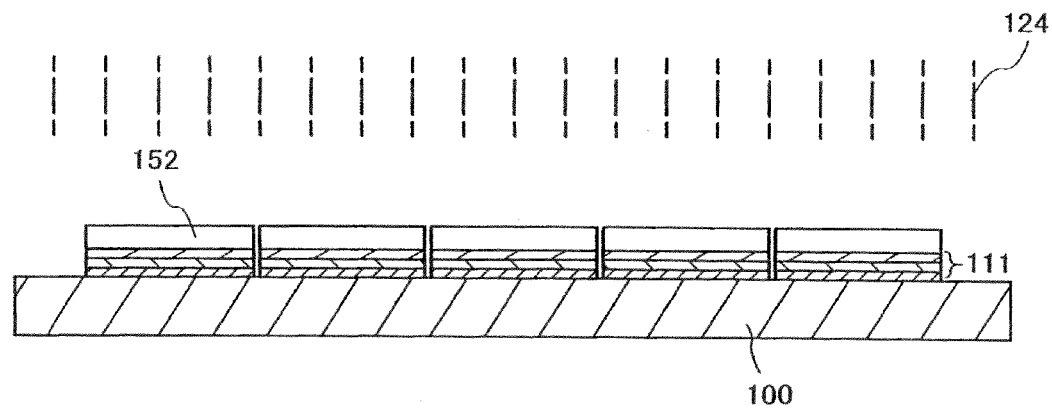

Next, in order to perform repair of a defect or the like of the single crystal semiconductor layer 159, heat treatment is performed at a temperature at which the single crystal semiconductor layer 159 is not melted. FIG. 16B is a cross-sectional view illustrating heating of the single crystal semiconductor layer 159 by radiation of an electromagnetic wave 124. The heat treatment is not necessarily performed with radiation of the electromagnetic wave 124. This heat treatment can be performed in a manner similar to the heat treatment in Embodiment Mode 1 (see FIG. 5B). By the heat treatment at 400° C. or higher, the lifetime of the single crystal semiconductor layer 159 can be improved. Thus, the single crystal semiconductor layer 152 is obtained. Further, in a manner similar to Embodiment Mode 1, the single crystal semiconductor layer 159 can be subjected to etching treatment before the heat treatment process.

Through the above-described processes, the semiconductor substrate 60 in which the plurality of single crystal semiconductor layers 152 are fixed to the supporting substrate 100 with the buffer layer 111 interposed therebetween is manufactured (see FIGS. 13A and 13B).

Further, also in this embodiment mode, hydrogen is included at a high concentration in the single crystal semiconductor layer 157 separated from the single crystal semiconductor substrate 110 in the case where hydrogen ions are added to the single crystal semiconductor substrate 110 by an ion doping method using a hydrogen gas as a source gas in order to form the damaged region 115. The hydrogen concentration of the single crystal semiconductor layer 152 after heat treatment of FIG. 16B is lower than that of the single crystal semiconductor layer 157. However, by setting a process temperature to be 700° C. or lower, hydrogen can be included in the single crystal semiconductor layer 152 at a concentration of higher than or equal to $5\times10^{18}$ atoms/cm$^3$ and lower than or equal to $5\times10^{20}$ atoms/cm$^3$. The hydrogen concentration of the single crystal semiconductor layer 152 is preferably higher than or equal to $1\times10^{19}$ atoms/cm$^3$ and lower than or equal to $1\times10^{20}$ atoms/cm$^3$. The hydrogen concentration of the single crystal semiconductor layer 152 is easily varied if the hydrogen concentration becomes high, which may cause reduction of reliability of a semiconductor device.

As described in this embodiment mode, the present invention provides a novel, innovate technique with respect to a method for forming a single crystal semiconductor layer with improved lifetime which includes hydrogen at a concentration of $5\times10^{18}$ atoms/cm$^3$ or higher over a glass substrate, by a laser treatment process in which recrystallization by melting the single crystal semiconductor layer and planarization are performed and by subsequent heat treatment which does not cause melting. Further, this embodiment mode provides a technique for fixing to a glass substrate a single crystal semiconductor layer which includes hydrogen at a concentration of $5\times10^{18}$ atoms/cm$^3$ or higher. By forming a semiconductor device including a transistor with the use of the semiconductor substrate of this embodiment mode, a high-performance, multifunction semiconductor device can be manufactured.

Note that the method for manufacturing a semiconductor substrate of this embodiment mode can be combined with any of methods for manufacturing a semiconductor substrate in other embodiment modes and methods for manufacturing a semiconductor device in other embodiment modes. For example, also in this embodiment mode, the buffer layer 101 can be formed over the supporting substrate 100 as in Embodiment Mode 2. Alternatively, the buffer layer 111 having a three-layer structure can be formed over the single crystal semiconductor substrate 110 as in Embodiment Mode 1. Further, instead of the single crystal semiconductor substrate 151, the single crystal semiconductor substrate 141 (see FIG. 11B) of Embodiment Mode 3 can be bonded to the supporting substrate 100.

Embodiment Mode 5

A single crystal semiconductor substrate from which a single crystal semiconductor layer is separated can be subjected to reprocessing and reused as the single crystal semiconductor substrate 110. This embodiment mode describes a reprocessing method. This embodiment mode describes a method for reprocessing the single crystal semiconductor substrate 118 used in Embodiment Mode 1.

As shown in FIG. 4E, a portion which has not been bonded to the supporting substrate 100 is left in the periphery of the single crystal semiconductor substrate 118. In this portion, the first insulating layer 113b, the first insulating layer 113a, and the second insulating layer 114 which have not been bonded to the supporting substrate 100 are left.

First, etching treatment which removes the first insulating layer 113b, the first insulating layer 113a, and the second insulating layer 114 is performed. In the case where films of these layers are formed from, for example, silicon oxide, silicon oxynitride, silicon nitride oxide, and the like, the first insulating layer 113b, the first insulating layer 113a, and the second insulating layer 114 can be removed by wet etching treatment using hydrofluoric acid.

Next, the single crystal semiconductor substrate 118 is subjected to etching treatment, thereby removing a projection in the periphery of the single crystal semiconductor substrate 118 and a separation surface of the single crystal semiconductor layer 117. As the etching treatment which is performed on the single crystal semiconductor substrate 118, wet etching treatment is preferable. As etchant, a tetramethylammonium hydroxide (abbreviation: TMAH) solution can be used.

After the single crystal semiconductor substrate 118 is subjected to etching treatment, a surface thereof is polished to planarize the surface. For the polishing treatment, mechanical polishing, chemical mechanical polishing (abbreviation: CMP), or the like can be used. To smooth a surface of the single crystal semiconductor substrate, the surface is desirably polished by approximately greater than or equal to 1 μm and less than or equal to 10 μm in thickness. After the polishing, cleaning with hydrofluoric acid or RCA cleaning is performed because abrasive particles or the like are left over a surface of the single crystal semiconductor substrate.

Through the above-described process, the single crystal semiconductor substrate 118 can be reused as the single crystal semiconductor substrate 110 in Embodiment Modes 1 to 4. By reusing the single crystal semiconductor substrate 118, material cost of the semiconductor substrate 10 can be reduced.

The single crystal semiconductor substrates used in the methods for manufacturing a semiconductor substrate which are described in Embodiment Modes 2 to 4 can be subjected to reprocessing by the method described in this embodiment mode.

Embodiment Mode 6

This embodiment mode describes a semiconductor device using a semiconductor substrate according to the present invention, and a manufacturing method thereof. In this embodiment mode, transistors will be described as an example of the semiconductor device using a semiconductor substrate according to the present invention. By combining a plurality of transistors, a variety of types of semiconductor devices are manufactured. Hereinafter, a method for manufacturing transistors will be described with reference to cross-sectional views shown in FIGS. 17A to 17D, FIGS. 18A to 18C, and FIGS. 19A and 19B. Note that in this embodiment mode, a method in which an n-channel transistor and a p-channel transistor can be manufactured at the same time is described.

First, a semiconductor substrate is prepared. The semiconductor substrate 10 in FIG. 11 is used in this embodiment mode. That is, a semiconductor substrate in which a single crystal semiconductor layer 112 is fixed to a supporting substrate 100 with a buffer layer 111 interposed therebetween is used. Note that a semiconductor substrate for manufacturing transistors is not limited to the structure in FIG. 1, and a semiconductor substrate according to the present invention can be used.

Figure 17A:
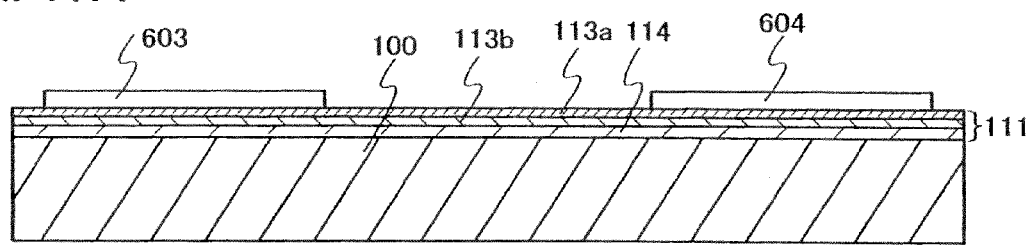
FIGS. 17A to 17D are cross-sectional views illustrating a method for manufacturing a semiconductor device.

As shown in FIG. 17A, the single crystal semiconductor layer 112 over the supporting substrate 100 is processed (patterned) into a desired shape by etching, so that a single crystal semiconductor layer 603 and a single crystal semiconductor layer 604 are formed. A p-channel transistor is formed using the single crystal semiconductor layer 603, and an n-channel transistor is formed using the single crystal semiconductor layer 604. Note that in the case of using the semiconductor substrate 50 in Embodiment Mode 3 (see FIGS. 12C and 12D), the single crystal semiconductor layer 603 and the single crystal semiconductor layer 604 are formed by etching the single crystal semiconductor layer 142.

To control threshold voltages, an element functioning as a donor or an acceptor may be added to the single crystal semiconductor layer 603 and the single crystal semiconductor layer 604. An element functioning as an acceptor is a p-type impurity element such as boron, aluminum, or gallium. An element functioning as a donor is an n-type impurity element such as phosphorus or arsenic. For example, in the case of adding boron as an acceptor element, boron may be added at a concentration of higher than or equal to $5\times10^{16}$ cm$^{-3}$ and lower than or equal to $1\times10^{17}$ cm$^{-3}$. The addition of the impurity element for controlling the threshold voltages may be performed on the single crystal semiconductor layer 112 or on the single crystal semiconductor layer 603 and the single crystal semiconductor layer 604. Alternatively, the addition of the impurity element for controlling the threshold voltages may be performed on the single crystal semiconductor substrate 110. Further alternatively, the addition of the impurity element may be performed on the single crystal semiconductor substrate 110, and then the addition of the impurity element may be further performed on the single crystal semiconductor layer 112. Still alternatively, after the single crystal semiconductor layer 603 and the single crystal semiconductor layer 604 are formed using the single crystal semiconductor layer 112, the addition of the impurity element may be performed on the single crystal semiconductor layer 603 and the single crystal semiconductor layer 604.

For example, taking as an example the case of using a weak p-type single crystal silicon substrate as the single crystal semiconductor substrate 110, an example of a method for adding such an impurity element is described. First, before etching the single crystal semiconductor layer 112, boron is added to the entire single crystal semiconductor layer 112. This addition of boron aims at adjusting the threshold voltage of a p-channel transistor. Using $B_2H_6$ as a dopant gas, boron is added at a concentration of $1\times10^{16}$/cm$^3$ to $1\times10^{17}$/cm$^3$. The concentration of boron is determined in consideration of the activation rate or the like. For example, the concentration of boron can be $6\times10^{16}$/cm$^3$. Next, the single crystal semiconductor layer 112 is etched to form the single crystal semiconductor layer 603 and the single crystal semiconductor layer 604. Then, boron is added to only the single crystal semiconductor layer 604. The second addition of boron aims at adjusting the threshold voltage of an n-channel transistor. Using $B_2H_6$ as a dopant gas, boron is added at a concentration of $1\times10^{16}/cm^3$ to $1\times10^{17}/cm^3$. For example, the concentration of boron can be $6\times10^{16}/cm^3$.

Note that in the case where a substrate having a conductivity type or resistance which is suitable for the threshold voltage of either of the p-channel transistor or the n-channel transistor can be used as the single crystal semiconductor substrate 110, the required number of processes for adding an impurity element for controlling the threshold voltage can be one; at that time, an impurity element for controlling the threshold voltage may be added to one of the single crystal semiconductor layer 603 and the single crystal semiconductor layer 604.

Figure 17B:
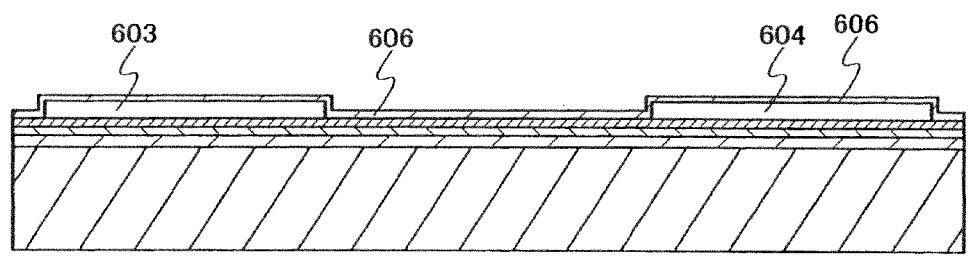

Next, as shown in FIG. 17B, a gate insulating film 606 is formed to cover the single crystal semiconductor layer 603 and the single crystal semiconductor layer 604. The gate insulating film 606 can be formed as a single layer or a stack of two or more layers of a silicon oxide film, a silicon oxynitride film, a silicon nitride oxide film, a silicon nitride film, and/or the like by a PECVD method at a process temperature of 350° C. or lower. In addition, the gate insulating film 606 can be formed with an oxide film or a nitride film obtained by oxidizing or nitriding surfaces of the single crystal semiconductor layer 603 and the single crystal semiconductor layer 604 by high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In this case, when excitation of the plasma is performed by a microwave, high-density plasma with a low electron temperature can be generated. The surfaces of the single crystal semiconductor layers are oxidized or nitrided by oxygen radicals (OH radicals may be included) or nitrogen radicals (NH radicals may be included) which are generated by such high-density plasma, whereby an insulating film is formed to a thickness of 1 nm to 20 nm, preferably 5 nm to 10 nm so as to be in contact with the single crystal semiconductor layers. The insulating film with a thickness of 5 nm to 10 nm can be used as the gate insulating film 606.

Figure 17C:
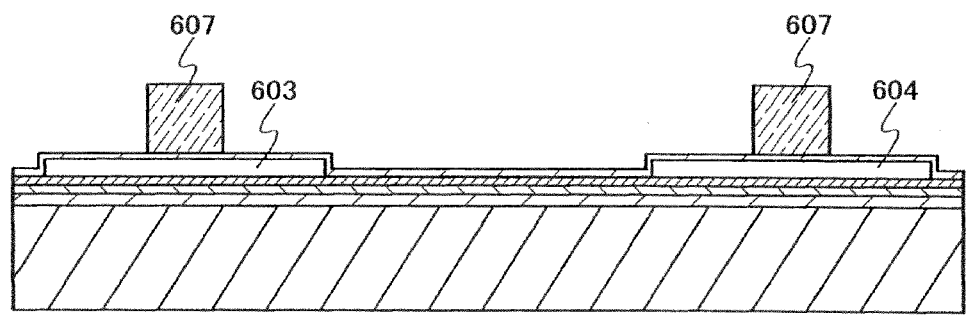

Then, after forming a conductive film over the gate insulating film 606, the conductive film is processed (patterned) into a predetermined shape, thereby forming an electrode 607 over each of the single crystal semiconductor layer 603 and the single crystal semiconductor layer 604 as shown in FIG. 17C. The conductive film can be formed by a CVD method, a sputtering method, or the like. As a material of the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing the above-described metal as a main component or a compound containing the above-described metal can also be used. Further alternatively, a semiconductor such as polycrystalline silicon which is formed by addition of an impurity element imparting a conductivity type, such as phosphorus, by doping, to a semiconductor film may be used as the conductive film.

Note that, although the electrode 607 is formed of a single-layer conductive film in this embodiment mode, this embodiment mode is not limited to this structure. The electrode 607 may be formed of a plurality of conductive films which are stacked. In the case where the electrode 607 has a two-layer structure, as a combination of materials of two conductive films, tantalum nitride or tantalum (Ta) can be used for a first layer, and tungsten (W) can be used for a second layer. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as a combination of the two conductive films, for example, silicon doped with an impurity imparting n-type conductivity and nickel silicide, Si doped with an impurity imparting n-type conductivity and $WSi_x$, or the like can be used.

In the case where the electrode 607 has a three-layer structure in which three or more conductive films are stacked, a stacked-layer structure of a molybdenum film, an aluminum film, and a molybdenum film may be employed.

Note that as masks used for etching for forming the electrodes 607 by etching a conductive film, instead of resist, a silicon oxide film, a silicon nitride oxide film, or the like may be used. Although, in this case, a process of etching the silicon oxide film, the silicon nitride oxide film, or the like is added, the reduction in film thickness of the masks at the time of etching is less than that in the case of using a resist mask; accordingly, the electrodes 607 each having a desired width can be formed. Alternatively, the electrodes 607 may be formed selectively by a droplet discharge method without using the masks.

Note that a droplet discharge method means a method in which droplets containing a predetermined composition are discharged or ejected from fine pores to form a predetermined pattern, and includes an ink-jet method and the like.

As a method for etching the conductive film, an inductively coupled plasma (ICP) etching method may be used after forming the conductive film. The conductive film can be etched into a desired tapered shape by appropriately controlling the etching condition (e.g., the amount of electric power applied to a coiled electrode layer, the amount of electric power applied to an electrode layer on the substrate side, or the electrode temperature on the substrate side). Further, angles and the like of the taper shapes can also be controlled by the shape of the masks. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 17D:
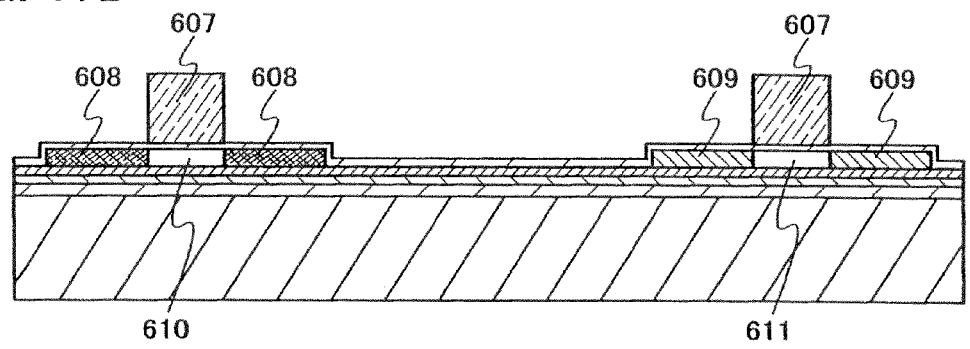

Next, as shown in FIG. 17D, an impurity element imparting one conductivity type is added to the single crystal semiconductor layer 603 and the single crystal semiconductor layer 604 with use of the electrodes 607 as masks. In this embodiment mode, an impurity element imparting p-type conductivity (e.g., boron) is added to the single crystal semiconductor layer 603, and an impurity element imparting n-type conductivity (e.g., phosphorus or arsenic) is added to the single crystal semiconductor layer 604. This process is a process for forming impurity regions to be a source region and a drain region in the single crystal semiconductor layer 603, and for forming impurity regions functioning as high-resistant regions in the single crystal semiconductor layer 604.

Note that when the impurity element imparting p-type conductivity is added to the single crystal semiconductor layer 603, the single crystal semiconductor layer 604 is covered with a mask or the like so that the impurity element imparting p-type conductivity is not added to the single crystal semiconductor layer 604. On the other hand, when the impurity element imparting n-type conductivity is added to the single crystal semiconductor layer 604, the single crystal semiconductor layer 603 is covered with a mask or the like so that the impurity element imparting n-type conductivity is not added to the single crystal semiconductor layer 603. Alternatively, after adding an impurity element imparting one of p-type and n-type conductivity to the single crystal semiconductor layer 603 and the single crystal semiconductor layer 604, an impurity element imparting the other conductivity may be added to one of the single crystal semiconductor layer 603 and the single crystal semiconductor layer 604 selectively at higher concentration than the previously added impurity element. By this adding process of impurity element, p-type high-concentration impurity regions 608 are formed in the single crystal semiconductor layer 603, and n-type low-concentration impurity regions 609 are formed in the single crystal semiconductor layer 604. The regions overlapped with the electrodes 607 in the single crystal semiconductor layer 603 and the single crystal semiconductor layer 604 are a channel formation region 610 and a channel formation region 611.

Figure 18A:
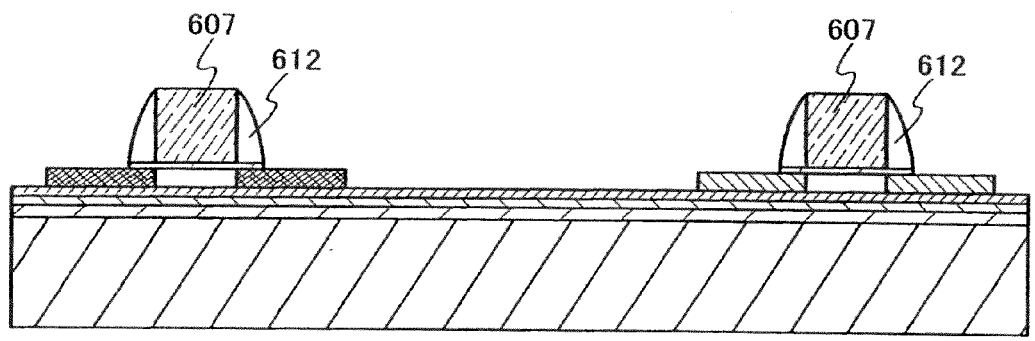
FIGS. 18A to 18C are cross-sectional views illustrating a method for manufacturing a semiconductor device.

Next, as shown in FIG. 18A, sidewalls 612 are formed on side surfaces of the electrodes 607. For example, the sidewalls 612 can be formed in such a manner that an insulating film is newly formed so as to cover the gate insulating films 606 and the electrodes 607, and the newly formed insulating film is partially etched by anisotropic etching in which etching is performed mainly in a perpendicular direction. The newly-formed insulating film is partially etched by the above-described anisotropic etching, whereby the sidewalls 612 are formed on the side surfaces of the electrodes 607. Note that the gate insulating film 606 is also partially etched by this anisotropic etching. The insulating film for forming the sidewalls 612 can be formed as a single layer or a stack of two or more layers of a film including an organic material such as an organic resin or a film of silicon oxide, silicon oxynitride, or silicon nitride oxide by a PECVD method, a sputtering method, or the like. In this embodiment mode, the insulating film is formed of a silicon oxide film with a thickness of 100 nm by a PECVD method. In addition, as an etching gas of the silicon oxide film, a mixed gas of $CHF_3$ and helium can be used. Note that the processes for formation of the sidewalls 612 are not limited to the processes given here.

Figure 18B:
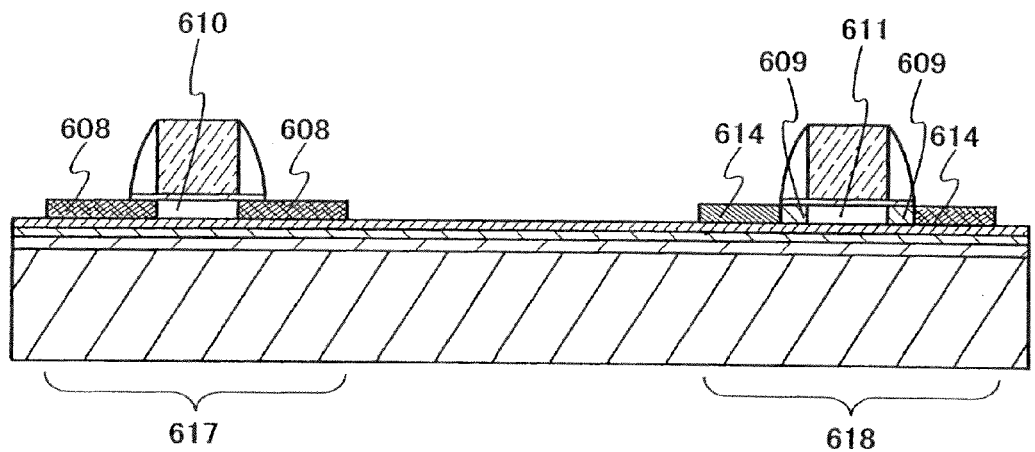

Next, as shown in FIG. 18B, an impurity element imparting n-type conductivity is added to the single crystal semiconductor layer 604 by using the electrode 607 and the sidewalls 612 as masks. This process is a process for forming impurity regions functioning as a source region and a drain region in the single crystal semiconductor layer 604. In this process, the impurity element imparting n-type conductivity is added to the single crystal semiconductor layer 604 with the single crystal semiconductor layer 603 covered with a mask or the like.

In the above-described addition of the impurity element, the electrode 607 and the sidewalls 612 function as masks; accordingly, a pair of n-type high-concentration impurity regions 614 is formed in the single crystal semiconductor layer 604 in a self-alignment manner. Then, the mask covering the single crystal semiconductor layer 603 is removed, and then heat treatment is performed to activate the impurity element imparting p-type conductivity which has been added to the single crystal semiconductor layer 603 and the impurity element imparting n-type conductivity which has been added to the single crystal semiconductor layer 604. Through the sequence of the processes shown in FIGS. 17A to 17D and FIGS. 18A and 18B, a p-channel transistor 617 and an n-channel transistor 618 are formed.

Note that in order to reduce the resistance of the source region and drain region, a silicide layer may be formed in the high-concentration impurity regions 608 in the single crystal semiconductor layer 603 and the high-concentration impurity regions 614 in the single crystal semiconductor layer 604. The formation of a silicide can be performed by placing metal in contact with the single crystal semiconductor layer 603 and the single crystal semiconductor layer 604 and causing reaction between the metal and silicon in the semiconductor layers through heat treatment to form a silicide compound. As the metal, cobalt or nickel is preferable, or the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the single crystal semiconductor layer 603 and the single crystal semiconductor layer 604 are thin, the silicide reaction may proceed to the bottom of the single crystal semiconductor layer 603 and the single crystal semiconductor layer 604 in these regions. As the heat treatment for forming a silicide, a resistance heating furnace, an RTA apparatus, a microwave heating apparatus, or a laser irradiation apparatus can be used.

Figure 18C:
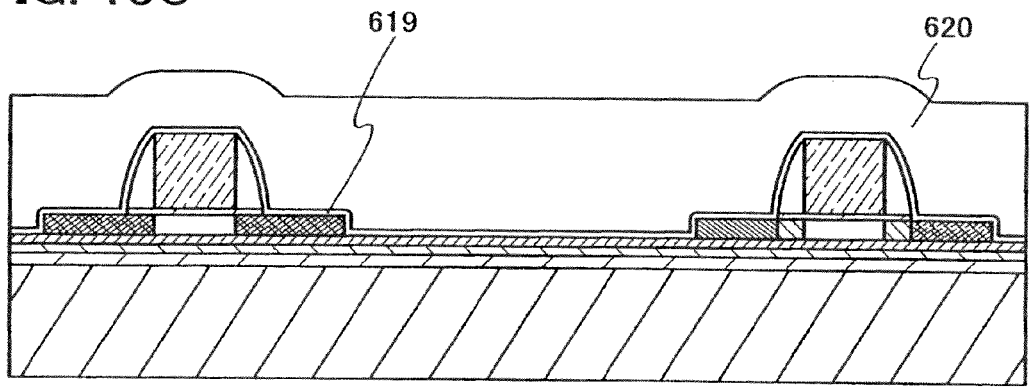

Next, as shown in FIG. 18C, an insulating film 619 is formed to cover the p-channel transistor 617 and the n-channel transistor 618. As the insulating film 619, an insulating film containing hydrogen is formed. In this embodiment mode, a silicon nitride oxide film with a thickness of about 600 nm is formed by a PECVD method using monosilane, ammonia, and $N_2O$ as a source gas. The insulating film 619 is made to contain hydrogen because hydrogen can be diffused from the insulating film 619 so that dangling bonds in the single crystal semiconductor layer 603 and the single crystal semiconductor layer 604 can be terminated. The formation of the insulating film 619 can prevent impurities such as alkali metal and alkaline-earth metal from penetrating the p-channel transistor 617 and the n-channel transistor 618. Specifically, it is preferable to use silicon nitride, silicon nitride oxide, aluminum nitride, aluminum oxide, silicon oxide, or the like for the insulating film 619.

Next, an insulating film 620 is formed over the insulating film 619 so as to cover the p-channel transistor 617 and the n-channel transistor 618. An organic material having heat resistance, such as polyimide, acrylic, benzocyclobutene, polyamide, or epoxy can be used for the insulating film 620. In addition to such organic materials, it is also possible to use a low-dielectric constant material (a low-k material), a siloxane-based resin, silicon oxide, silicon nitride, silicon nitride oxide, PSG (phosphosilicate glass), BPSG (borophosphosilicate glass), alumina, or the like. A siloxane-based resin may include as a substituent at least one of fluorine, an alkyl group, and an aryl group, as well as hydrogen. Note that the insulating film 620 may be formed by stacking plural insulating films formed of these materials. The insulating film 620 may have its surface planarized by a CMP method or the like.

Note that the siloxane-based resin corresponds to a resin including a Si—O—Si bond formed using a siloxane-based material as a starting material. The siloxane-based resin may include as a substituent at least one of fluorine, an alkyl group, and aromatic hydrocarbon, as well as hydrogen.

For the formation of the insulating film 620, the following method can be used depending on the material of the insulating film 620: a CVD method, a sputtering method, an SOG method, a spin coating method, a dip coating method, a spray coating method, a droplet discharge method (e.g., an ink-jet method, screen printing, or offset printing), a doctor knife, a roll coater, a curtain coater, a knife coater, or the like.

Next, heat treatment at about 400° C. to 450° C. (e.g., 410° C.) is performed in a nitrogen atmosphere for about 1 hour, so that hydrogen is made to diffuse from the insulating film 619 and dangling bonds in the single crystal semiconductor layer 603 and the single crystal semiconductor layer 604 are terminated with hydrogen. Note that since the single crystal semiconductor layer 112 has a much lower defect density than a polycrystalline silicon film which is formed by crystallizing an amorphous silicon film, this termination treatment with hydrogen can be performed in short time.

Figure 19:
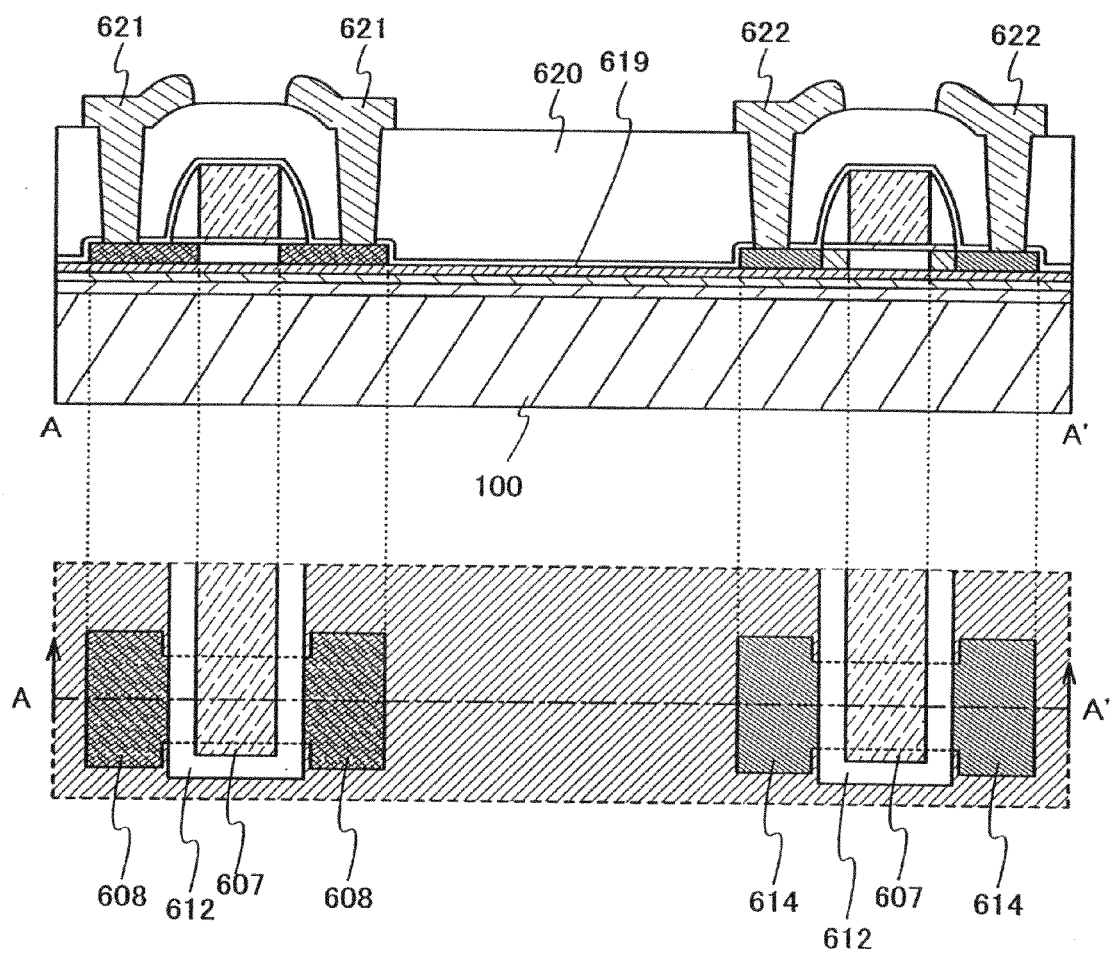
FIG. 19 is a cross-sectional view illustrating a method for manufacturing a semiconductor device.

Next, as shown in FIG. 19, contact holes are formed in the insulating film 619 and the insulating film 620 so that the single crystal semiconductor layer 603 and the single crystal semiconductor layer 604 are partially exposed. The formation of the contact holes can be performed by a dry etching method using a mixed gas of $CHF_3$ and He; however, the present invention is not limited to this. Then, conductive films 621 and conductive films 622 are formed to be in contact with the single crystal semiconductor layer 603 and the single crystal semiconductor layer 604, respectively through the contact holes. The conductive films 621 are connected to the high-concentration impurity regions 608 of the p-channel transistor 617. The conductive films 622 are connected to the high-concentration impurity regions 614 of the n-channel transistor 618.

The conductive films 621 and the conductive films 622 can be formed by a CVD method, a sputtering method, or the like. Specifically, the following can be used for the conductive films 621 and the conductive films 622: aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-described metal as a main component or a compound containing the above-described metal can also be used. The conductive films 621 and the conductive films 622 can be formed of a single layer or a stack of plural layers of a film formed of the above-described metal.

As an example of an alloy containing aluminum as its main component, an alloy containing aluminum as its main component and also containing nickel is given. Further, an alloy which contains aluminum as its main component and contains nickel and one or both of carbon and silicon can also be given as an example. Since aluminum and aluminum silicon have low resistance and are inexpensive, aluminum and aluminum silicon are suitable as materials for forming the conductive films 621 and the conductive films 622. In particular, when the shape of an aluminum silicon (Al—Si) film is processed by etching, generation of hillocks in resist baking for forming an etching mask can be prevented more than in the case where an aluminum film is used. Instead of silicon (Si), Cu may be mixed into an aluminum film at about 0.5%.

For example, a stacked-layer structure including a barrier film, an aluminum silicon (Al—Si) film, and a barrier film or a stacked-layer structure including a barrier film, an aluminum silicon (Al—Si) film, a titanium nitride film, and a barrier film may be used for the conductive films 621 and the conductive films 622. Note that the barrier film refers to a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be prevented more effectively. Moreover, when the barrier film is formed using titanium that is a highly reducible element, even if a thin oxide film is formed over the single crystal semiconductor layer 603 and the single crystal semiconductor layer 604, the oxide film is reduced by the titanium contained in the barrier film, whereby preferable contact between the conductive films 621 and 622 and the semiconductor layers 603 and 604 can be obtained. Further, it is also possible to stack a plurality of barrier films. In that case, for example, a five-layer structure in which Ti, titanium nitride, Al—Si, Ti, and titanium nitride are stacked from the lowest layer can be used for the conductive films 621 and the conductive films 622.

For the conductive films 621 and the conductive films 622, tungsten silicide formed by a chemical vapor deposition method using a $WF_6$ gas and a $SiH_4$ gas may be used. Alternatively, tungsten formed by hydrogen reduction of $WF_6$ may be used for the conductive films 621 and the conductive films 622.

In FIG. 19, a top view of the p-channel transistor 617 and the n-channel transistor 618 and a cross-sectional view taken along a line A-A' of the top view are illustrated. Note that the conductive films 621, the conductive films 622, the insulating film 619, and the insulating film 620 are omitted in the top view of FIG. 19.

Although the case where each of the p-channel transistor 617 and the n-channel transistor 618 has one electrode 607 functioning as a gate is described in this embodiment mode, the present invention is not limited to this structure. The transistor manufactured in the present invention may have a multi-gate structure in which a plurality of electrodes functioning as gates are included and electrically connected to one another. Moreover, the transistor may have a gate planar structure.

Note that since a semiconductor layer included in the semiconductor substrate of the present invention is obtained by slicing a single crystal semiconductor substrate, its crystal orientation does not vary. Consequently, variation in electric characteristics such as threshold voltage and mobility among a plurality of transistors manufactured using a semiconductor substrate of the present invention can be made to be small. Further, the single crystal semiconductor layer has almost no crystal grain boundaries; therefore, a leakage current of a transistor due to a crystal grain boundary can be suppressed, and further, power saving of a semiconductor device can be realized. Accordingly, a highly reliable semiconductor device can be manufactured.

In the case of manufacturing a transistor from a polycrystalline semiconductor film obtained by laser crystallization, it has been necessary to decide a layout of the semiconductor film of the transistor taking into consideration a scanning direction of laser beam, in order to obtain high mobility. However, there is no such need for the semiconductor substrate of the present invention, and there are little restrictions in designing a semiconductor device.

Embodiment Mode 7

This embodiment mode describes a semiconductor device using a semiconductor substrate according to the present invention, and a manufacturing method thereof. In this embodiment mode, transistors will be described as an example of the semiconductor device using a semiconductor substrate according to the present invention. By combining a plurality of transistors, a variety of types of semiconductor devices are manufactured. Hereinafter, a method for manufacturing transistors will be described with reference to cross-sectional views shown in FIGS. 20A to 20E, FIGS. 21A to 21C, and FIGS. 22A and 22B. Note that in this embodiment mode, a method in which an n-channel transistor and a p-channel transistor are manufactured at the same time is described.

Figure 20A:
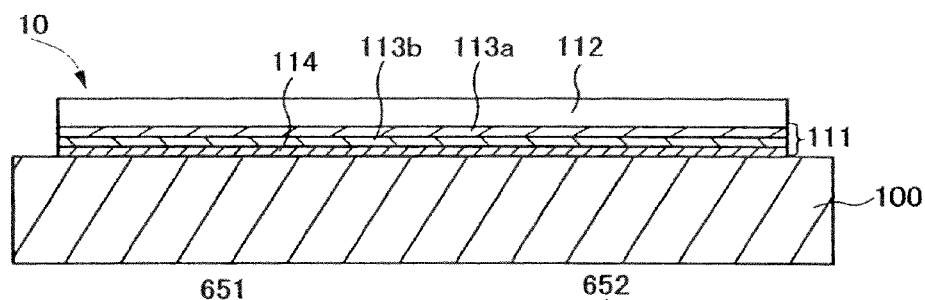
FIGS. 20A to 20E are cross-sectional views illustrating a method for manufacturing a semiconductor device.

First, a semiconductor substrate is prepared as shown in FIG. 20A. The semiconductor substrate 10 in FIG. 1 is used in this embodiment mode. That is, a semiconductor substrate in which a single crystal semiconductor layer 112 is fixed to a supporting substrate 100 with a buffer layer 111 interposed therebetween is used. Note that a semiconductor substrate for manufacturing transistors is not limited to the structure in FIG. 1, and a semiconductor substrate according to the present invention can be used.

Note that a p-type impurity element (an impurity element functioning as an acceptor) such as boron, aluminum, or gallium or an n-type impurity element (an impurity element functioning as a donor) such as phosphorus or arsenic is preferably added to the single crystal semiconductor layer 112 in accordance with a formation region of an n-channel field-effect transistor or a p-channel field-effect transistor. In other words, a p-type impurity element is added to a formation region of an n-channel field-effect transistor and an n-type impurity element is added to a formation region of a p-channel field-effect transistor, whereby so-called well regions are formed. The dose of impurity ions is preferably $1\times10^{12}$ ions/cm$^2$ to $1\times10^{14}$ ions/cm$^2$. Furthermore, when threshold voltage of the field effect transistor is controlled, a p-type impurity element or an n-type impurity element may be added to these well regions.

Figure 20B:
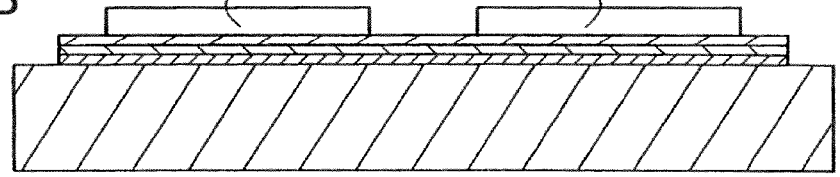

Then, as shown in FIG. 20B, the single crystal semiconductor layer 112 is etched to form a single crystal semiconductor layer 651 and a single crystal semiconductor layer 652 which are separated from each other in island shapes to correspond to the arrangement of semiconductor elements. In this embodiment mode, an n-channel transistor is manufactured using the single crystal semiconductor layer 651, and a p-channel transistor is manufactured using the single crystal semiconductor layer 652. Note that in the case of using the semiconductor substrate 50 in Embodiment Mode 3 (see FIGS. 12B and 12C), the single crystal semiconductor layer 651 and the single crystal semiconductor layer 652 are formed by etching the single crystal semiconductor layer 142.

Figure 20C:
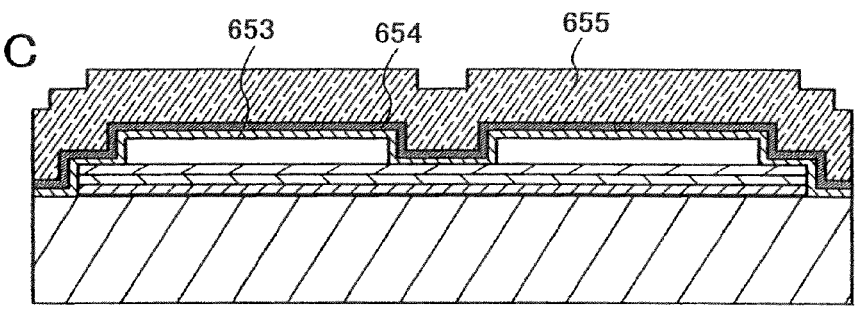

Next, as shown in FIG. 20C, a gate insulating layer 653, a conductive layer 654, and a conductive layer 655 which form a gate electrode are sequentially formed over the single crystal semiconductor layer 651 and the single crystal semiconductor layer 652.

The gate insulating layer 653 is formed as a single-layer structure or a stacked-layer structure using an insulating layer such as a silicon oxide layer, a silicon oxynitride layer, a silicon nitride layer, or a silicon nitride oxide layer which are formed by a CVD method, a sputtering method, an ALE method, or the like.

Alternatively, the gate insulating layer 653 may be formed in such a manner that plasma treatment is performed on the single crystal semiconductor layer 651 and the single crystal semiconductor layer 652 to oxidize or nitride surfaces thereof. Plasma treatment in this case also includes plasma treatment with plasma excited using a microwave (a typical frequency is 2.45 GHz). For example, treatment with plasma that is excited by a microwave and has an electron density of greater than or equal to $1\times10^{11}$/cm$^3$ and less than or equal to $1\times10^{13}$/cm$^3$ and an electron temperature of higher than or equal to 0.5 eV and lower than or equal to 1.5 eV is also included. Oxidation treatment or nitridation treatment of the surface of the single crystal semiconductor layer with such plasma treatment makes it possible to form a thin and dense film. In addition, since the surface of the single crystal semiconductor layer is directly oxidized, a film which has good interface characteristics can be obtained. In addition, the gate insulating layer 653 may be formed by conducting plasma treatment using a microwave to a film formed by a CVD method, a sputtering method, or an ALE method.

Note that since the gate insulating layer 653 forms the interface with the single crystal semiconductor layer 651 and the single crystal semiconductor layer 652, a layer included in the gate insulating layer 653 which is in contact with the single crystal semiconductor layer 651 and the single crystal semiconductor layer 652 is preferably formed so that a silicon oxide layer or a silicon oxynitride layer is located at the interface. This is because, if a film in which the amount of nitrogen is higher than that of oxygen such as a silicon nitride layer or a silicon nitride oxide layer is formed, problems of interface characteristics might be caused due to formation of trap levels.

The conductive layer which forms the gate electrode is formed as a single-layer film or a stacked-layer film using a film including an element selected from tantalum, tantalum nitride, tungsten, titanium, molybdenum, aluminum, copper, chromium, niobium, or the like; an alloy material or a compound material containing the element as its main component; or a semiconductor material typified by polycrystalline silicon doped with an impurity element such as phosphorus, by a CVD method or a sputtering method. When the conductive layer is formed as a stacked-layer film, it can be formed using different conductive materials or can be formed using the same conductive material. In this embodiment mode, an example is described in which the conductive layer of the gate electrode is formed with a two-layer structure including the conductive layer 654 and the conductive layer 655.

If the conductive layer for forming the gate electrode has a two-layer structure of the conductive layer 654 and the conductive layer 655, a stacked-layer film of a tantalum nitride layer and a tungsten layer, a tungsten nitride layer and a tungsten layer, or a molybdenum nitride layer and a molybdenum layer can be formed, for example. Note that a stacked-layer film of a tantalum nitride layer and a tungsten layer is preferable because high selectivity of the tantalum nitride layer to the tungsten layer can be easily obtained. Note that, in the two-layer film which is exemplified, the first mentioned film is preferably formed on the gate insulating layer 653. In this embodiment mode, the first conductive layer 654 is formed with a thickness of from greater than or equal to 20 nm and less than or equal to 100 nm. The conductive layer 655 is formed with a thickness of greater than or equal to 100 nm and less than or equal to 400 nm. Note that the gate electrode can also have a stacked-layer structure of three or more layers; in that case, it is preferable to employ a stacked-layer structure of a molybdenum layer, an aluminum layer, and a molybdenum layer.

Next, a resist mask 656 and a resist mask 657 are selectively formed over the conductive layer 655. Then, first etching treatment and second etching treatment are performed using the resist mask 656 and the resist mask 657.

Figure 20D:
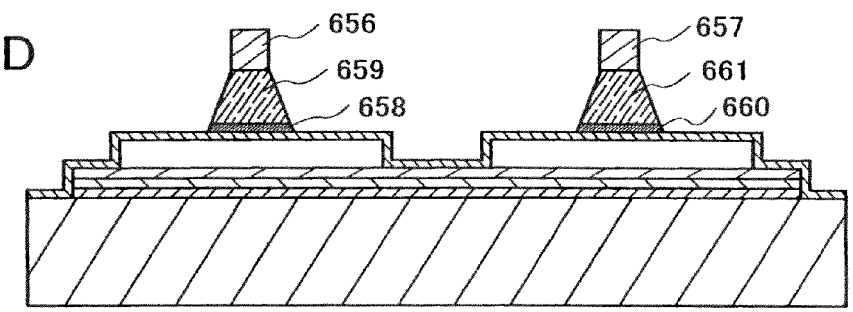

First, by the first etching treatment using the resist mask 656 and the resist mask 657, the conductive layer 654 and the conductive layer 655 are selectively etched, and thus a conductive layer 658 and a conductive layer 659 are formed over the single crystal semiconductor layer 651 and a conductive layer 660 and a conductive layer 661 are formed over the single crystal semiconductor layer 652 (see FIG. 20D).

Figure 20E:
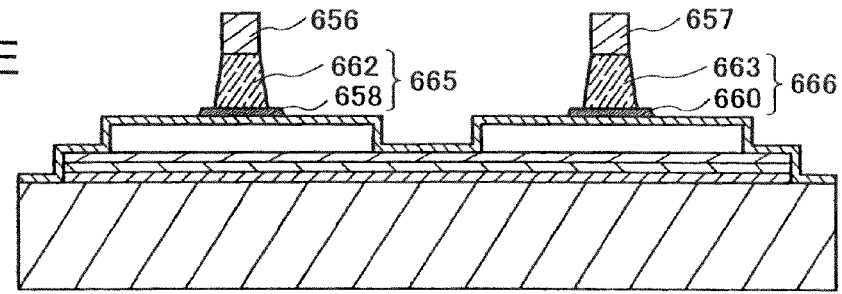
Figure 21A:
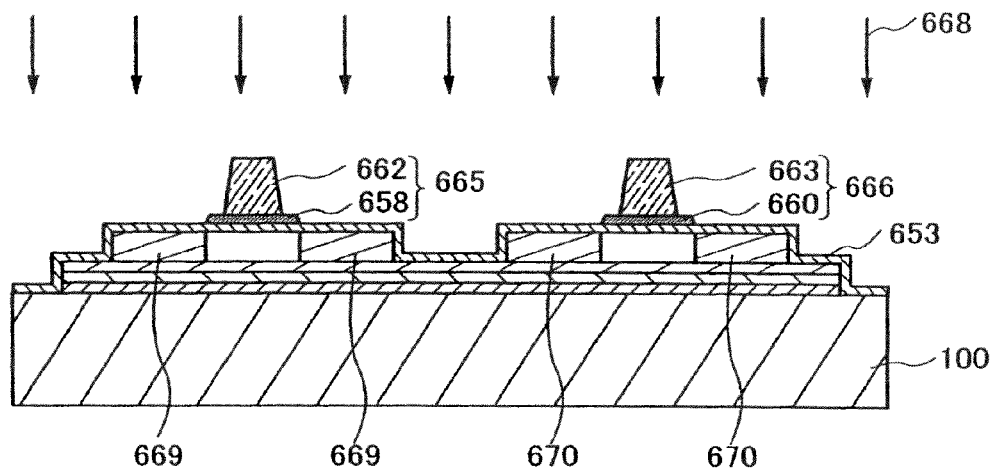
FIGS. 21A to 21C are cross-sectional views illustrating a method for manufacturing a semiconductor device.
Figure 21B:
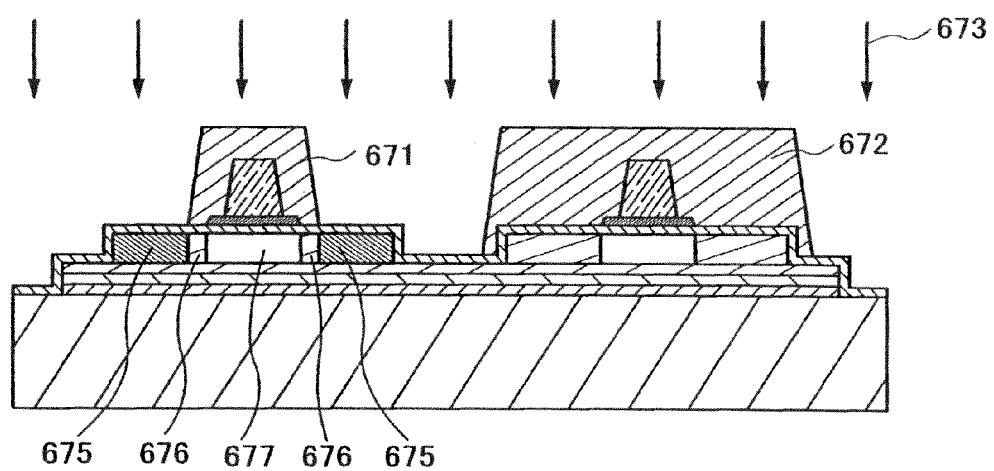
Figure 21C:
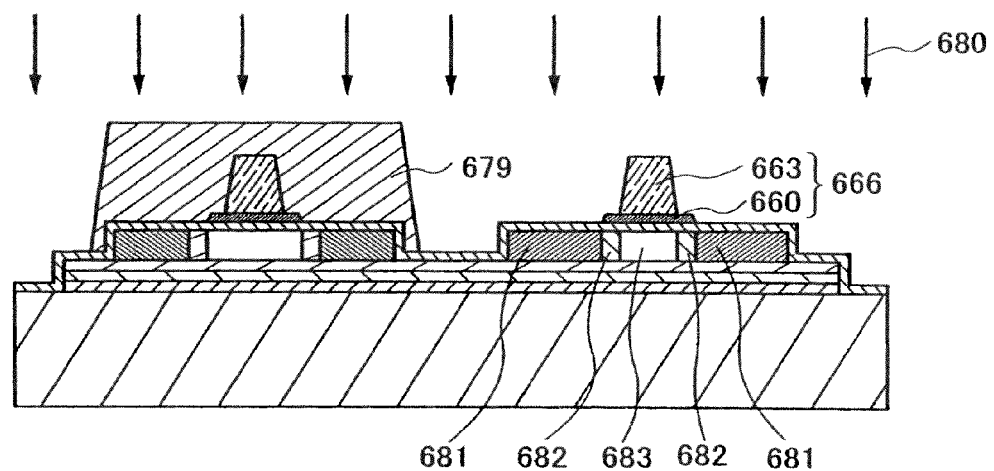

Next, by the second etching treatment using the resist mask 656 and the resist mask 657, end portions of the conductive layer 659 and the conductive layer 661 are etched, and thus a conductive layer 662 and a conductive layer 663 are formed (see FIG. 20E). Note that the conductive layers 662 and 663 are formed so as to have smaller widths (lengths parallel to a direction in which carriers flow through channel formation regions (a direction in which a source region and a drain region are connected)) than the conductive layers 658 and 660. In this manner, the gate electrode 665 having a two-layer structure including the conductive layer 658 and the conductive layer 662 and the gate electrode 666 having a two-layer structure including the conductive layer 660 and the conductive layer 663 are formed.

Although an etching method employed for the first etching treatment and the second etching treatment may be selected as appropriate, a dry etching apparatus using a high-density plasma source of electron cyclotron resonance (ECR) or inductive coupled plasma (ICP) may be used in order to increase the etching rate. With appropriate control of the etching condition of the first etching treatment and the second etching treatment, the first conductive layers 658 and 660 and the conductive layers 662 and 663 can each have a desired tapered shape. After the desired gate electrodes 665 and 666 are formed, the resist masks 656 and 657 may be removed.

Next, an impurity element 668 which functions as an acceptor or a donor is added to the single crystal semiconductor layer 651 and the single crystal semiconductor layer 652 using the gate electrode 665 and the gate electrode 666 as masks. In the single crystal semiconductor layer 651, a pair of impurity regions 669 is formed in a self-alignment manner using the conductive layer 658 and the conductive layer 662 as masks. As well, in the single crystal semiconductor layer 652, a pair of impurity regions 670 is formed in a self-alignment manner using the conductive layer 660 and the conductive layer 663 as masks (see FIG. 21A).

As the impurity element 668, a p-type impurity element such as boron, aluminum, or gallium, or an n-type impurity element such as phosphorus or arsenic is added. Here, in order to form a high-resistant region of the n-channel transistor, phosphorus, which is an n-type impurity element, is added as an impurity element 668. In addition, phosphorus is added such that it is included in the impurity region 669 at a concentration of about $1\times10^{17}$ atoms/cm$^3$ to $5\times10^{18}$ atoms/cm$^3$.

Then, in order to form impurity regions functioning as a source region and a drain region of the n-channel transistor, a resist mask 671 is formed to partially cover the single crystal semiconductor layer 651 and a resist mask 672 is selectively formed to cover the single crystal semiconductor layer 652. Then, a pair of impurity regions 675 is formed in the single crystal semiconductor layer 651 by addition of an impurity element 673 which functions as an acceptor or a donor to the single crystal semiconductor layer 651 using the resist mask 671 as a mask (see FIG. 21B).

Here, as the impurity element 673, phosphorus, which is an n-type impurity element, is added to the single crystal semiconductor layer 651, and the concentration of added phosphorus is $5\times10^{19}$ atoms/cm$^3$ to $5\times10^{20}$ atoms/cm$^3$. The impurity regions 675 each function as a source region or a drain region. The impurity regions 675 are formed in regions not overlapping with the conductive layer 658 and the conductive layer 662.

In addition, in the single crystal semiconductor layer 651, the impurity regions 676 are regions of the impurity regions 669 which are not doped with the impurity element 673. The concentration of the impurity element included in the impurity region 676 is lower than that in the impurity region 675, and the impurity region 676 functions as a high-resistant region or an LDD region. In the single crystal semiconductor layer 651, a channel formation region 677 overlapping with the conductive layer 658 and the conductive layer 662 is formed.

Note that an LDD region means a region to which an impurity element is added at a low concentration and which is formed between a channel formation region and a source or a drain region that is formed by adding the impurity element at a high concentration. When an LDD region is provided, there is an advantageous effect in that an electric field in the vicinity of a drain region is reduced to prevent deterioration due to hot carrier injection. Further, a structure in which an LDD region overlaps with a gate electrode with a gate insulating layer interposed therebetween (also called a "gate-drain overlapped LDD (GOLD) structure") may also be employed in order to prevent decrease of an on-current value due to hot carrier.

Next, after the resist mask 671 and the resist mask 672 are removed, a resist mask 679 is formed to cover the single crystal semiconductor layer 651 so that a source region and a drain region of a p-channel transistor can be formed. Then, an impurity element 680 is added using the resist mask 679, the conductive layer 660, and the conductive layer 663 as masks, so that a pair of impurity regions 681, a pair of impurity regions 682, and a channel formation region 683 are formed in the single crystal semiconductor layer 652 (see FIG. 21C).

As the impurity element 680, a p-type impurity element such as boron, aluminum, or gallium is used. Here, boron which is a p-type impurity element is added so as to be contained at a concentration of about $1\times10^{20}$ atoms/cm$^3$ to $5\times10^{21}$ atoms/cm$^3$.

In the single crystal semiconductor layer 652, the impurity region 681 is formed in a region not overlapping with the conductive layer 660 and the conductive layer 663, and functions as a source region or a drain region. Here, boron that is a p-type impurity element is added so as to be contained in the impurity regions 681 at a concentration of about $1\times10^{20}$ atoms/cm$^3$ to $5\times10^{21}$ atoms/cm$^3$.

The impurity region 682 is formed in a region overlapping with the conductive layer 660 but not overlapping with the conductive layer 663, and the impurity region 682 is formed by the impurity element 680 which has passed through the conductive layer 660 and has been introduced to the single crystal semiconductor layer 652. The impurity region 670 has n-type conductivity, and thus an impurity element 680 is added such that the impurity region 682 can have p-type conductivity. By adjusting the concentration of the impurity element 680 included in the impurity region 682, the impurity region 682 can function as a source region or a drain region, or can function as an LDD region.

In the single crystal semiconductor layer 652, the channel formation region 683 is formed in a region overlapping with the conductive layer 660 and the conductive layer 663.

Then, an interlayer insulating layer is formed. The interlayer insulating layer can be formed as a single-layer structure or a stacked-layer structure; here, the interlayer insulating layer has a two-layer structure of an insulating layer 684 and an insulating layer 685 (see FIG. 22A).

As the interlayer insulating layer, a silicon oxide layer, a silicon oxynitride layer, a silicon nitride layer, a silicon nitride oxide layer, or the like can be formed by a CVD method or a sputtering method. Further, the interlayer insulating layer can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material is a material including a Si—O—Si bond. Siloxane is composed of a skeleton formed by the bond of silicon (Si) and oxygen (O), in which an organic group containing at least hydrogen (such as an alkyl group and aromatic hydrocarbon) is used as a substituent. A fluoro group may be included in the organic group. An oxazole resin is, for example, photosensitive polybenzoxazole. Photosensitive polybenzoxazole is a material which has a low dielectric constant (a dielectric constant of 2.9 at 1 MHz at room temperature), high heat resistance (thermogravimetry-differential thermal analysis (TG/DTA) under the condition of a rate of temperature increase of 5° C./min, it has a thermal decomposition temperature of 550° C.), and a low water absorption coefficient (0.3% at room temperature for 24 hours). Compared with a relative dielectric constant of polyimide (about 3.2 to 3.4) or the like, an oxazole resin has a low relative dielectric constant (about 2.9); therefore, generation of parasitic capacitance is suppressed and the semiconductor device can be driven at high speed.

For example, a silicon nitride oxide layer is formed to a thickness of 100 nm as the insulating layer 684, and a silicon oxynitride layer is formed to a thickness of 900 nm as the insulating layer 685. In addition, the insulating layer 684 and the insulating layer 685 are successively formed by a plasma CVD method. Note that the interlayer insulating layer may also have a stacked-layer structure including three or more layers. Alternatively, a stacked-layer structure of a silicon oxide layer, a silicon oxynitride layer, or a silicon nitride layer, and an insulating layer formed using an organic material such as polyimide, polyamide, polyvinyl phenol, benzocyclobutene, acrylic, or epoxy; a siloxane material such as a siloxane resin; or an oxazole resin can be employed.

Figure 22A:
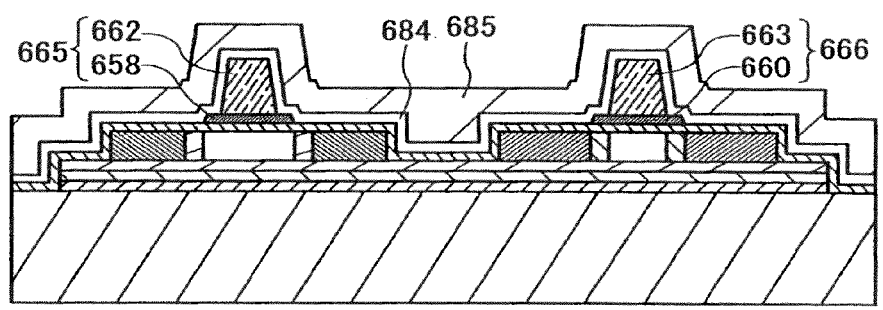
FIGS. 22A and 22B are cross-sectional views illustrating a method for manufacturing a semiconductor device.
Figure 22B:
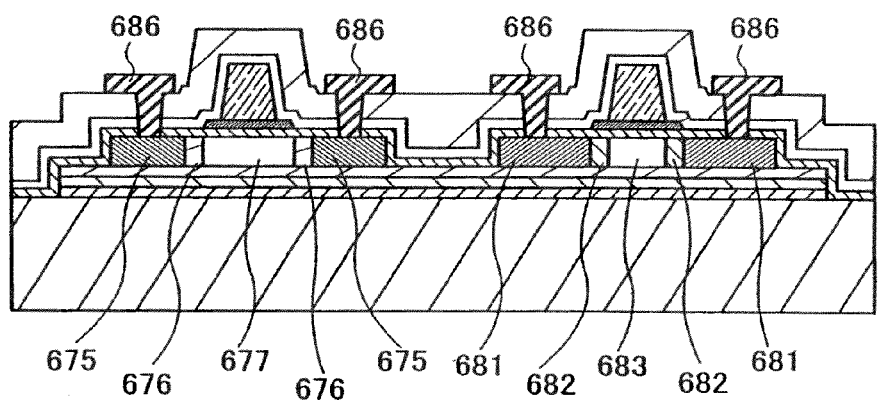

Next, contact holes are formed in the interlayer insulating layer (in this embodiment mode, the insulating layers 684 and 685), and conductive layers 686 that function as source electrodes and drain electrodes are formed in the contact holes (see FIG. 22B).

The contact holes are selectively formed in the insulating layer 684 and the insulating layer 685 so as to reach the impurity region 675 formed in the single crystal semiconductor layer 651, and the impurity region 681 formed in the single crystal semiconductor layer 652.

As the conductive layers 686, a single-layer film formed of one kind of elements selected from aluminum, tungsten, titanium, tantalum, molybdenum, nickel, or neodymium, or an alloy containing a plurality of above elements; or a stacked-layer film including such layers can be used. For example, a conductive layer that is formed using an alloy that contains a plurality of the elements given above can be formed using an aluminum alloy that contains titanium, an aluminum alloy that contains neodymium, or the like. If the conductive layers are each a stacked-layer film, a structure can be employed in which an aluminum layer or an aluminum alloy layer as described above is sandwiched between titanium layers, for example.

As shown in FIG. 22B, the n-channel transistor and the p-channel transistor can be manufactured using the semiconductor substrate 10.

Embodiment Mode 8

This embodiment mode describes a semiconductor device using a semiconductor substrate according to the present invention, and a manufacturing method thereof. By combining a plurality of transistors, a variety of types of semiconductor devices are manufactured. A manufacturing method of transistors will be described with reference to cross-sectional views shown in FIGS. 23A to 23E, as an example of a manufacturing method of a semiconductor device using the semiconductor substrate 10. Note that in this embodiment mode, a method in which an n-channel transistor and a p-channel transistor can be manufactured at the same time is described.

Figure 23A:
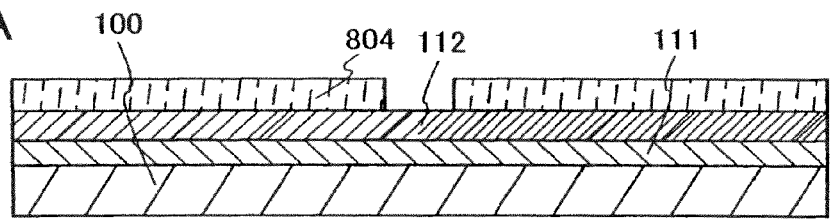
FIGS. 23A to 23E are cross-sectional views illustrating a method for manufacturing a semiconductor device.
Figure 23B:
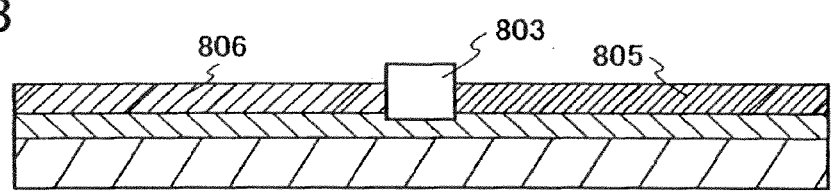
Figure 23C:
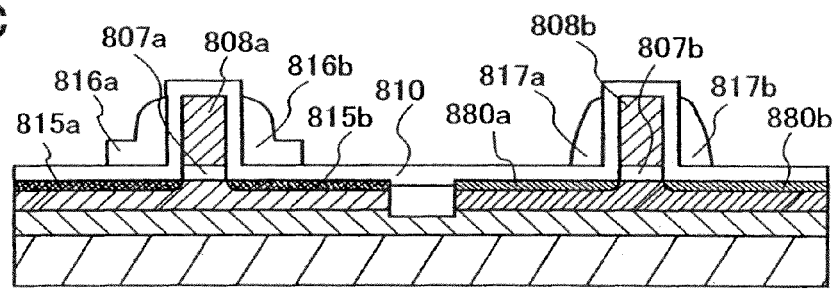
Figure 23D:
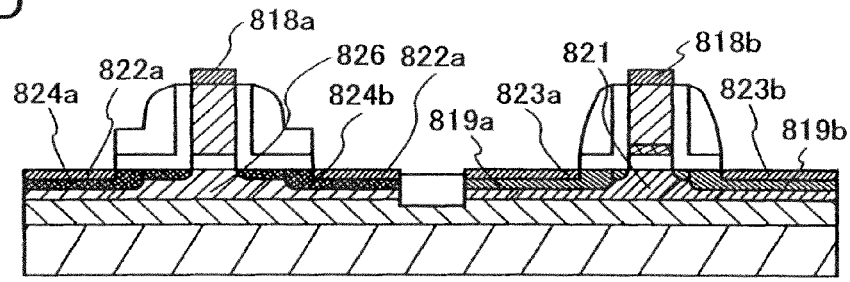

As shown in FIG. 23A, a semiconductor substrate in which a buffer layer 111 and a single crystal semiconductor layer 112 are formed over a supporting substrate 100 is prepared. The buffer layer 111 has a three-layer structure including a first insulating layer that functions as a barrier layer. Note that although an example in which the semiconductor substrate 10 having the structure shown in FIG. 1 is used as the semiconductor substrate is described, a semiconductor substrate having another structure shown in this specification can also be used.

The single crystal semiconductor layer 112 has impurity regions (channel-doped regions) to which a p-type impurity element such as boron, aluminum, or gallium or an n-type impurity element such as phosphorus or arsenic is added in accordance with formation regions of an n-channel field-effect transistor and a p-channel field-effect transistor.

Etching is conducted using a protective layer 804 as a mask to remove an exposed portion of the single crystal semiconductor layer 112 and a portion of the buffer layer 111 thereunder. Then, a silicon oxide film is deposited using organosilane as a source gas by a PECVD method. This silicon oxide film is deposited thick enough so that a surface of the silicon oxide film is higher than a surface of the single crystal semiconductor layer 112. Next, after a portion of the silicon oxide film superposed over the single crystal semiconductor layer 112 is removed by polishing, the protective layer 804 is removed, whereby an element isolating insulating layer 803 is left. The element isolating insulating layer 803 divides the single crystal semiconductor layer 116 into an element region 805 and an element region 806 (see FIG. 23B).

Next, a first insulating film is formed over the single crystal semiconductor layer 112, and gate electrode layers 808a and 808b are formed over the first insulating film. Then, the first insulating film is etched using the gate electrode layers 808a and 808b as masks to form gate insulating layers 807a and 807b.

The gate insulating layers 807a and 807b may be formed with a silicon oxide film or a stacked-layer structure of a silicon oxide film and a silicon nitride film. A silicon oxynitride film, a silicon nitride oxide film, or the like can be used as the gate insulating layer. The gate insulating layers 807a and 807b may be formed by depositing an insulating film by a plasma CVD method or a low pressure CVD method. Alternatively, the gate insulating layers 807a and 807b may be formed by solid phase oxidation or solid phase nitridation by plasma treatment because a gate insulating layer which is formed by oxidation or nitridation of a semiconductor layer by plasma treatment is dense, has high dielectric strength, and is excellent in reliability. For example, dinitrogen monoxide ($N_2O$) is diluted one- to three-fold (flow rate) with Ar. With a pressure of 10 Pa to 30 Pa, a microwave (2.45 GHz) electric power of 3 kW to 5 kW is applied to oxidize or nitrides the surface of the semiconductor layer 116 (the element regions 805 and 806). By this treatment, an insulating film having a thickness of 1 nm to 10 nm (preferably, 2 nm to 6 nm) is formed. Further, with introduction of dinitrogen monoxide ($N_2O$) and silane ($SiH_4$) and a pressure of 10 Pa to 30 Pa, a microwave (2.45 GHz) electric power of 3 kW to 5 kW is applied to form an oxynitride silicon film to form a gate insulating layer. By a combination of solid-phase reaction and reaction by vapor deposition, a gate insulating layer having low interface state density and excellent dielectric strength can be formed.

For the gate insulating layers 807a and 807b, a high-dielectric-constant material such as zirconium dioxide, hafnium oxide, titanium dioxide, or tantalum pentoxide may be used. By using a high-dielectric-constant material for the gate insulating layers 807a and 807b, gate leakage current can be reduced.

The gate electrode layers 808a and 808b can be formed by a method like a sputtering method, an evaporation method, a CVD method, or the like. The gate electrode layers 808a and 808b may be formed of an element selected from tantalum (Ta), tungsten (W), titanium (Ti), molybdenum (Mo), aluminum (Al), copper (Cu), chromium (Cr), and neodymium (Nd) or an alloy material or a compound material containing any of those elements as its main component. Moreover, the gate electrode layers 808a and 808b may be formed using an AgPdCu alloy or a semiconductor film typified by a polycrystalline silicon film which is doped with an impurity element such as phosphorus.

Next, a second insulating film 810 is formed to cover the gate electrode layers 808a and 808b. In addition, sidewall insulating layers 816a, 816b, 817a, and 817b which have sidewall structures are formed. The width of the sidewall insulating layers 816a and 816b which are included in a region where a p-channel field-effect transistor (pFET) is to be formed is larger than that of the sidewall insulating layers 817a and 817b which are included in a region where an n-channel field-effect transistor (nFET) is to be formed. Then, arsenic (As) or the like is added to the region where an n-channel field-effect transistor is to be formed, thereby forming first impurity regions 880a and 880b each of which has a shallow junction depth, and boron (B) or the like is added to the region where a p-channel field-effect transistor is to be formed, thereby forming second impurity regions 815a and 815b each of which has a shallow junction depth (see FIG. 23C).

Next, the second insulating film 810 is partially etched to expose the first impurity regions 880a and 880b, the second impurity regions 815a and 815b, and the top surfaces of the gate electrode layers 808a and 808b. After that, the region where an n-channel field-effect transistor is to be formed is doped with As or the like to form third impurity regions 819a and 819b each of which has a deep junction depth, and the region where a p-channel field-effect transistor is to be formed is doped with B or the like to form fourth impurity regions 824a and 824b each of which has a deep junction depth. Next, heat treatment for activation is performed. Then, a cobalt film is formed as a metal film for forming silicide. Then, heat treatment (500° C., 1 minute) such as RTA is performed to form a silicide in silicon in portions in contact with the cobalt film, thereby forming silicides 822a, 822b, 823a, and 823b. In addition, silicides 818a and 818b are formed over the gate electrode layers 808a and 808b by reaction of the cobalt film and polycrystalline silicon films which form the gate electrode layers 808a and 808b. After that, the cobalt film is selectively removed. Next, heat treatment is performed at a temperature higher than that of the heat treatment for forming a silicide to decrease the resistance of the silicide portions (see FIG. 23D). In the element regions 805 and 806, channel formation regions 821 and 826 are formed, respectively.

Next, an interlayer insulating layer 827 is formed, and with the use of a resist mask, contact holes (openings) which reach the third impurity regions 819a and 819b having a deep junction depth and the fourth impurity regions 824a and 824b having a deep junction depth are formed in the interlayer insulating layer 827. Etching may be performed once or a plurality of times depending on etching selectivity between materials which is used.

An etching method and etching conditions may be set as appropriate depending on the material of the interlayer insulating layer 827 in which the contact holes are formed. Either wet etching or dry etching, or both of them can be used as appropriate. In this embodiment mode, dry etching is used. An etching gas can be selected as appropriate from among a chlorine-based gas typified by $Cl_2$, $BCl_3$, $SiC_4$, or $CCl_4$; a fluorine-based gas typified by $CF_4$, $SF_6$, or $NF_3$; or $O_2$. In addition, a rare gas may be added to an etching gas to be used.

As a rare gas element to be added, one kind or plural kinds of elements selected from He, Ne, Ar, Kr, or Xe can be used. A hydrofluoric acid-based solution such as a mixed solution including ammonium hydrogen fluoride and ammonium fluoride may be used as an etchant in wet etching.

A conductive film is formed to cover the contact holes, and the conductive film is etched to form wiring layers 840a, 840b, 840c, and 840d which also function as a source electrode layer and a drain electrode layer and which are electrically connected to parts of the source and drain regions. The wiring layers can be formed in such a manner that a conductive film is formed by a PVD method, a CVD method, an evaporation method, or the like and is then etched into desired shapes. Alternatively, they can be formed by selective formation of a conductive layer in a predetermined position by a droplet discharge method, a printing method, an electrolytic plating method, or the like. A reflow method or a damascene method may also be used. The wiring layers can be formed of metal such as Ag, Au, Cu, Ni, Pt, Pd, Ir, Rh, W, Al, Ta, Mo, Cd, Zn, Fe, Ti, Zr, or Ba; Si; Ge; or an alloy or a nitride thereof. The wiring layers may each have a stacked layer structure of any of these.

In this embodiment mode, the wiring layers 840a, 840b, 840c, and 840d are formed as embedded wiring layers to fill the contact holes formed in the interlayer insulating layer 827. The wiring layers 840a, 840b, 840c, and 840d, which are embedded, are formed by forming a conductive film having an enough thickness to fill the contact holes and by removing an unnecessary portion of the conductive film so that the conductive film is left only in the contact hole portions.

An insulating layer 828 and wiring layers 841a, 841b, and 841c which function as lead wiring layers are formed over the wiring layers 840a, 840b, 840c, and 840d, which are embedded.

Figure 23E:
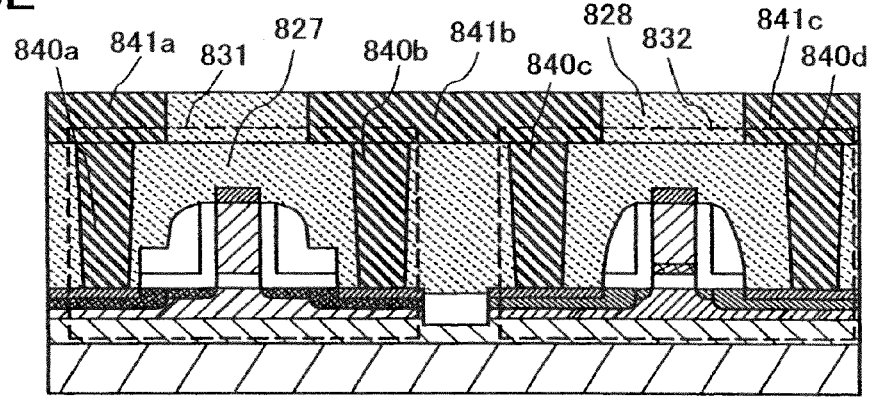

Through the above-described processes, an n-channel field-effect transistor 832 and a p-channel field-effect transistor 831 can be formed using the element region 805 and the element region 806, respectively, of the single crystal semiconductor layer 112 that is bonded to the supporting substrate 100 (see FIG. 23E). Note that in this embodiment mode, the n-channel field-effect transistor 832 and the p-channel field-effect transistor 831 are electrically connected to each other by the wiring layer 841b.

Although the cases where each of the p-channel transistor and the n-channel transistor has a single electrode functioning as a gate are described in Embodiment Modes 6 to 8, the present invention is not limited to that structure. The transistor manufactured according to the present invention may have a multi-gate structure in which a plurality of electrodes functioning as gates are provided and electrically connected to one another. Moreover, the transistor may have a gate planar structure.

Note that since a single crystal semiconductor layer included in the semiconductor substrate of the present invention is obtained by slicing a single crystal semiconductor substrate, its crystal orientation does not vary. Consequently, as described in Embodiment Modes 6 to 8, variation in electric characteristics such as threshold voltage and mobility among a plurality of transistors manufactured using the semiconductor substrate can be made to be small. Further, the single crystal semiconductor layer included in the semiconductor substrate of the present invention has almost no crystal grain boundaries; therefore, a leakage current due to a crystal grain boundary can be suppressed, and further, power saving of a semiconductor device can be realized. Accordingly, a highly reliable semiconductor device can be manufactured.

In the case of manufacturing a transistor from a polycrystalline semiconductor film that is obtained by laser crystallization, it has been necessary to determine a layout of the semiconductor film of the transistor taking into consideration a laser beam scanning direction in order to obtain high mobility. However, in the case of using the semiconductor substrate of the present invention, there is no need for such layout determination, and there are less restrictions in designing the semiconductor devices.

As described in Embodiment Modes 6 to 8, an n-channel field-effect transistor and a p-channel field-effect transistor can be formed in a semiconductor substrate at the same time. Thus, a variety of circuits can be formed using these transistors. For example, a CMOS structure can be formed by a complementary combination of an n-channel field-effect transistor and a p-channel field-effect transistor.

When a wiring, an element, and the like are further stacked over this CMOS structure, semiconductor devices such as a microprocessor can be manufactured. Note that a microprocessor has an arithmetic logic unit (also referred to as an ALU), an ALU controller, an instruction decoder, an interrupt controller, a timing controller, a register, a register controller, a bus interface (bus I/F), a read-only memory, and a memory interface (ROM I/F).

When a microprocessor is formed with an integrated circuit including a CMOS structure, not only an increase in processing speed but also a reduction in power consumption can be achieved.

A structure of the transistor is not limited to the structure described in Embodiment Modes 6 to 8. The structure may be a single gate structure in which one channel formation region is formed, a double gate structure in which two channel formation regions are formed, or a triple gate structure in which three channel formation regions are formed.

A variety of semiconductor devices are manufactured by a combination of a plurality of transistors that are manufactured using the semiconductor substrate according to the present invention. Hereinafter, in Embodiment Modes 9 to 11, semiconductor devices having circuits including transistors, capacitors, and the like will be described.

Embodiment Mode 9

Figure 24:
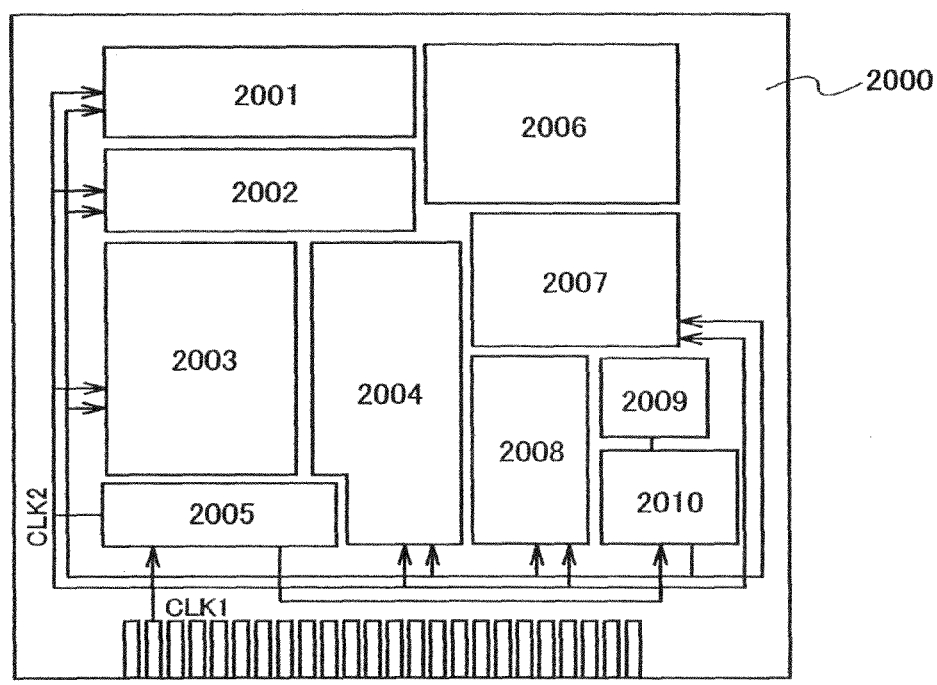
FIG. 24 is a block diagram showing an example of a structure of a microprocessor.

In this embodiment mode, as an example of a semiconductor device, a microprocessor will be described. FIG. 24 is a block diagram illustrating a structural example of a microprocessor 2000.

The microprocessor 2000 includes an arithmetic logic unit (ALU) 2001, an ALU controller 2002, an instruction decoder 2003, an interrupt controller 2004, a timing controller 2005, a register 2006, a register controller 2007, a bus interface (bus I/F) 2008, a read only memory (ROM) 2009, and a ROM interface 2010.

An instruction input to the microprocessor 2000 via the bus interface 2008 is input to the instruction decoder 2003 and decoded, and then input to the ALU controller 2002, the interrupt controller 2004, the register controller 2007, and the timing controller 2005. The ALU controller 2002, the interrupt controller 2004, the register controller 2007, and the timing controller 2005 perform various controls based on the decoded instruction.

The ALU controller 2002 generates a signal for controlling an operation of the arithmetic logic unit 2001. The interrupt controller 2004 is a circuit that processes an interruption request from an external input/output device or a peripheral circuit during program execution of the microprocessor 2000, and the interrupt controller 2004 judges priority of the interruption request or a masked state and processes the interruption request. The register controller 2007 generates an address of the register 2006 and performs reading and writing from/to the register 2006 depending on a state of the microprocessor 2000. The timing controller 2005 generates signals for controlling timing of operation of the arithmetic logic unit 2001, the ALU controller 2002, the instruction decoder 2003, the interrupt controller 2004, and the register controller 2007. For example, the timing controller 2005 is provided with an internal clock generator that generates an internal clock signal CLK2 based on a reference clock signal CLK1. As shown in FIG. 24, the internal clock signal CLK2 is input to another circuit.

Embodiment Mode 10

Figure 25:
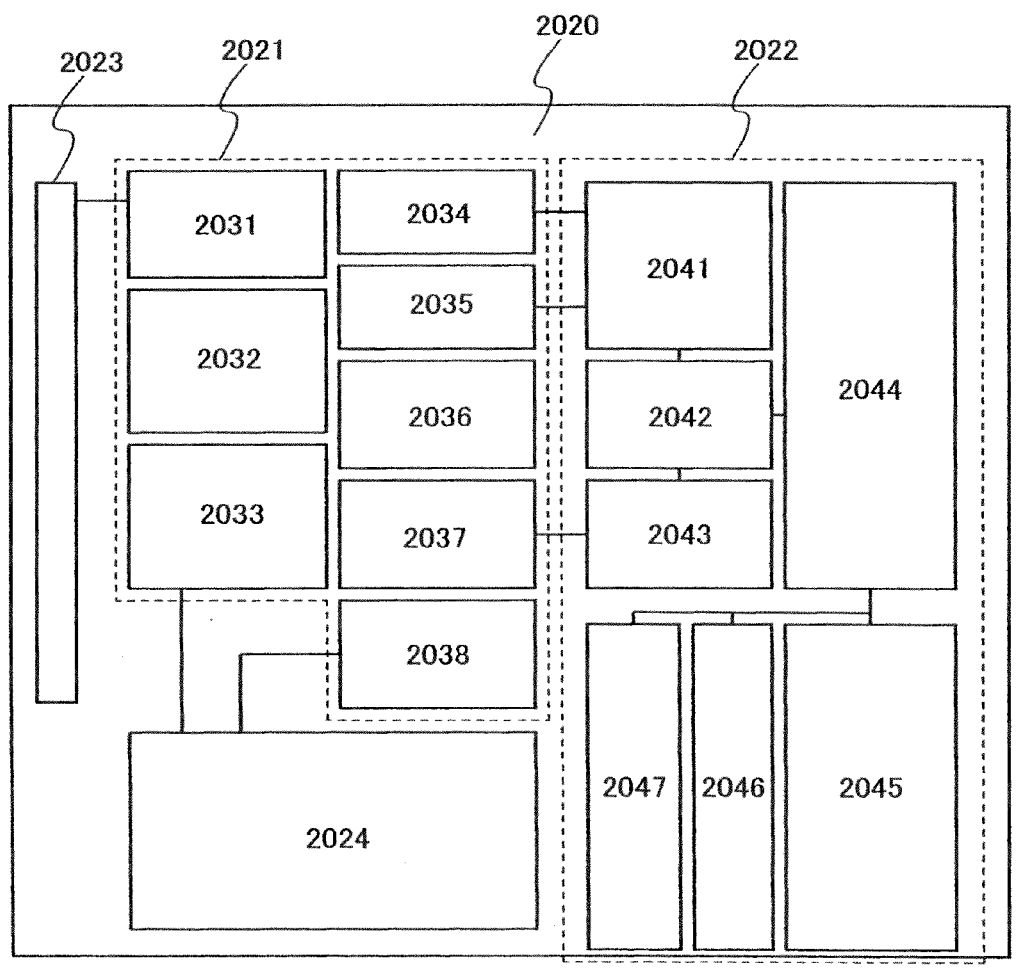
FIG. 25 is a block diagram showing an example of a structure of an RFCPU.

In this embodiment mode, an example of a semiconductor device provided with a function for performing transmission/reception of data without contact and an arithmetic function is described. FIG. 25 is a block diagram illustrating a structural example of such a semiconductor device. A semiconductor device 2020 shown in FIG. 25 functions as an arithmetic processing unit that operates by transmitting/receiving a signal to/from an external device through wireless communication.

As shown in FIG. 25, the semiconductor device 2020 includes an analog circuit portion 2021, a digital circuit portion 2022, an antenna 2023, and a capacitor 2024. The analog circuit portion 2021 includes a resonance circuit 2031 having a resonant capacitor, a constant-voltage circuit 2032, a rectifier circuit 2033, a demodulator circuit 2034, a modulator circuit 2035, a reset circuit 2036, an oscillation circuit 2037, and a power supply management circuit 2038. The digital circuit portion 2022 includes an RF interface 2041, a control register 2042, a clock controller 2043, a CPU interface 2044, a central processing unit 2045 (CPU 2045), a random access memory 2046 (RAM 226), and a read only memory 2047 (ROM 227).

A summary of the operation of the semiconductor device 2020 is as follows. An induced electromotive force is generated in the resonance circuit 2031 using a signal received by the antenna 2023. The induced electromotive force passes through the rectifier circuit 2033 and is stored in the capacitor 2024. This capacitor 2024 preferably includes a capacitor such as a ceramic capacitor or an electric double layer capacitor. The capacitor 2024 does not always have to be integrated with a substrate included in the semiconductor device 2020, and it may be mounted to the semiconductor device 2020 as a different component.

The reset circuit 2036 generates a signal that resets and initializes the digital circuit portion 2022. For example, a signal that rises up lagging behind a rise in power supply voltage is generated as a reset signal. The oscillation circuit 2037 changes the frequency and duty ratio of a clock signal depending on a control signal generated in the constant-voltage circuit 2032. The demodulator circuit 2034 is a circuit that demodulates a reception signal, and the modulator circuit 2035 is a circuit that modulates data to be transmitted.

For example, the demodulator circuit 2034 is formed using a low-pass filter and binarizes an amplitude-modulated (ASK) received signal based on variation of amplitude. Since the modulator circuit 2035 varies the amplitude of an amplitude-modulated (ASK) transmission signal and transmits the data, the modulator circuit 2035 changes the amplitude of a communication signal by changing a resonance point of the resonance circuit 2031.

The clock controller 2043 generates a control signal for changing the frequency and duty ratio of a clock signal depending on power supply voltage or current consumption in the central processing unit 2045. The power supply voltage is monitored by the power supply management circuit 2038.

A signal input to the semiconductor device 2020 from the antenna 2023 is demodulated in the demodulator circuit 2034, and then separated into a control command, data, and the like in the RF interface 2041. The control command is stored in the control register 2042. In the control command, instructions for reading data that is stored in the read only memory 2047, writing data to the random access memory 2046, performing an arithmetic calculation in the central processing unit 2045, and the like are included.

The central processing unit 2045 accesses the read only memory 2047, the random access memory 2046, and the control register 2042 via the CPU interface 2044. The CPU interface 2044 has a function of generating an access signal corresponding to any of the read only memory 2047, the random access memory 2046, and the control register 2042, based on an address requested by the central processing unit 2045.

As an arithmetic method of the central processing unit 2045, a method may be employed in which an operating system (OS) is stored in the read only memory 2047 and a program is read and executed at the time of starting operation. Alternatively, a method may be employed in which a dedicated circuit is provided as an arithmetic circuit and an arithmetic process is performed using hardware. In a method of using both hardware and software, part of an arithmetic process is performed in a dedicated arithmetic circuit, and then the rest of the arithmetic process is performed using a program in the central processing unit 2045.

Embodiment Mode 11

In this embodiment mode, a display device is described as a structural example of a semiconductor device.

First, a structure of a display device of this embodiment mode is described with reference to FIGS. 26 to 28. In this embodiment mode, an active matrix display device is described as the display device.

Figure 26:
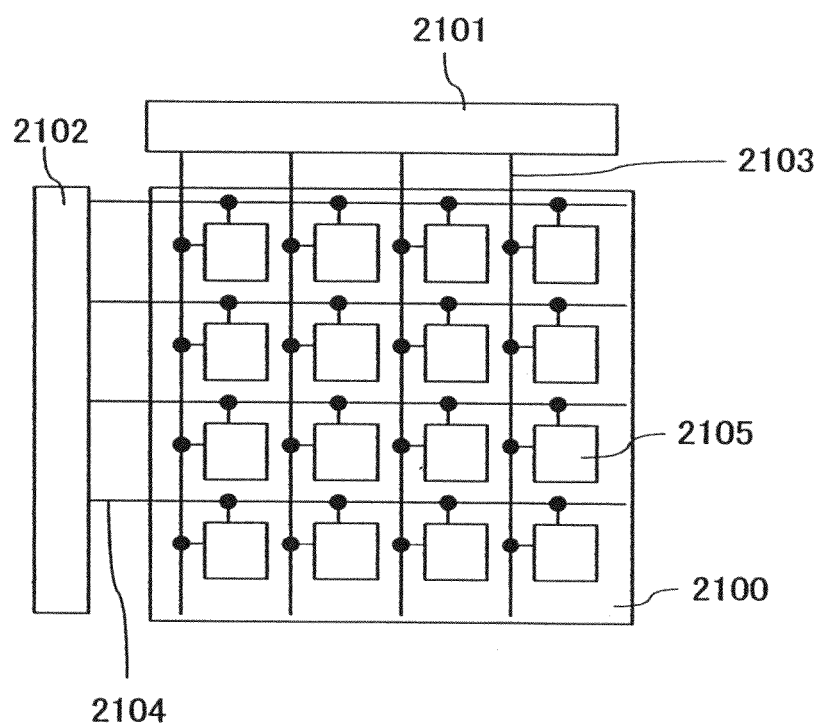
FIG. 26 is a block diagram showing a structural example of an active matrix display device.
Figure 27:
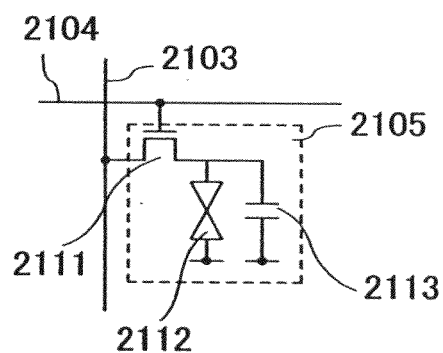
FIG. 27 is a circuit diagram showing a structural example of a pixel of a liquid crystal display device.

FIG. 26 is a block diagram showing a structural example of the active matrix display device of this embodiment mode. The active matrix display device of this embodiment mode has a pixel portion 2100, a signal line driver circuit 2101, a scan line driver circuit 2102, a plurality of signal lines 2103 that are connected to the signal line driver circuit 2101, and a plurality of scan lines 2104 that are connected to the scan line driver circuit 2102.

The plurality of signal lines 2103 are arranged in a column direction, and the plurality of scan lines 2104 are arranged in a row direction to intersect with the signal lines 2103. In the pixel portion 2100, a plurality of pixels 2105 are arranged in a grid corresponding to a grid formed by the signal lines 2103 and the scan lines 2104. The pixels 2105 are connected to the signal lines 2103 and the scan lines 2104. The pixels 2105 each include a switching element and a display element. The switching element controls whether or not the pixel is selected depending on a signal which is input to the scan line 2104. The grayscale of the display element is controlled depending on a video signal which is input from the signal line 2103.

Structural examples of the pixel 2105 are described with reference to FIGS. 27 and 28. FIG. 27 shows a structural example of the pixel 2105 when the present invention is applied to an active matrix liquid crystal display device. The pixel 2105 has a switching transistor 2111 as a switching element and has a liquid crystal element 2112 as a display element. A gate of the switching transistor 2111 is connected to the scan line 2104; one of a source and a drain of the switching transistor 2111 is connected to the signal line 2103; and the other is connected to the liquid crystal element 2112.

The liquid crystal element 2112 includes a pixel electrode, a counter electrode, and liquid crystal. The orientation of liquid crystal is controlled with an electric field which is formed by the pixel electrode and the counter electrode. The liquid crystal is sealed within two substrates. A storage capacitor 2113 is an element used to retain the electric potential of the pixel electrode of the liquid crystal element 2112 and is connected to the pixel electrode of the liquid crystal element 2112.

Figure 28:
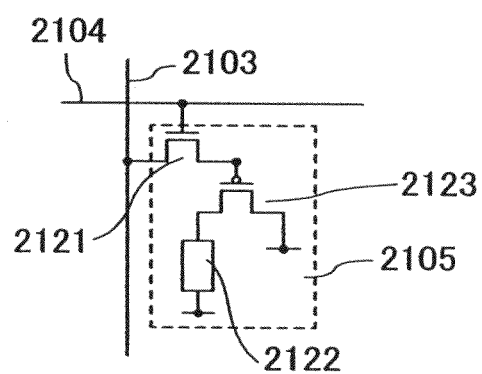
FIG. 28 is a circuit diagram showing a structural example of a pixel of an electroluminescence device.

FIG. 28 shows a structural example of the pixel 2105 when the present invention is applied to an active matrix electroluminescent display device. The pixel 2105 has a selecting transistor 2121 as a switching element and has a light emitting element 2122 as a display element. In addition, the pixel 2105 has a display control transistor 2123 a gate of which is connected to the selecting transistor 2121. The light emitting element 2122 has a pair of electrodes and a light emitting material which is interposed between the pair of electrodes.

Figure 29:
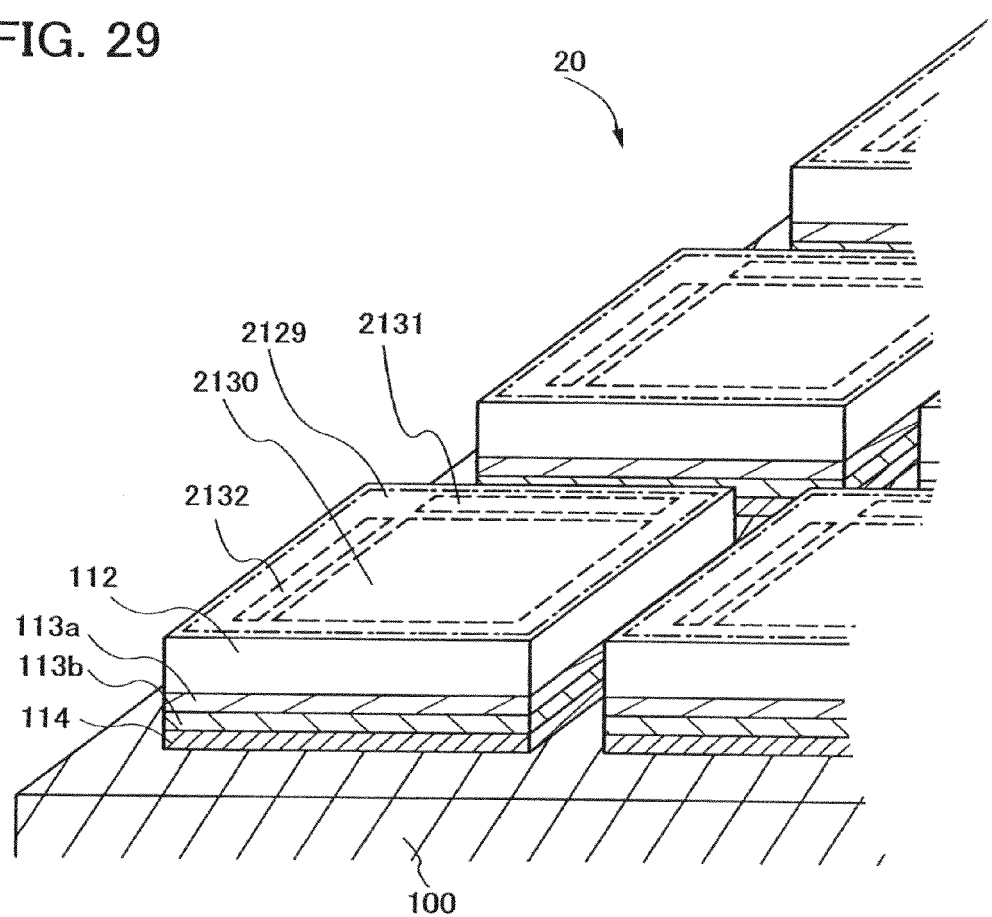
FIG. 29 is a perspective view showing an example of arrangement of a circuit in a semiconductor substrate.

Next, a circuit layout for manufacture of a display device using the semiconductor substrate of the present invention is described. FIG. 29 is a diagram showing a main portion of the semiconductor substrate 20 which is manufactured by the manufacturing method of Embodiment Mode 1 (see FIG. 2). A plurality of substrates each included in a display device can be manufactured from one semiconductor substrate 20. FIG. 29 shows a circuit layout example for manufacture of one display device from one single crystal semiconductor layer 112. In each single crystal semiconductor layer 112, one display panel formation region 2129 is formed. The display device has a pixel portion 2100, a signal line driver circuit 2101, and a scan line driver circuit 2102. Thus, each display panel formation region has regions in which the pixel portion 2100, the signal line driver circuit 2101, and the scan line driver circuit 2102 are formed (a pixel formation region 2130, a signal line driver circuit formation region 2131, and a scan line driver circuit formation region 2132).

Note that one single crystal semiconductor layer 112 can be provided with a plurality of display panel formation regions. In addition, a semiconductor substrate used for manufacture of a display device is not limited to the semiconductor substrate 20, and another semiconductor substrate of the present invention can also be used.

Figure 30A:
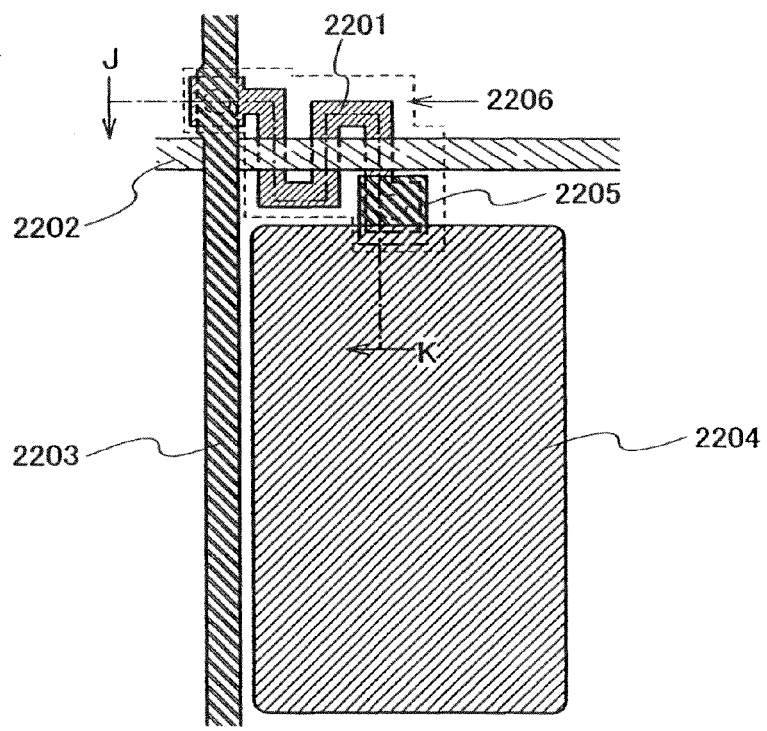
FIG. 30A is a plan view of a pixel of a liquid crystal display device and FIG. 30B is a cross-sectional view of FIG. 30A taken along a section line J-K.
Figure 30B:
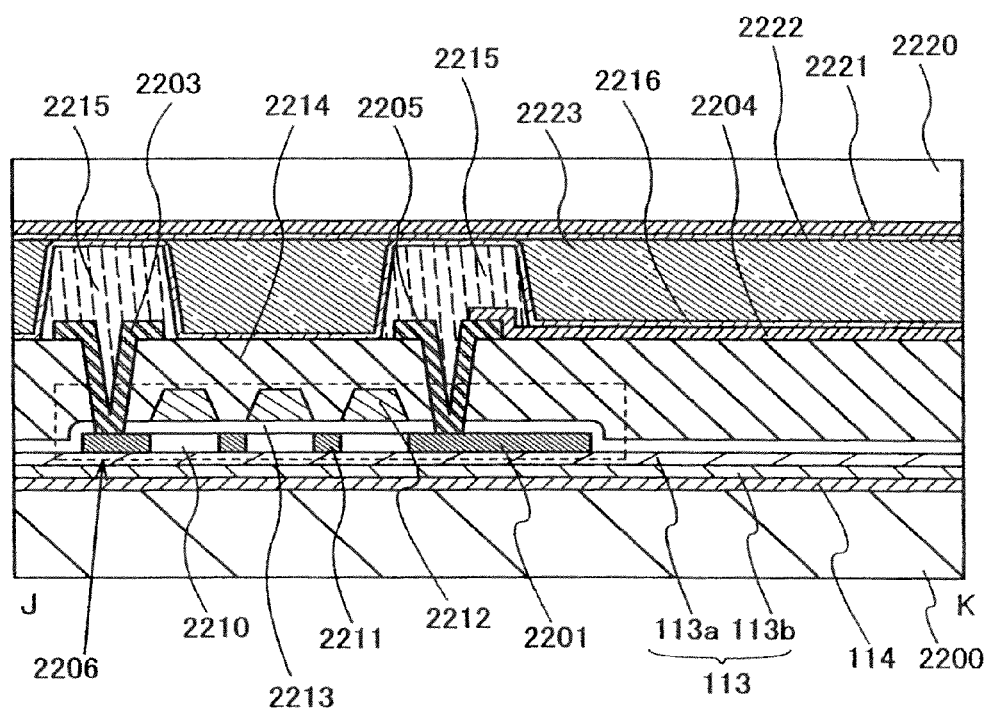

FIGS. 30A and 30B are diagrams illustrating a structural example of a liquid crystal display device. FIG. 30A is a plan view of a pixel of the liquid crystal display device, and FIG. 30B is a cross-sectional view taken along a section line J-K of the diagram of FIG. 30A. As shown in FIG. 30A, a pixel includes: a semiconductor layer 2201; a scan line 2202 that crosses the semiconductor layer 2201; a signal line 2203 that crosses the scan line 2202; a pixel electrode 2204; and an electrode 2205 that electrically connects the pixel electrode 2204 and the semiconductor layer 2201. The semiconductor layer 2201 is a layer that is formed of the semiconductor layer 2201 bonded to an SOI substrate, and forms a transistor 2206 of the pixel.

As shown in FIG. 30B, a second insulating layer 114, a first insulating layer 113 including a first insulating layer 113*a* and a first insulating layer 113*b*, and the semiconductor layer 2201 are stacked over a substrate 2200. The substrate 2200 is obtained by dividing the supporting substrate 100. The semiconductor layer 2201 is a layer formed by element isolation of the single crystal semiconductor layer 112 by etching. In the semiconductor layer 2201, a channel formation region 2210 and an n-type high-concentration impurity region 2211 are formed. A gate electrode 2212 of the transistor 2206 is included in the scan line 2202. One of a source electrode and a drain electrode of the transistor 2206 is included in the signal line 2203, and the other is formed by the electrode 2205. Between the semiconductor layer 2201 and the gate electrode 2212, a gate insulating layer 2213 is formed.

An interlayer insulating film 2214 is formed to cover the semiconductor layer 2201, the gate insulating layer 2213, and the scan line 2202. Over the interlayer insulating film 2214, the signal line 2203, the pixel electrode 2204, and the electrode 2205 are provided. In addition, over the interlayer insulating film 2214, a columnar spacer 2215 is formed. An orientation film 2216 is formed to cover the signal line 2203, the pixel electrode 2204, the electrode 2205, and the columnar spacer 2215. A counter substrate 2220 is provided with a counter electrode 2221 and an orientation film 2222 that covers the counter electrode 2221. The columnar spacer 2215 is formed to maintain a space between the substrate 2200 and the counter substrate 2220. In the space formed by the columnar spacer 2215, a liquid crystal layer 2223 is formed. At connection portions of the signal line 2203 and the electrode 2205 with the high-concentration impurity region 2211, because there are steps formed in the interlayer insulating film 2214 due to formation of contact holes, orientation of liquid crystal in the liquid crystal layer 2223 becomes disordered easily. Accordingly, the columnar spacer 2215 is formed at these connection portions so that orientation disorder of liquid crystal can be prevented.

Figure 31A:
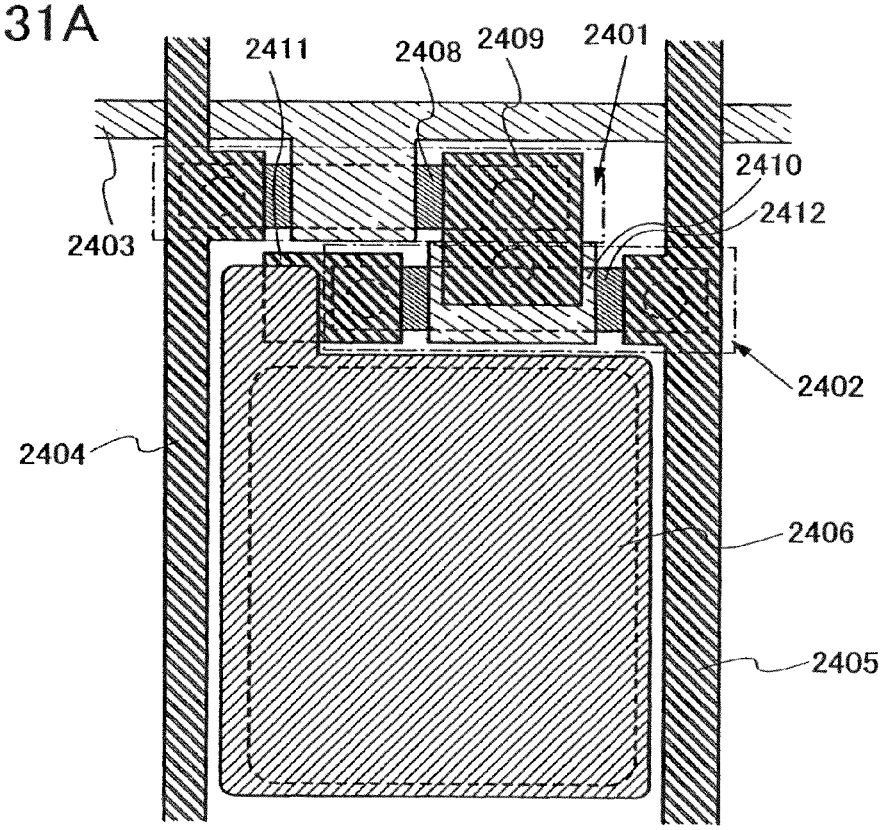
FIG. 31A is a plan view of a pixel of an electroluminescent display device and FIG. 31B is a cross-sectional view of FIG. 31A taken along a section line J-K.
Figure 31B:
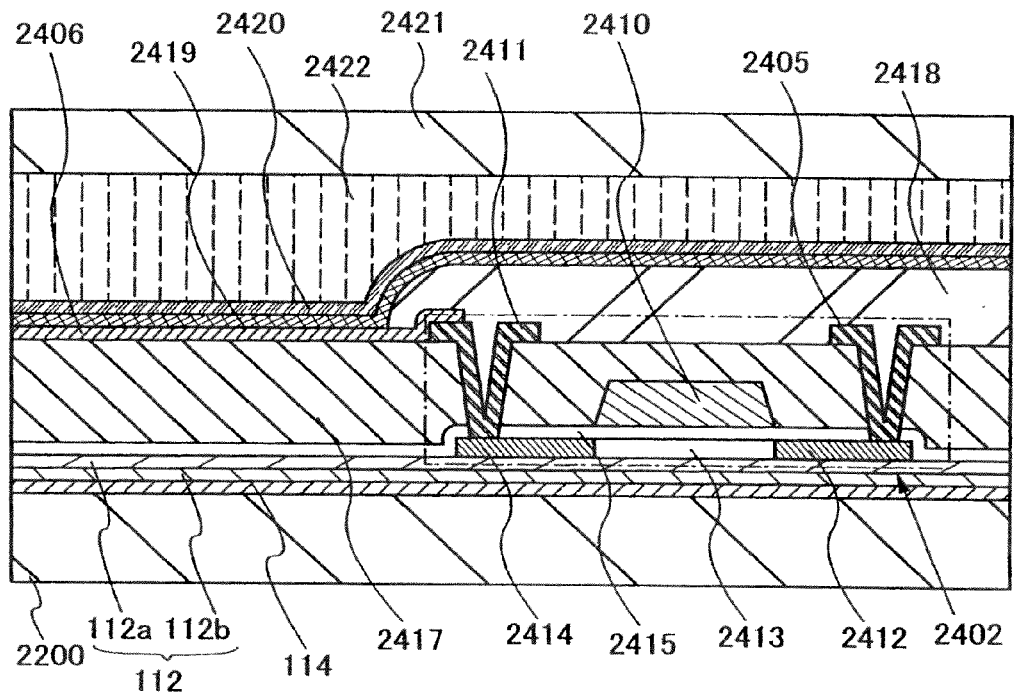

Next, an electroluminescent display device (hereinafter referred to as an "EL display device") is described. FIGS. 31A and 31B are diagrams for illustrating an EL display device that is manufactured using the method of Embodiment Mode 3. FIG. 31A is a plan view of a pixel of the EL display device, and FIG. 31B shows a cross-sectional view of the pixel. As shown in FIG. 31A, a pixel includes a selecting transistor 2401, a display control transistor 2402, a scan line 2403, a signal line 2404, a current supply line 2405, and a pixel electrode 2406, which are formed over a substrate 2200. Each pixel is provided with a light emitting element having a structure in which a layer containing an electroluminescent material (EL layer) is interposed between a pair of electrodes. One of the electrodes of the light emitting element is the pixel electrode 2406.

The selecting transistor 2401 includes a semiconductor layer 2408 that is formed from the single crystal semiconductor layer 112. In the selecting transistor 2401, a gate electrode is included in the scan line 2403, one of two electrodes serving as source and drain electrodes is included in the signal line 2404, and the other is formed as an electrode 2409. In the display control transistor 2402, a gate electrode 2410 is electrically connected to the electrode 2409, and one of two electrodes serving as source and drain electrodes is formed as an electrode 2411 that is electrically connected to the pixel electrode 2406, and the other is included in the current supply line 2405.

The display control transistor 2402 is a p-channel transistor and includes a semiconductor layer 2412 that is formed of the single crystal semiconductor layer 112. As shown in FIG. 31B, in the semiconductor layer 2412, a channel formation region 2413 and a p-type high-concentration impurity region 2414 are formed. An insulating layer 2415 between the semiconductor layer 2412 and the gate electrode 2410 forms gate insulating layers of the selecting transistor 2401 and the display control transistor 2402.

An interlayer insulating film 2417 is formed to cover the semiconductor layers 2408 and 2412, the scan line 2403, and the gate electrode 2410 of the display control transistor 2402. Over the interlayer insulating film 2417, the signal line 2404, the current supply line 2405, the electrodes 2409 and 2411, and the like are formed. In addition, over the interlayer insulating film 2417, the pixel electrode 2406 that is electrically connected to the electrode 2411 is formed. A peripheral portion of the pixel electrode 2406 is surrounded by an insulating partition layer 2418. An EL layer 2419 is formed over the pixel electrode 2406, and a counter electrode 2420 is formed over the EL layer 2419. A counter substrate 2421 is provided as a reinforcing plate, and the counter substrate 2421 is fixed to a substrate 2200 with a resin layer 2422. The substrate 2200 corresponds to the supporting substrate 100.

The pixel electrode 2406, the EL layer 2419, and the counter electrode 2420 constitutes a part of the light emitting element 2122 (see FIG. 28). One of the pixel electrode 2406 and the counter electrode 2420 functions as an anode, and the other functions as a cathode. EL display devices are classified into three structures according to how light emission of a light emitting element is extracted: (1) a structure in which light is extracted through the substrate 2200 (this structure is also called a bottom emission structure), (2) a structure in which light is emitted from a side opposite to the substrate 2200 side (this structure is also called a top emission structure), and (3) a structure in which light is emitted through both the substrate 2200 and from the side opposite to the substrate 2200 (this structure is also called a dual emission structure). The EL display device of this embodiment mode may have any of these three structures.

In the case of a bottom emission structure, it is preferable that the pixel electrode 2406 be a light transmitting electrode and the counter electrode 2420 be a reflective electrode. On the other hand, in the case of a top emission structure, it is preferable that the pixel electrode 2406 be a reflective electrode and the counter electrode 2420 be a light transmitting electrode. In the case of a dual emission structure, it is preferable that each of the pixel electrode 2406 and the counter electrode 2420 be a light transmitting electrode.

The pixel electrode 2406 and the counter electrode 2420 may be formed as a reflective electrode by using a reflective conductive material, for example, a metal element such as tantalum, tungsten, titanium, molybdenum, aluminum, chromium, or silver, an alloy material or a compound material containing any of those metal elements, or the like.

The pixel electrode 2406 and the counter electrode 2420 may be formed as a light transmitting electrode by using a light transmitting conductive material such as indium tin oxide (ITO), zinc oxide (ZnO), indium zinc oxide (IZO), or zinc oxide to which gallium is added (GZO). By formation of a film made of a reflective conductive material to a thickness of several nanometers to several tens of nanometers, the film can transmit visible light; therefore, by forming the film made of a reflective conductive material to have a small thickness, the film made of a reflective conductive material can be used as a light-transmitting electrode.

A light transmitting electrode can be formed using a conductive composition which contains a conductive high molecule (also referred to as a conductive polymer). It is preferable that an electrode formed using a conductive composition have a sheet resistance of 10000 $\Omega$/square or less and a light transmittance of 70% or more at a wavelength of 550 nm. In addition, it is preferable that the conductive high molecule which is contained in the conductive composition have a resistance of 0.1 $\Omega\cdot$cm or less.

As the conductive high molecule, a so called π-electron conjugated conductive high molecule can be used. Examples include polyaniline and derivatives thereof; polypyrrole and derivatives thereof; polythiophene and derivatives thereof; copolymers of two or more kinds of those materials; and the like.

Specific examples of conjugated conductive high molecular compounds are as follows: polypyrrole; poly(3-methylpyrrole); poly(3-butylpyrrole); poly(3-octylpyrrole); poly(3-decylpyrrole); poly(3,4-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-octoxypyrrole); poly(3-carboxylpyrrole); poly(3-methyl-4-carboxylpyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxylthiophene); poly(3-methyl-4-carboxylthiophene); poly(3,4-ethylenedioxythiophene); polyaniline; poly(2-methylaniline); poly(2-octylaniline); poly(2-isobutylaniline); poly(3-isobutylaniline); poly(2-anilinesulfonic acid); poly(3-anilinesulfonic acid); and the like.

A light transmitting electrode may be formed using any of the above-mentioned conductive high molecules alone as the conductive composition. Furthermore, an organic resin can be added to any of the above-mentioned conductive high molecules in order to adjust film characteristics such as film quality or film strength of a light transmitting electrode formed of the conductive composition.

Examples of organic resins that can be used include thermosetting resins, thermoplastic resins, photocurable resins, and the like each of which is compatible with or can be mixed and dispersed into a conductive high molecule. Examples of such resins include: polyester-based resins such as polyethylene terephthalate, polybutylene terephthalate, and polyethylene naphthalate; polyimide-based resins such as polyimide and polyamide imide; polyamide resins such as polyamide 6, polyamide 6,6, polyamide 12, and polyamide 11; fluorine resins such as polyvinylidene fluoride, polyvinyl fluoride, polytetrafluoroethylene, ethylene tetrafluoroethylene copolymer, and polychlorotrifluoroethylene; vinyl resins such as polyvinyl alcohol, polyvinyl ether, polyvinyl butyral, polyvinyl acetate, and polyvinyl chloride; epoxy resins; xylene resins; aramid resins; polyurethane-based resins; polyurea-based resins; melamine resins; phenol-based resins; polyether, acrylic-based resins; copolymers of any of those resins; and the like.

Furthermore, a conductive composition may be doped with an acceptor dopant or a donor dopant so that oxidation-reduction potential of a conjugated electron in a conjugated conductive high molecule may be changed in order to adjust electrical conductivity of the conductive composition.

Examples of acceptor dopants that can be used include halogen compounds; Lewis acids; proton acids; organic cyano compounds; organometallic compounds; and the like. Examples of halogen compounds include chlorine, bromine, iodine, iodine chloride, iodine bromide, iodine fluoride, and the like. Examples of Lewis acids include phosphorus pentafluoride, arsenic pentafluoride, antimony pentafluoride, boron trifluoride, boron trichloride, boron tribromide, and the like. Examples of proton acids include inorganic acids such as hydrochloric acid, sulfuric acid, nitric acid, phosphoric acid, fluoroboric acid, hydrofluoric acid, and perchloric acid; and organic acids such as organic carboxylic acid and organic sulfonic acid. As an organic carboxylic acid and an organic sulfonic acid, the above-mentioned carboxylic acid compound and sulfonic acid compound can be used. Examples of organic cyano compounds are compounds that include two or more cyano groups in a conjugated bond. Examples include tetracyanoethylene; tetracyanoethylene oxide; tetracyanobenzene; tetracyanoquinodimethane; tetracyanoazanaphthalene; and the like.

Examples of donor dopants include alkali metal, alkaline-earth metal, quaternary amine compounds, and the like.

Alternatively, a thin film which functions as a light transmitting electrode can be formed by a wet method using the conductive composition which is dissolved in water or an organic solvent (such as an alcohol-based solvent, a ketone-based solvent, an ester-based solvent, a hydrocarbon-based solvent, or an aromatic-based solvent).

There is no particular limitation on a solvent in which the conductive composition is dissolved. Any solvent that allows the above-mentioned conductive high molecules and high molecular resin compounds such as organic resins to be dissolved therein may be used. For example, the conductive composition may be dissolved in a single or mixed solvent of water, methanol, ethanol, propylene carbonate, N-methylpyrrolidone, dimethylformamide, dimethylacetamide, cyclohexanone, acetone, methyl ethyl ketone, methyl isobutyl ketone, toluene, and the like.

The conductive composition is dissolved in a solvent as described above and then a film thereof is formed over the interlayer insulating film 2417 by a wet method such as an application method, a coating method, a droplet discharge method (also referred to as an inkjet method), or a printing method, whereby the pixel electrode 2406 can be obtained. The solvent may be evaporated through heat treatment or by decreasing pressure. Moreover, when an organic resin is a thermosetting resin, heat treatment may be performed, and when an organic resin is a photocurable resin, light irradiation treatment may be performed.

The partition layer 2418 can be formed in such a manner that an insulating layer is formed over the entire surface of the substrate by a CVD method, a sputtering method, an application method, or the like and then the insulating layer is selectively etched. Alternatively, the partition layer 2418 can be formed selectively by a droplet discharge method, a printing method, or the like. Further alternatively, the partition layer 2418 can be formed into a desired shape in such a manner that an insulating layer is formed using a positive photosensitive resin over the entire surface and is then exposed to light and developed.

As the EL layer 2419, at least a light emitting layer is formed, and a hole injecting layer, a hole transporting layer, an electron transporting layer, or an electron injecting layer may be formed as appropriate in addition to the light emitting layer. The EL layer can be formed by an application method such as an inkjet method, or an evaporation method.

Next, the counter substrate 2421 is disposed to face the substrate 2200 (see FIG. 31B). A space between the counter substrate 2421 and the counter electrode 2420 may be provided with the resin layer 2422 or may be filled with an inert gas. Note that a protective layer may be formed to cover the counter electrode 2420.

In the EL display device of this embodiment mode, a channel formation region of a transistor is formed of a single crystal semiconductor layer. Thus, the EL display device of this embodiment mode can have less variation of characteristics of transistors among pixels than a display device which utilizes a polycrystalline semiconductor in a channel formation region. Therefore, display unevenness among pixels can be suppressed.

Note that there is no particular limitation on the structure of the transistor which forms the display device of this embodiment mode. For example, any of the field-effect transistors having the structure described in Embodiment Modes 6 to 8 can be used.

This embodiment mode can be combined as appropriate with any of the other embodiment modes described in this specification.

Embodiment Mode 12

A wide variety of electronic devices can be manufactured using the semiconductor substrate 10. Examples of the electronic devices include video cameras; digital cameras; navigation systems; sound reproduction systems (a car audio system, audio components, and the like); computers; game machines; mobile information terminals (mobile computers, mobile phones, mobile game machines, electronic book readers, and the like); display devices that display image data, such as image reproduction devices provided with a recording medium (specifically, digital versatile disc (DVD)); and the like.

Figure 32A:
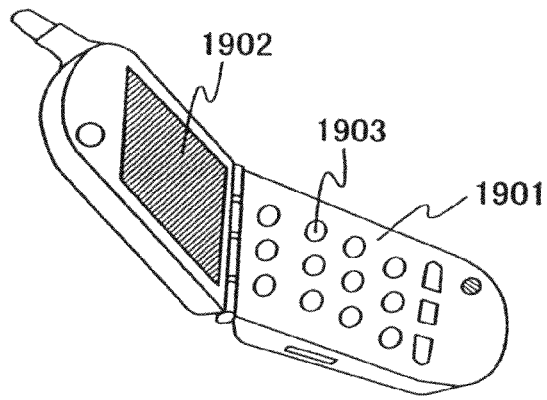
FIGS. 32A to 32C are external views of a mobile phone, a digital player, and an electronic book reader, respectively.

In this embodiment mode, specific modes of the electronic devices are described with reference to FIGS. 32A to 32C and FIGS. 33A to 33C. FIG. 32A is an external view of an example of a mobile phone 1901. This mobile phone 1901 has a structure including a display portion 1902, an operation switch 1903, and the like. By applying the liquid crystal display device described with FIGS. 30A and 30B or the EL display device described with FIGS. 31A and 31B to the display portion 1902, the display portion 1902 can display high-quality images with little display unevenness.

Figure 32B:
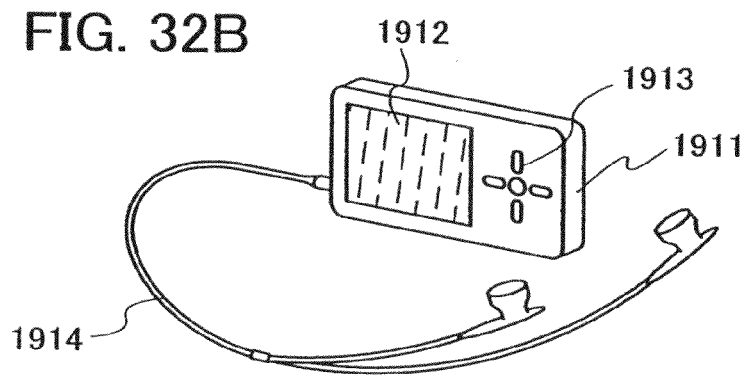

FIG. 32B is an external view of a structural example of a digital player 1911. The digital player 1911 includes a display portion 1912, an operation portion 1913, an earpiece 1914, and the like. Instead of the earpiece 1914, headphones or a wireless earpiece can also be used. By applying the liquid crystal display device described with FIGS. 30A and 30B or the EL display device described with FIGS. 31A and 31B to the display portion 1912, even in the case where the screen size is about 0.3 inches to 2 inches, a high-definition image and a large amount of text information can be displayed.

Figure 32C:
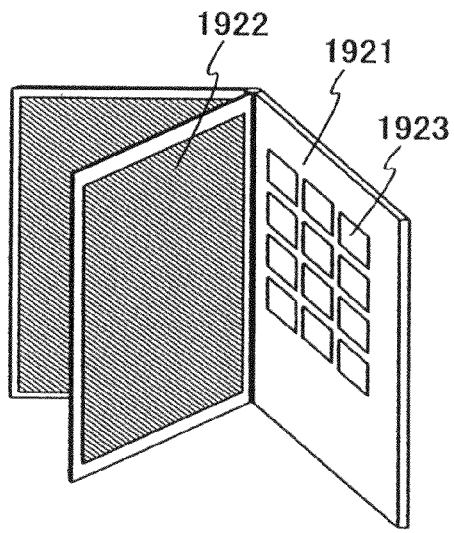

FIG. 32C is an external view of an electronic book reader 1921. This electronic book reader 1921 includes a display portion 1922 and an operation switch 1923. A modem may be incorporated in the electronic book reader 1921, or the semiconductor device 2020 in FIG. 25 may be incorporated so that the electronic book reader 1921 has a structure by which information can be transmitted and received wirelessly. By applying the liquid crystal display device described with FIGS. 30A and 30B or the EL display device described in FIGS. 31A and 31B to the display portion 1922, high-quality images can be displayed.

Figure 33A:
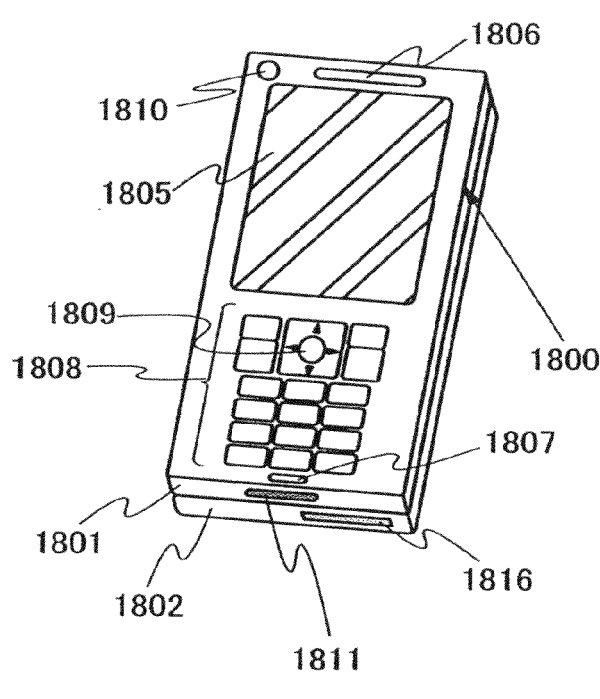
FIGS. 33A to 33C are external views of a mobile phone.
Figure 33B:
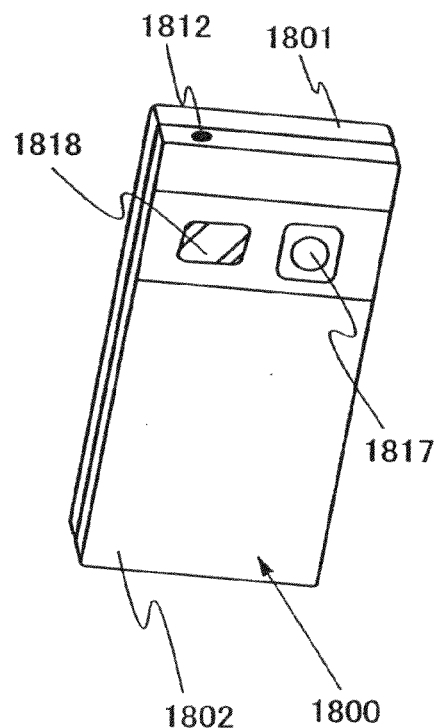
Figure 33C:
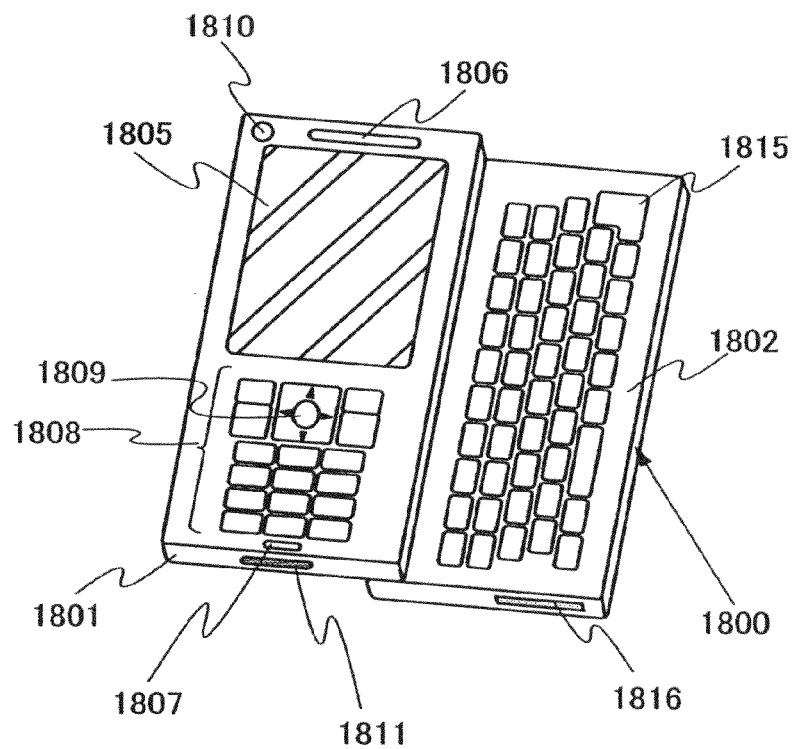

FIGS. 33A to 33C show an example of a structure of the mobile phone 1800 to which the present invention is applied. FIG. 33A is a front view; FIG. 33B, a rear view; and FIG. 33C, a development view. The mobile phone 1800 is a so-called smartphone that has both a function as a mobile phone and a function as a portable information terminal and incorporates a computer provided to conduct a variety of data processing besides voice calls. The mobile phone 1800 has a built-in camera, with which a still image and a moving image can be taken.

The mobile phone 1800 has two housings 1801 and 1802. The housing 1801 includes a display portion 1805, a speaker 1806, a microphone 1807, operation keys 1808, a pointing device 1809, a camera lens 1810, an external connection terminal 1811, an earphone terminal 1812, and the like. By applying the liquid crystal display device described with FIGS. 30A and 30B or the EL display device described with FIGS. 31A and 31B to the display portion 1805, high-quality images can be displayed.

The housing 1802 includes a keyboard 1815, an external memory slot 1816, a camera lens 1817, a light 1818, and the like. In addition, an antenna is incorporated in the housing 1801.

Further, in addition to the above structure, the mobile phone 1800 may incorporate a non-contact IC chip, a small size memory device, or the like.

The display portion 1805 changes the display orientation as appropriate depending on a use mode. Because the camera lens 1810 is provided in the same plane as the display portion 1805, the mobile phone can be used as a videophone. In addition, a still image and a moving image can be taken with the camera lens 1817 and the light 1818 by using the display portion 1805 as a viewfinder. The speaker 1806 and the microphone 1807 can be used for video calls, recording and playing sound, and the like without being limited to voice calls. With use of the operation keys 1808, making and receiving calls, inputting simple information of e-mails or the like, scrolling of the screen, moving the cursor, and the like are possible. Further, the housings 1801 and 1802 which are put together to be lapped with each other (see FIG. 33A) are slid to expose the housing 1802 as shown in FIG. 33C. In the developed state, the mobile phone 1800 can be used as a portable information terminal. In this state, smooth operation can be conducted by using the keyboard 1815 or the pointing device 1809. The external connection terminal 1811 can be connected to an AC adaptor and various types of cables such as a USB cable, and charging and data communication with a personal computer or the like are possible. Moreover, a storage medium can be inserted into the external memory slot 1816 so that a large amount of data can be stored and can be moved.

Further, in addition to the above-described functions, the mobile phone may also have an infrared communication function, a television reception function, or the like.

Embodiment 1

This embodiment describes improvement of the crystallinity of a single crystal semiconductor layer by laser irradiation treatment, and improvement of the lifetime of a single crystal semiconductor layer by heat treatment which is performed after laser irradiation treatment. In order to evaluate crystallinity and lifetime, three types of semiconductor substrates were manufactured: a semiconductor substrate according to the present invention in which a single crystal semiconductor layer separated from a single crystal semiconductor substrate is subjected to laser irradiation treatment and heat treatment; a semiconductor substrate in which a single crystal semiconductor layer separated from a single crystal semiconductor substrate is subjected to laser irradiation treatment but not subjected to heat treatment; and a semiconductor substrate in which a single crystal semiconductor layer separated from a single crystal semiconductor substrate is not subjected to laser irradiation treatment and heat treatment.

Figure 34:
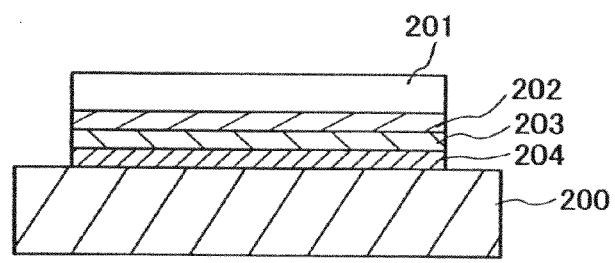
FIG. 34 is a cross-sectional view of a semiconductor substrate used for measurement.

Hereinafter, a method for manufacturing a semiconductor substrate is described. FIG. 34 is a cross-sectional view showing a stacked-layer structure of a semiconductor substrate used for the experiment. The semiconductor substrate was manufactured by the manufacturing method of Embodiment Mode 1 (see FIGS. 4A to 4E and FIGS. 5A to 5C). A single crystal silicon layer 201 is fixed to a glass substrate 200 with a buffer layer 111 including a silicon oxynitride film 202, a silicon nitride oxide film 203, and a silicon oxide film 204 interposed therebetween.

The thicknesses of films included in the buffer layer of the semiconductor substrate of this embodiment are as follows:
the silicon oxynitride film 202: 50 nm
the silicon nitride oxide film 203: 50 nm
the silicon oxide film 204: 50 nm To manufacture the semiconductor substrate, a single crystal silicon wafer is used as a single crystal semiconductor substrate 110. The single crystal silicon wafer is a rectangular substrate with 5 square inches. The single crystal silicon wafer has p-type conductivity, and the resistivity is approximately 10 Ω·cm. The main surface of the single crystal silicon wafer has a crystal orientation of (100), and the side surface thereof has a crystal orientation of <110>. As the glass substrate 200, which is a supporting substrate 100, a non-alkali glass substrate (product name: AN100) having a thickness of 0.7 mm is used.

As a first insulating layer 113, an insulating film having a two-layer structure including the silicon oxynitride film 202 with a thickness of 50 nm and the silicon nitride oxide film 203 with a thickness of 50 nm was formed by a PECVD method (see FIG. 4A). A process gas for formation of the silicon oxynitride film 202 is $SiH_4$ and $N_2O$, and the flow ratio is $SiH_4\backslash N_2O=4\backslash 800$. The substrate temperature of the film formation process is 400° C. A process gas for formation of the silicon nitride oxide film 203 is $SiH_4$, $NH_3$, $N_2O$, and $H_2$, and the flow ratio is $SiH_4\backslash NH_3\backslash N_2O\backslash H_2=10\backslash 100\backslash 20\backslash 400$. The temperature of the film formation process is 350° C.

In order to form a damaged region in the single crystal silicon wafer, hydrogen ions are added to the single crystal silicon wafer by using an ion doping apparatus. A 100% hydrogen gas was used as a source gas, and a single crystal silicon wafer substrate was irradiated with ions in plasma that have been generated by excitation of the hydrogen gas and accelerated by an electric field without mass separation. Accordingly, the damaged region 115 was formed (see FIG. 4B). In the ion doping apparatus, when the hydrogen gas was excited, three kinds of ion species, $H^+$, $H_2^+$, and $H_3^+$, were generated, and all of the ion species are accelerated, with which the single crystal silicon wafer was irradiated. Approximately 80% of the hydrogen ion species that are generated from the hydrogen gas was $H_3^+$.

The condition of the hydrogen ion doping was set as follows: the power output of 100 W, the acceleration voltage of 40 kV, and the dosage of $2.2\times 10^{16}$ ions/cm$^3$, for example.

As a second insulating layer 114, the silicon oxide film 204 with a thickness of 50 nm was formed by a PECVD method (see FIG. 4C). For a process gas for forming the silicon oxide film 204, TEOS and $O_2$ were used. The flow ratio was TEOS:$O_2$=15:750. The temperature of the film formation process was 300° C.

After the glass substrate 200 and the single crystal silicon wafer provided with the films 202 to 204 were subjected to ultrasonic cleaning in pure water and were then cleaned with ozone-containing pure water, the surface of the glass substrate 200 and the silicon oxide film 204 formed over the surface of the single crystal silicon wafer were disposed in close contact with each other and bonded to each other (see FIG. 4D). Next, in order to cause cleavage along the damaged region 115, heat treatment was performed at 200° C. for 2 hours in a heating furnace to increase bonding strength between the glass substrate 200 and the silicon oxide film 204. Successively, heating was performed at 600° C. for 4 hours in the heating furnace. Accordingly, the single crystal silicon wafer was cleaved, and the single crystal silicon layer 201 was separated from the single crystal silicon wafer.

Note that a semiconductor substrate which is manufactured through processes up to FIGS. 4A to 4D (the formation of the buffer layer, the formation of the damaged region, the bonding process, and the process for separating the single crystal silicon wafer) is referred to as a "semiconductor substrate x".

Next, after the semiconductor substrate x was cleaned with pure water, the single crystal silicon layer 201 was treated with a 100-fold diluted hydrofluoric acid to remove a natural oxide film that was formed on the surface. Then, the single crystal silicon layer 201 was irradiated with a laser beam, so that the single crystal silicon layer 201 was melted and recrystallized. As a laser, a XeCl excimer laser which emits a beam at a wavelength of 308 nm was used. The pulse width of the laser beam is 25 nsec and the repetition rate is 30 Hz.

With an optical system, the laser beam was collected such that it has a linear beam shape on a surface irradiated with the laser beam, and scanning with the laser beam was performed in a width direction (a short-axis direction of the beam shape). In laser irradiation, the semiconductor substrate x is not heated and is kept at a room temperature. The semiconductor substrate which is manufactured through processes up to the laser irradiation treatment process is referred to as a "semiconductor substrate y".

After irradiation with a laser beam, the semiconductor substrate y was subjected to heat treatment in a nitrogen atmosphere in a vertical resistance heating furnace. In this embodiment, two kinds of semiconductor substrates processed under different conditions were manufactured. One of the conditions for heat treatment is that after heating is performed at 500° C. for 1 hour, heat treatment is successively performed at 550° C. for 4 hours. The semiconductor substrate y which has been subjected to heat treatment under this condition is referred to as a "semiconductor substrate A". The other of the conditions for heat treatment is that after heating is performed at 500° C. for 1 hour, heat treatment is successively performed at 600° C. for 4 hours. The semiconductor substrate y which has been subjected to a heat treatment process under this condition is referred to as a "semiconductor substrate B".

Note that in the semiconductor substrate A which was manufactured by being subjected to laser irradiation treatment, heating at 500° C. for 1 hour, and heat treatment at 550° C. for 4 hours, it was confirmed that the glass substrate 200 was shrunk by approximately 20 ppm. Since the shrink is generated before a process in which fine alignment is needed (for example, a light exposure process using a stepper), the shrink does not affect manufacture of a semiconductor device using the semiconductor substrate of the present invention.

Table 1 shows correspondence between the semiconductor substrates x, y, A, and B, and the laser beam irradiation process and the heat treatment process.

TABLE 1

| | Semiconductor substrate | | | |
|---|---|---|---|---|
| | x | y | A | B |
| Laser irradiation | No | XeCl excimer laser (308 nm) | | |
| Heat treatment | No | No | 500° C., 1 hr ↓ 550° C., 4 hr | 500° C., 1 hr ↓ 600° C., 5 hr |

Embodiment 2

The crystallinity of the single crystal silicon layer 201 in each of the semiconductor substrates A and B according to the present invention and the semiconductor substrates x and y as comparative examples, was evaluated. Raman spectroscopic measurement and measurement for a lifetime evaluation were performed to evaluate crystallinity. This embodiment describes improvement of the crystallinity of a single crystal silicon layer by laser irradiation treatment in which the single crystal silicon layer is melted and recrystallized, and further improvement of the crystallinity of the single crystal silicon layer by heat treatment which does not melt the single crystal silicon layer and which is performed after the laser irradiation treatment.

Note that in order to distinguish the semiconductor substrates of this embodiment from the semiconductor substrates of Embodiments 3 to 5, a symbol "-1" is added to a reference numeral after an alphabet representing a manufacturing method, so that the semiconductor substrates of this embodiment are referred to as a semiconductor substrate A-1, a semiconductor substrate B-1, a semiconductor substrate x-1, and a semiconductor substrate y-1. Reference numerals which are similar to these are used for the semiconductor substrates of Embodiments 3 to 5.

Hydrogen ions doping in manufacturing each semiconductor substrate which has been subjected to Raman spectroscopic measurement and measurement for a lifetime evaluation, was performed under the following conditions: a source gas of 100% hydrogen, power output of 100 W, an acceleration voltage of 40 kV, and a dosage of $2.2 \times 10^{16}$ ions/cm$^3$. The thickness of the single crystal silicon layer 201 which is separated from the single crystal silicon wafer is 120 nm.

The conditions of the laser irradiation treatment process which has been performed on the semiconductor substrates y-1, A-1, and B-1 were as follows: the width of the beam shape of the laser beam was set to 340 μm; the scanning rate was set to 1.0 mm/sec; the overlap percentage of pulses of the laser beam was 90%, which was a condition under which one region is irradiated with about 10 shots of pulses; the energy density of the laser beam was set to 660 mJ/cm$^2$; and irradiation with a laser beam was performed with a nitrogen gas blown on a surface to be irradiated with the laser beam so that a nitrogen gas atmosphere is obtained.

Figure 35:
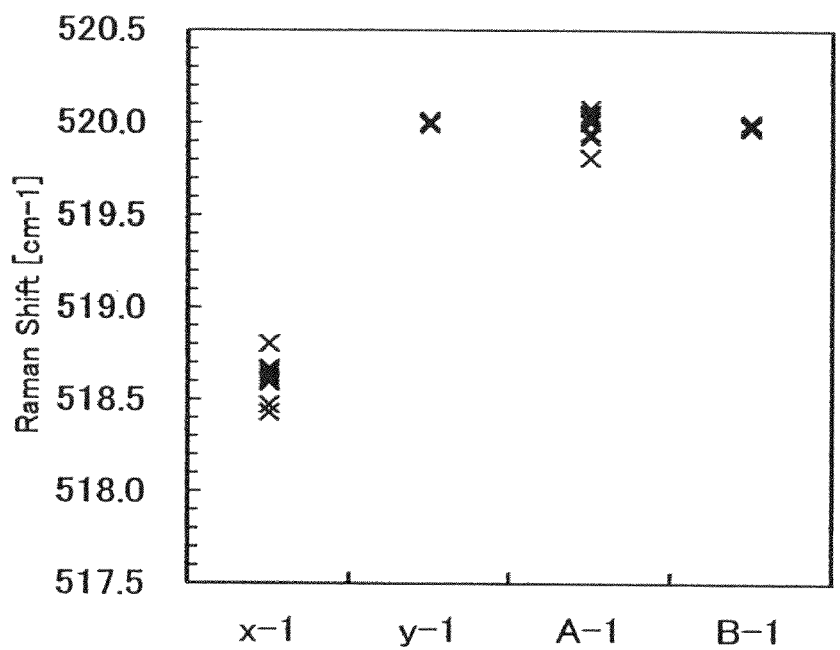
FIG. 35 is a graph showing a peak wavenumber of a Raman shift of a single crystal silicon layer.
Figure 36:
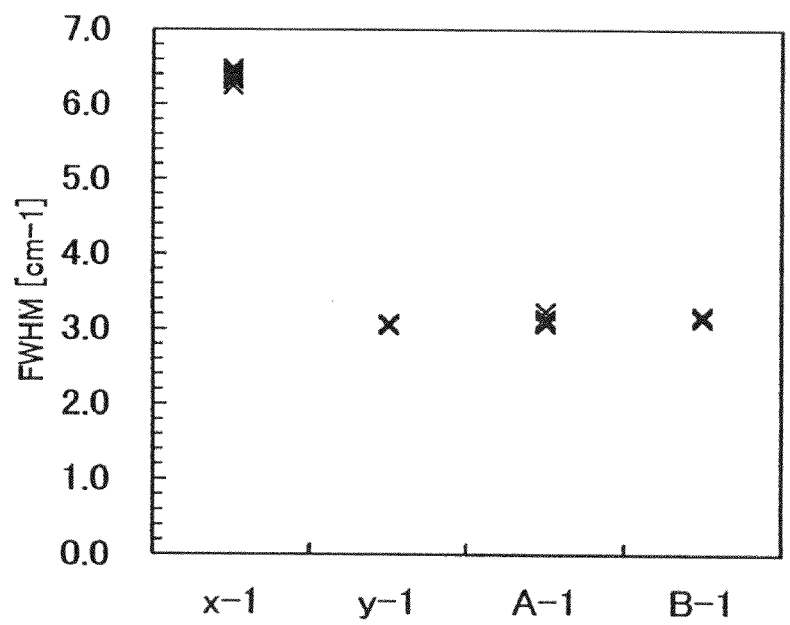
FIG. 36 is a graph showing full width at half maximum of a Raman spectrum of a single crystal silicon layer.

FIGS. 35 and 36 show the results of the Raman spectroscopic measurement. FIG. 35 is a graph of Raman shifts, and FIG. 36 is a graph of full width at half maximum (FWHM) of the Raman spectrum. The Raman spectrum was measured at 9 points in each substrate.

The peak wavenumber of Raman shifts (also referred to as a peak value) which are shown in FIG. 35 is a value determined by an oscillation mode of the crystal lattices, and a unique value that depends on the kind of crystal. The Raman shift of single crystal silicon without any internal stress is 520.6 cm$^{-1}$. As the wavenumber of the Raman shift of silicon is closer to this wavenumber, it can be determined that a crystal structure is closer to that of a single crystal, and the silicon layer has higher crystallinity.

A smaller FWHM shown in FIG. 36 indicates that a crystal state is more uniform with less variation. The FWHM of a commercially available single crystal silicon wafer is approximately from 2.5 cm$^{-1}$ to 3.0 cm$^{-1}$, which can be used as an indicator of crystallinity. The closer an FWHM is to this value, the more uniform a crystal structure of a substrate is like a single crystal silicon wafer.

The graphs of FIGS. 35 and 36 show that the crystallinity of the single crystal silicon layers are recovered by the laser irradiation treatment. The crystallinity can be recovered by the laser irradiation treatment to the same or substantially the same level as the crystallinity of a single crystal silicon wafer before being processed. Note that the graphs of FIGS. 35 and 36 show that data of the semiconductor substrate y-1 and the semiconductor substrates A-1 and B-1 are not significantly different from one another. Accordingly, it is supposed that the heat treatment in this embodiment does not cause change in a crystal structure of a single crystal silicon layer as detected by a Raman spectroscopic analysis.

Figure 37:
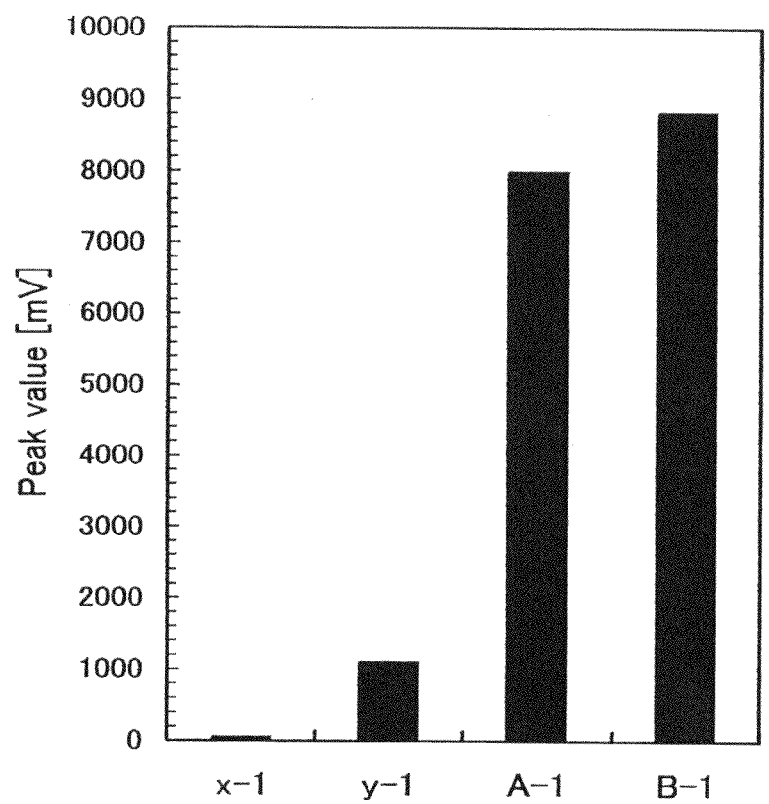
FIG. 37 is a graph showing a result of measuring a lifetime evaluation of a single crystal silicon layer.

FIG. 37 is a graph showing the results of evaluating the lifetime of each of the semiconductor substrates x-1, y-1, A-1, and B-1. In this embodiment, a lifetime measurement system using a microwave photoconductive decay method, which is manufactured by KOBELCO Research Institute, Inc. was used as a measuring apparatus.

A microwave photoconductive decay method (hereinafter referred to as a μ-PCD method) is a method for evaluating a lifetime in the following manner. A surface of a semiconductor is irradiated with a laser beam to generate carriers in the semiconductor, a portion irradiated with the laser beam in the semiconductor is irradiated with a microwave, and a state of intensity decay of the microwave reflected by the semiconductor is detected. A μ-PCD method utilizes the phenomenon that since the resistance of a semiconductor is decreased when carriers are generated in the semiconductor, the reflectivity of a microwave is increased in a region of the semiconductor where carriers are generated. Accordingly, in a μ-PCD method, the lifetime is evaluated by detecting the intensity of the reflected microwave.

Upon irradiation of single crystal silicon with light, electrons generated in a valence band and holes generated in a conduction band are recombined and annihilated. When a single crystal silicon layer has a number of contaminated portions or defects, the density of the charge trap center becomes high. Thus, the probability of the recombination of carriers in single crystal silicon becomes high; accordingly, the lifetime is shortened. Therefore, the lifetime is utilized as a parameter for evaluating whether a crystal structure of a semiconductor such as single crystal silicon is complete.

The vertical axis of the graph of FIG. 37 represents a peak value of a detected signal of a reflected microwave. In FIG. 37, a lifetime can be evaluated based on a peak value since a higher peak value represents longer lifetime. From comparison between the semiconductor substrate x-1 and the semiconductor substrate y-1, it is found that the lifetime can be made long by the laser irradiation treatment. Further, from comparison between the semiconductor substrate y-1 and the semiconductor substrates A-1 and B-1, it is found that the lifetime is greatly made long by performing heat treatment after the laser irradiation treatment.

Referring to FIGS. 35 and 36, the result of evaluating crystallinity of the semiconductor substrate y-1 by a Raman spectroscopy is almost the same as the results of evaluating crystallinity of the semiconductor substrates A-1 and B-1 by a Raman spectroscopy. On the other hand, from the result of improvement of the lifetime as shown in FIG. 37, it is likely that a single crystal silicon layer which is subjected to heat treatment after laser irradiation treatment has a more-complete single crystal structure than a single crystal silicon layer which is not subjected to heat treatment. Although the reason of this is not clear, it is likely that the density of the charge trap center (for example, a dangling bond) which shortens the lifetime is lowered by heat treatment.

To improve the lifetime, a temperature for heat treatment which is performed after a laser irradiation process is set to be 400° C. or higher. The temperature for heat treatment is preferably 500° C. or higher, more preferably 550° C. or higher. Further, this heat treatment is performed in such a manner that a single crystal semiconductor layer is not melted and that a temperature of a supporting substrate does not exceed the strain point of the supporting substrate.

Embodiment 3

This embodiment explains that a single crystal silicon layer is melted by irradiation with the laser beam 122. Further, this embodiment explains that the single crystal silicon layer is recrystallized by irradiation with the laser beam to have a single crystal structure.

The single crystal silicon layer 201 of the semiconductor substrate x-2 which is not subjected to laser irradiation treatment was irradiated with a laser beam, and a phase change of the single crystal silicon layer 201 was measured by a spectroscopic method. Specifically, a region irradiated with a laser beam in the single crystal silicon layer 201 is irradiated with probe light, and a change in intensity of reflected light thereof is measured. It can be determined from the intensity of reflected light whether the single crystal semiconductor layer 201 is in a solid phase state or in a liquid phase state. When silicon changes from a solid phase state into a liquid phase state, the refractive index thereof is rapidly increased and the reflectance thereof for visible light is rapidly increased. Thus, a laser beam having a wavelength of a visible light range is used as probe light, and a change in intensity of reflected light of the probe light is detected. By detecting change in intensity of reflected light of the probe light in the manner described above, a phase change of the single crystal silicon layer 201 from a solid phase to a liquid phase and a phase change from a liquid phase to a solid phase can be detected. A XeCl excimer laser beam with which the single crystal silicon layer 201 is irradiated and a probe light reflected by the single crystal silicon layer 201 are received by different photodetectors. Detection signals of the two photodetectors are input to an oscilloscope and a change of the detection signals of the photodetectors is checked, whereby a relation between time for irradiation with the XeCl excimer laser beam and a phase change of the single crystal silicon layer 201 can be recognized. Here, a beam at a wavelength of 532 nm which is a second harmonic of a Nd:YVO$_4$ laser was used as a laser for a probe light.

Figure 38:
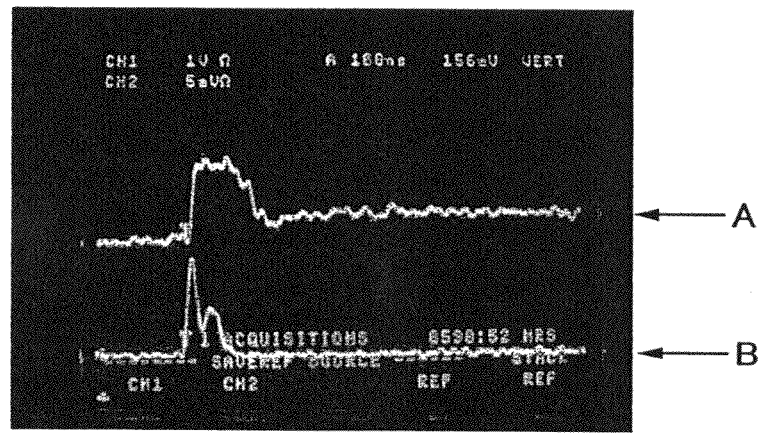
FIG. 38 is a photograph of signal waveforms of an oscilloscope.
Figure 40A:
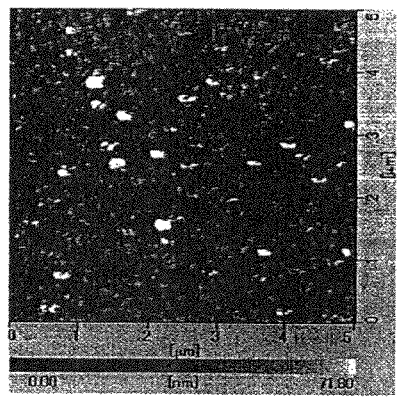
FIGS. 40A to 40D are AFM images of single crystal silicon layers which are observed using an AFM.
Figure 40B:
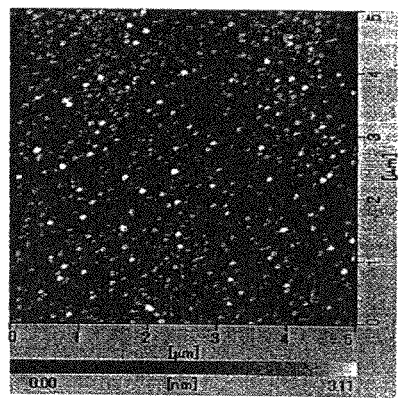
Figure 40C:
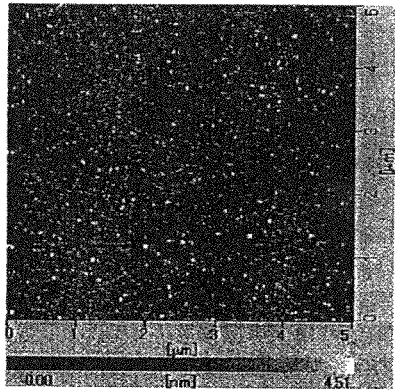
Figure 40D:
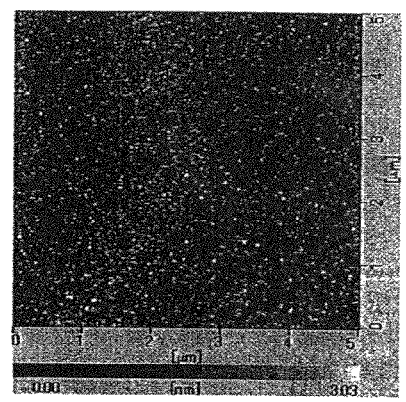

FIG. 38 is a photograph of signal waveforms of the oscilloscope which show measurement results. In the photograph of FIG. 38, the lower signal waveform B is a signal waveform corresponding to the intensity change of the XeCl excimer laser. The upper signal waveform A is a signal waveform corresponding to the intensity variation of the probe light reflected by the single crystal silicon layer. A horizontal axis of FIG. 38 represents time, and the grid interval is a 100 nanosecond.

The measurement conditions are as follows. A nitrogen atmosphere was employed, and an energy density of a XeCl excimer laser was set to be 539 mJ/cm$^2$. Further, the single crystal silicon layer is irradiated with one shot of a laser beam 320 for manufacturing the semiconductor substrate y-2. Note that although two peaks are provided in the signal waveform showing the intensity of the XeCl excimer laser beam, the two peaks are caused by the specification of the XeCl excimer laser which was used for the measurement.

Note that the thickness of the single crystal silicon layer 201 of the semiconductor substrate y-2 in the measurement for data of FIG. 38 is 100 nm. Doping in forming the damaged region 115 is performed under the following conditions: a source gas of 100% hydrogen, power output of 100 W, an acceleration voltage of 40 kV, and a dosage of 2.2×10$^{16}$ ions/cm$^3$.

As shown in FIG. 38, upon irradiation with a XeCl laser beam, the signal intensity corresponding to the probe light rapidly increases. The signal intensity decreases after the irradiation with the XeCl laser beam. Accordingly, the following is found from the intensity change of the detected signal. By the irradiation of the single crystal silicon layer 201 with a XeCl laser beam, the temperature of a region irradiated with the laser beam increases to a melting point or higher, and thus, the region is melted. Although the region is kept in a melting state (a liquid crystal state) for a while even after the laser beam irradiation, the region starts solidifying when the temperature of this region decreases, and returns to a solid state entirely. That is, it was confirmed that the single crystal silicon layer 201 is melted by irradiation with a XeCl laser beam.

Described next is that a single crystal silicon layer is recrystallized by being melted by irradiation with a XeCl excimer laser beam, and that the recrystallized silicon layer has a single crystal structure.

FIGS. 39A and 39B are inverse pole figure (IPF) maps which are obtained from measurement data of electron backscatter diffraction patterns (EBSP) of surfaces of the single crystal silicon layers of the semiconductor substrates x-3 and y-3. FIG. 39A is an IPF map of the single crystal silicon layer of the semiconductor substrate x-3 which is not subjected to a laser irradiation process, and FIG. 39B is an IPF map of the semiconductor substrate y-3 which is subjected to a laser irradiation process. FIG. 39C is a color code map showing the relationship between colors of the IPF maps and crystal orientation, in which the orientation of each crystal plane is color-coded.

In manufacturing the semiconductor substrate x-3 and the semiconductor substrate y-3, doping at the time of forming the damaged region 115 is performed under the following conditions: power output of 100 W, an acceleration voltage of 40 kV, and a dosage of 2.0×10$^{16}$ ions/cm$^2$. The thickness of the single crystal silicon layer of the semiconductor substrates x-3 and y-3 is approximately 100 nm.

The laser irradiation treatment of the semiconductor substrate y-3 is performed under the following conditions. The cross-sectional shape of a laser beam on a surface to be irradiated is a linear shape having a width of 350 μm and a length of 126 mm, and a scanning speed (movement speed of a substrate) of the laser beam is 1.0 mm/second. The number of shots of the laser beam with which one region of the single crystal silicon layer 201 is irradiated is 10.5 shots by calculation from the beam width and the scanning speed. In addition, the energy density of the laser beam is 648 mJ/cm$^2$. In order to perform laser beam irradiation in a nitrogen atmosphere, a nitrogen gas is blown on the surface irradiated with a laser beam.

According to the IPF maps of FIGS. 39A to 39D, it is found that the crystal orientation of the single crystal silicon layer 201 is not disordered before and after laser beam irradiation, and the plane orientation of the surface of the single crystal silicon layer 201 is (100) which is the same as the plane orientation of the single crystal silicon wafer which was used. In addition, it is found that there is no crystal grain boundary in the single crystal silicon layer 201 before and after laser beam irradiation. This can be confirmed from the IPF maps of FIGS. 39A and 39B which are quadrangular images made of one color that shows (100) orientation shown in a color (red in the color drawing) of the color code map of FIG. 39C.

Therefore, it is confirmed by EBSP measurement that a single crystal silicon layer whose main surface is oriented along the (100) plane is formed from a single crystal silicon wafer whose main surface is oriented along the (100) plane, and a single crystal silicon layer which is obtained by melting the above single crystal silicon layer through laser beam irradiation also has a main surface which is oriented along the (100) plane.

Note that dots present in the IPF maps of FIGS. 39A and 39B show portions having a low CI value. The CI value is an index value showing reliability and accuracy of data with which crystal orientation is determined. The CI value is decreased by the presence of crystal boundary, crystal defects, and the like. In other words, it can be concluded that when there are smaller number of portions with a low CI value, the crystal structure is more complete, that is, the crystallinity is higher. The number of portions having a low CI value is smaller in the IPF map of the semiconductor substrate y-3 than in the IPF map of the semiconductor substrate x-3. Therefore, it can be thought that crystal defects in the single crystal silicon layer or microdefects such as dangling bonds are repaired by laser beam irradiation.

Embodiment 4

This embodiment explains that the single crystal silicon layer 201 is improved in planarity by laser irradiation treatment. Surface planarity was evaluated with measured values that represent surface roughness and that are obtained by analysis of images observed with an atomic force microscope (such images are hereinafter referred to as AFM images). In this embodiment, an evaluation of surface roughness was performed on four kinds of semiconductor substrates x-1, y-1, A-1, and B-1 which have been subjected to a lifetime evaluation and a Raman spectroscopic analysis of Embodiment 2.

The conditions for measurement are as follows.
Atomic force microscope (AFM): a scanning probe microscope SPI3800N/SPA500 manufactured by Seiko Instruments Inc.
Measurement mode: dynamic force mode (DFM)
Cantilever: SI-DF40 (made of silicon, a spring constant of 42 N/m, a resonant frequency of 250 kHz to 390 kHz, and a probe tip of R≧10 nm)
Measured area: 5 μm×5 μm
Measured points: 256 points×256 points Note that DFM refers to a measurement mode in which the surface shape of a sample is measured in a state where a cantilever is resonated at a given frequency (a frequency specific to the cantilever) while the distance between a probe and the sample is controlled so that the vibration amplitude of the cantilever is maintained constant. In DFM, the surface of the sample and the cantilever are not in contact with each other; thus, measurement is possible without changing the original shape of the surface of the sample and without damaging the surface.

FIGS. 40A to 40D are AFM images of the single crystal silicon layers 201 of the semiconductor substrates x-1, y-1, A-1, and B-1.

Figures 41A, 41B, 41C:
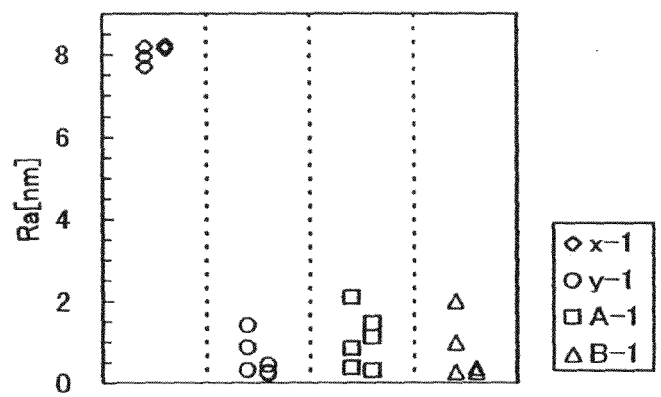
FIGS. 41A to 41C are graphs of surface roughness of a single crystal silicon layer which is calculated based on AFM images.

FIGS. 41A to 41C show the surface roughness of a single crystal silicon layer of each of the semiconductor substrates x-1, y-1, A-1, and B-1 which is calculated based on the AFM images. The surface roughness was analyzed using accessory software, so that average surface roughness Ra, root-mean-square roughness RMS, and the maximum peak-to-valley height P-V were calculated. FIG. 41A is a graph showing average surface roughness Ra, FIG. 41B is a graph showing root-mean-square roughness RMS, and FIG. 41C is a graph showing the maximum peak-to-valley height P-V. In this embodiment, the number of the prepared semiconductor substrates x-1, y-1, A-1, and B-1 is two for each, and a surface roughness analysis is performed at three points in each substrate.

From data of FIGS. 41A to 41C, it is found that a surface of the single crystal silicon layer 201 which is melted and recrystallized is planarized by laser irradiation treatment. Further, it is found that planarity of the single crystal silicon layer is kept even through heat treatment after laser irradiation treatment. Therefore, it can be said that one of the effects of laser beam irradiation treatment is that a single crystal semiconductor layer separated from a single crystal semiconductor substrate is planarized at a process temperature of equal to or lower than the upper temperature limit of a glass substrate used as the supporting substrate 100.

Hereinafter, the average surface roughness Ra, the root-mean-square roughness RMS, and the maximum peak-to-valley height P-V, which are used in this specification as indicators of surface planarity, are described.

The average surface roughness (Ra) means the average surface roughness obtained by three-dimensionally expanding a centerline average height Ra that is defined by JIS B 0601:2001 (ISO4287:1997) so as to be able to apply the Ra to a measurement surface. The Ra can be represented as a average of the absolute values of the deviation from a reference surface to a specific surface, and is calculated by formula (a1).

$$R_a = \frac{1}{S_0} \int_{Y_1}^{Y_2} \int_{X_1}^{X_2} |F(X, Y) - Z_0| dX dY \qquad (a1)$$

Note that the measurement surface is a surface which is shown by the all measurement data, and is calculated by Formula (a2). In Formula (a2), (X, Y) is in the range of (0,0) to $(X_{max}, Y_{max})$.

$$Z = F(X, Y) \qquad (a2)$$

The specific surface is a surface which is an object of roughness measurement, and is a rectangular region within four points represented by the coordinates $(X_1, Y_1)$, $(X_1, Y_2)$, $(X_2, Y_1)$, and $(X_2, Y_2)$. The area of the specific surface is referred to as $S_0$ when the specific surface is flat ideally. Therefore, the area $S_0$ is obtained from Formula (a3).

$$S_0 = (X_2 - X_1) \cdot (Y_2 - Y_1) \qquad (a3)$$

The reference surface is a plane surface represented by $Z = Z_0$ where $Z_0$ represents the mean value of the height of the specific surface. The reference surface is parallel to the XY plane. Note that the average value $Z_0$ is obtained from Formula (a4).

$$Z_0 = \frac{1}{S_0} \int_{Y_1}^{Y_2} \int_{X_1}^{X_2} F(X, Y) dX dY \qquad (a4)$$

The root-mean-square roughness (RMS) means the root mean square of the surface roughness obtained by three-dimensionally expanding the RMS of a cross section curve so as to be able to apply the RMS of a cross section curve to the measurement surface, in a manner similar to the Ra. The root-mean-square roughness (RMS) can be represented as the square root of the mean value of the square of the deviation from the reference surface to the specific surface, and is obtained from the following Formula (a5).

$$R_{ms} = \sqrt{\frac{1}{S_0} \int_{Y_1}^{Y_2} \int_{X_1}^{X_2} \{F(X, Y) - Z_0\}^2 dX dY} \quad (a5)$$

The maximum peak-to-valley height (P-V) can be expressed as a difference between the height of the highest peak $Z_{max}$ and the height of the lowest valley $Z_{min}$ in the specific surface, and can be given by Formula (a6).

$$P\text{-}V = Z_{max} - Z_{min} \quad (a6)$$

The peak and the valley herein are obtained by expanding into three dimensions the "peak" and the "valley" that are defined by JIS B 0601:2001 (ISO 4287:1997). The peak can be expressed as the highest point in the specific surface and the valley can be expressed as the lowest point in the specific surface.

Embodiment 5

This embodiment mode describes the hydrogen concentration of a single crystal silicon layer of s semiconductor substrate according to the present invention. In this embodiment, the hydrogen concentration of single crystal silicon layers of semiconductor substrates x-4, y-4, and A-1 was analyzed by secondary ion mass spectrometry (SIMS). The semiconductor substrate A-1 is a semiconductor substrate which is subjected to a Raman spectroscopic analysis and a lifetime evaluation of Embodiment 2.

Figure 42:
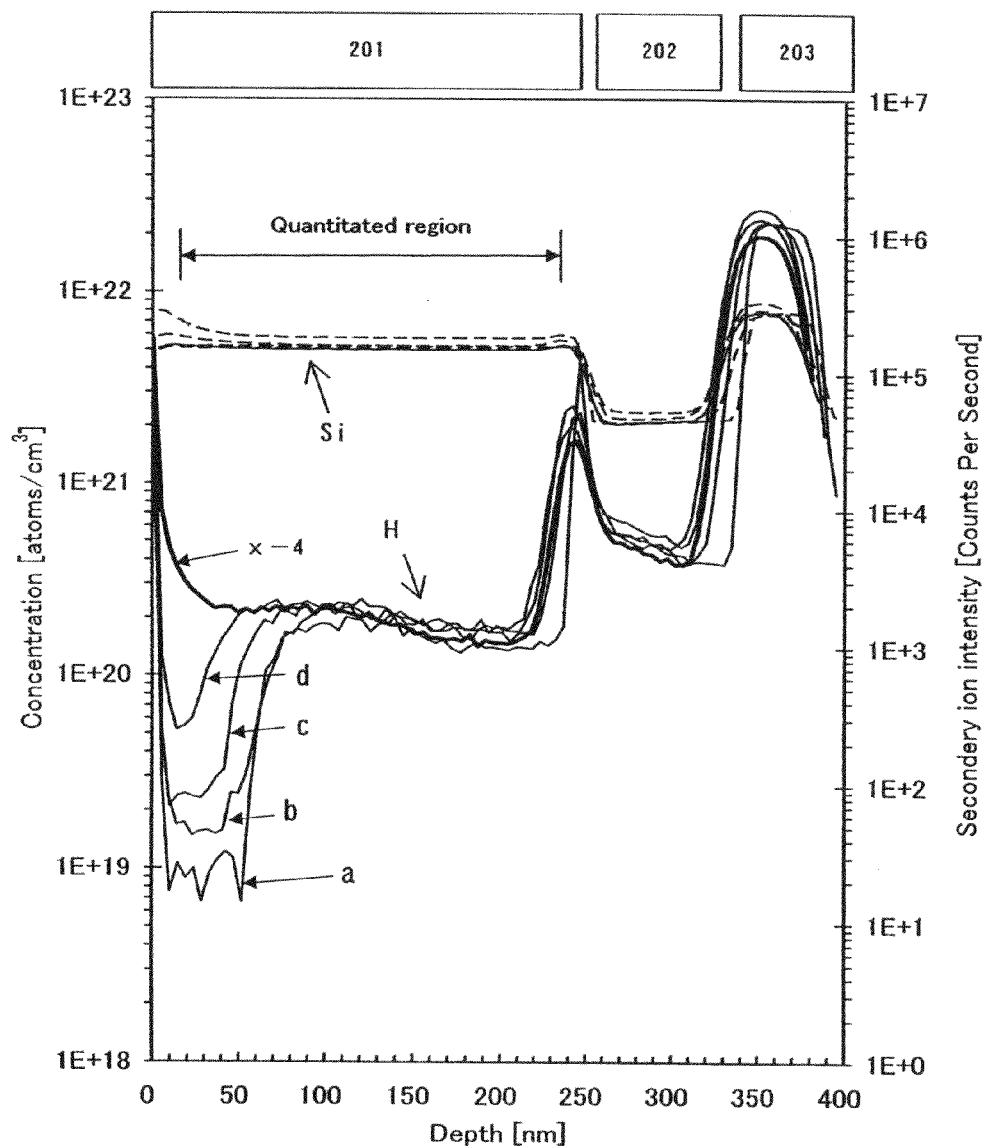
FIG. 42 is a depth profile of a hydrogen concentration of a single crystal silicon layer by SIMS.

FIG. 42 is a depth profile of the hydrogen concentration by SIMS of the semiconductor substrates x-4 and y-4. In FIG. 42, the values of the hydrogen concentration are effective only in the silicon layers.

In manufacturing each of the semiconductor substrates x-4 and y-4 of this embodiment, hydrogen ion doping at the time of forming the damaged region 115 is performed under the following conditions: power output of 50 W; an acceleration voltage of 80 kV, and a dosage of $2.5 \times 10^{16}$ ions/cm$^2$. Under the conditions, the single crystal silicon layer 201 was formed having a thickness of approximately 220 nm. Further, the silicon oxynitride film 202 was formed having a thickness of 100 nm.

In this embodiment, the semiconductor substrate y-4 was irradiated with a laser beam in such a way that the width of the laser beam is set to be 340 μm and the scanning rate is set to 1.0 mm/sec, so that irradiation with about 10 shots of laser beams is performed, in a laser irradiation process which is carried out with respect to the semiconductor substrate y-4. Under the conditions, the overlap percentage is 90%. Further, the laser irradiation process is performed at a room temperature. Furthermore, the laser irradiation treatment was performed under four kinds of conditions (a to d) with different energy densities of a XeCl excimer laser and irradiation atmospheres. The conditions a to d are as follows:

a. 637 mJ/cm$^2$, $N_2$ gas atmosphere
b. 543 mJ/cm$^2$, atmospheric atmosphere
c. 543 mJ/cm$^2$, $N_2$ gas atmosphere
d. 449 mJ/cm$^2$, $N_2$ gas atmosphere Note that a nitrogen gas atmosphere is obtained by blowing a nitrogen gas on a surface irradiated with a laser beam.

As shown in FIG. 42, it is found that the hydrogen concentration of the single crystal silicon layer 201 on the upper layer side (the shallower side) is lowered by laser irradiation treatment. The higher the energy density of the laser beam is, the lower the hydrogen concentration becomes. In the semiconductor substrate x-4 which is not subjected to laser irradiation treatment, the concentration of hydrogen contained in the single crystal silicon layer 201 is approximately higher than or equal to $1 \times 10^{20}$ atoms/cm$^3$ and lower than or equal to $3 \times 10^{20}$ atoms/cm$^3$. However, by laser irradiation treatment, the hydrogen concentration of the upper portion of the single crystal silicon layer 201 decreases to be lower than or equal to $1 \times 10^{20}$ atoms/cm$^3$, and the hydrogen concentration of the upper portion of the single crystal silicon layer 201 is higher than or equal to $1 \times 10^{19}$ atoms/cm$^3$ and lower than or equal to $3 \times 10^{20}$ atoms/cm$^3$.

It is supposed that a region of the single crystal silicon layer 201 of the semiconductor substrate y-4 in which the hydrogen concentration is lower than that of the semiconductor substrate x-4 is either a region which is melted by laser beam irradiation or a region which is heated by thermal condition from a melted region to the temperature or higher at which a hydrogen gas is released.

Figure 43:
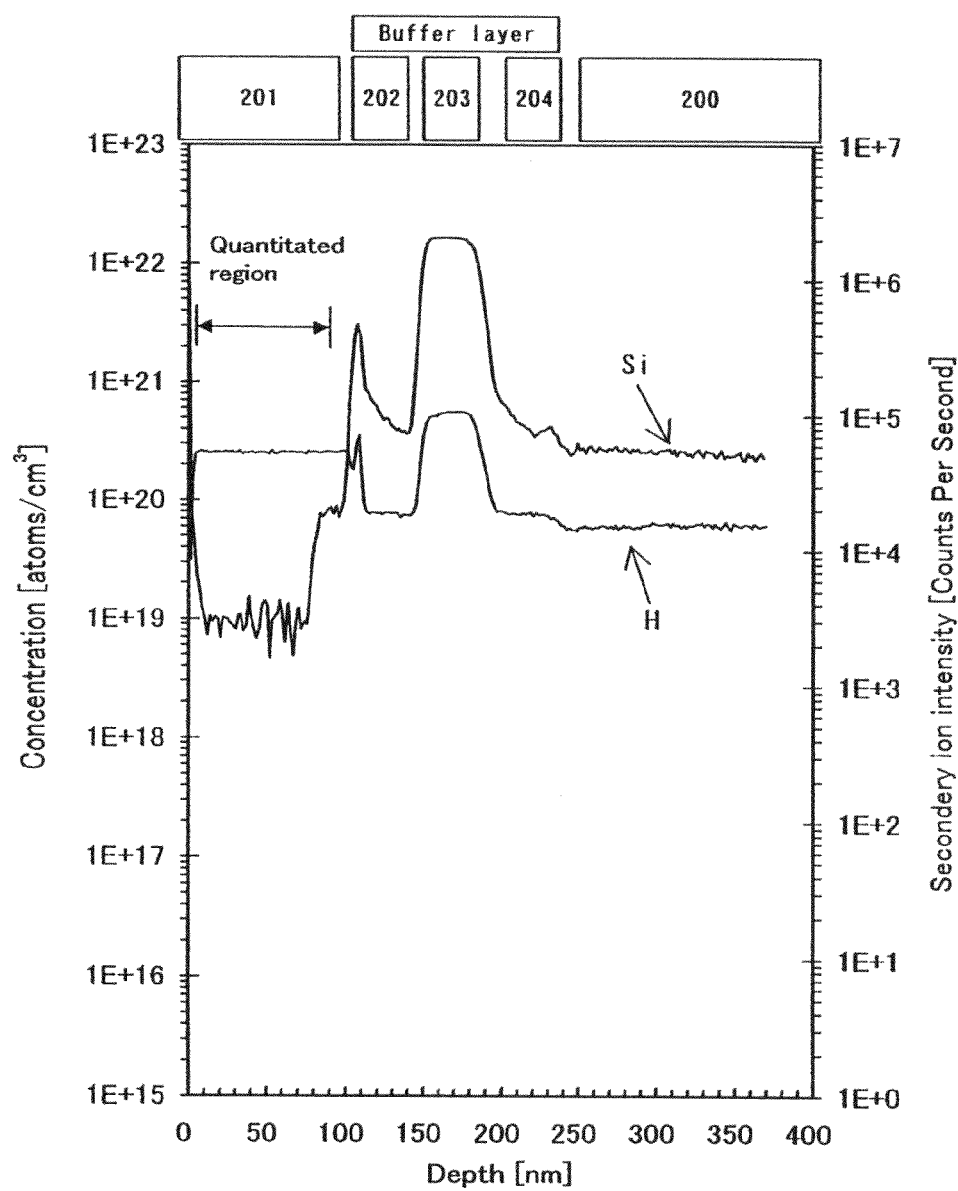
FIG. 43 is a depth profile of a hydrogen concentration of a single crystal silicon layer by SIMS.

FIG. 43 is a depth profile of the hydrogen concentration of the semiconductor substrate A-1. In FIG. 43, the values of concentration profiles are effective only in the silicon layers.

As shown in FIG. 43, the hydrogen concentration of the single crystal silicon layer 201 of the semiconductor substrate A-1 is approximately $1 \times 10^{19}$ atoms/cm$^3$. That is, the hydrogen concentration of the single crystal silicon layer 201 of the semiconductor substrate can be higher than $5 \times 10^{18}$ atoms/cm$^3$ and lower than or equal to $5 \times 10^{20}$ atoms/cm$^3$ by the manufacturing method of Embodiment 1.

Embodiment 6

This embodiment explains that the lifetime of a single crystal semiconductor layer is improved by heat treatment which is performed after laser irradiation treatment, with reference to FIGS. 52A to 52H and FIG. 53. In order to evaluate the lifetime, a semiconductor substrate was manufactured which has been subjected to treatment with two kinds of conditions with respect to one substrate. A first condition is a method for manufacturing a semiconductor substrate according to the present invention in which laser irradiation treatment and heat treatment were performed on a single crystal semiconductor layer separated from a single crystal semiconductor substrate. As a second condition, heat treatment was performed but laser irradiation treatment is not performed.

Hereinafter, a method for manufacturing a semiconductor substrate in this embodiment is described. FIGS. 52A to 52H are diagrams showing a manufacturing process of a semiconductor substrate which was used for an experiment. In this embodiment, a semiconductor substrate was manufactured according to the manufacturing method of Embodiment Mode 1.

Figure 52A:
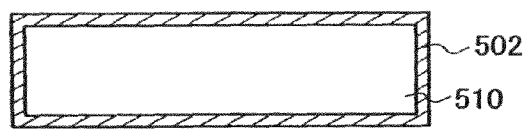
FIGS. 52A to 52H are cross-sectional views showing a method for manufacturing a semiconductor substrate of Embodiment 6.

First, a single crystal semiconductor substrate was subjected to thermal oxidation treatment in an atmosphere including HCl at 3 volume % with respect to oxygen, whereby a silicon oxide film 502 functioning as a first insulating layer was formed. The temperature of the thermal oxidation treatment was set to be 950° C. and the thickness of the thermal oxidation treatment was set to be 50 nm (FIG. 52A).

As a single crystal semiconductor substrate, a single crystal silicon wafer 510 was used. The single crystal silicon wafer is a rectangular substrate with 5 square inches. The single crystal silicon wafer has p-type conductivity, and the resistivity is approximately 5 Ω·cm to 40 Ω·cm. The main surface of the single crystal silicon wafer has a crystal orientation of (100), and the side surface thereof has a crystal orientation of <110>.

In order to form a damaged region in the single crystal silicon wafer 510, hydrogen ions were added to the single crystal silicon wafer 510 by using an ion doping apparatus. A 100% hydrogen gas was used as a source gas, and a single crystal silicon wafer substrate was irradiated with ions in plasma that has been generated by excitation of the hydrogen gas and accelerated by an electric field without mass separation. Accordingly, the damaged region 115 was formed. The hydrogen ion doping was performed under the following conditions: the power output of 100 W, the acceleration voltage of 25 kV, and the dosage of $1.8 \times 10^{16}$ ions/cm$^3$, for example.

Figure 52B:
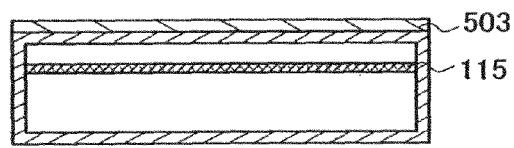

Next, a silicon nitride oxide film 503 functioning as a second insulating layer was formed by a PECVD method (FIG. 52B). The thickness of the silicon nitride oxide film was set to be 50 nm. For a process gas for forming the silicon nitride oxide film 503, $SiH_4$, $NH_3$, $N_2O$, and $H_2$ were used. The flow ratio is $SiH_4\backslash NH_3\backslash N_2O\backslash H_2=10\backslash 100\backslash 20\backslash 400$. The temperature of the film formation process was 300° C.

The single crystal silicon wafer provided with the silicon oxide film 502 and the silicon nitride oxide film 503 was subjected to ultrasonic cleaning in pure water, and was then cleaned with ozone-containing pure water. Further, the glass substrate 550 used as a supporting substrate was subjected to ultrasonic cleaning in pure water. As the glass substrate 550, a non-alkali glass substrate (product name: AN100) having a thickness of 0.7 mm was used.

Figure 52C:
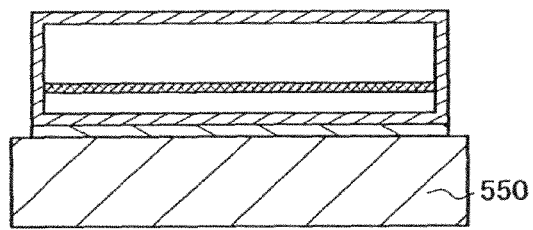
Figure 52D:
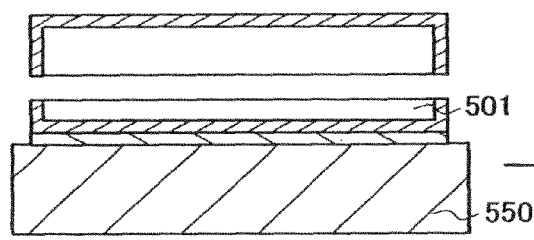

Next, the surface of the glass substrate 550 and the silicon oxynitride film 503 formed over the surface of the single crystal silicon wafer were disposed in contact with each other and bonded to each other (see FIG. 52C). Next, in order to cause separation in the damaged region 115, heat treatment was performed at 200° C. for 2 hours in a heating furnace to increase bonding strength between the glass substrate 550 and the silicon nitride oxide film 503, and then, heating was successively performed at 600° C. for 4 hours in the heating furnace. Accordingly, the single crystal silicon layer 501 was separated from the single crystal silicon wafer 510 and the single crystal silicon layer 501 was fixed to the glass substrate 550 (FIG. 52D).

The semiconductor substrate of this embodiment has a structure in which the silicon nitride oxide film 503, the silicon oxide film 502, and the single crystal silicon layer 501 are stacked in this order over the glass substrate 550. In this embodiment, the thickness of the single crystal silicon layer 501 which has been separated is approximately 120 nm.

After the surface of the single crystal silicon layer 501 was cleaned with pure water, the single crystal silicon layer 501 was treated with a 100-fold diluted hydrofluoric acid to remove a natural oxide film that was formed on the surface. Then, a surface of the single crystal silicon layer 501 was treated with ozone-containing water ($O_3$ water), whereby an oxide film was formed.

Figure 52E:
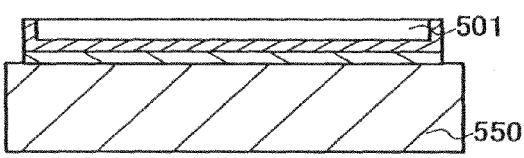
Figure 52F:
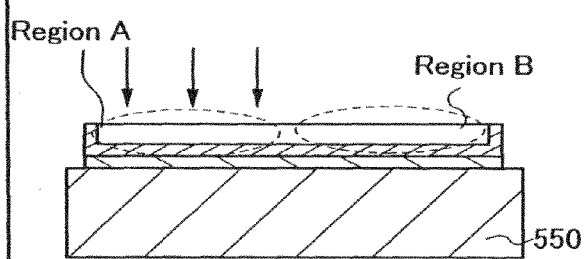

Next, the single crystal silicon layer 501 was subjected to first etching treatment, whereby the oxide film and the damaged region which has been left on the separation surface of the single crystal silicon layer 501 were removed (FIG. 52E). In this embodiment, the separation surface of the single crystal silicon layer 501 was subjected to dry etching, whereby the thickness of the single crystal silicon layer 501 was set to be approximately 110 nm. The etching condition in the first etching treatment is as follows.

power supplied to a coil-shaped electrode: 150 W
power supplied to a lower electrode: 40 W
reaction pressure: 1.0 Pa
etching gas (a flow rate of chlorine): 100 sccm After the first etching treatment was performed, the single crystal silicon layer 501 was treated with a 100-fold diluted hydrofluoric acid to remove a natural oxide film that was formed on the surface. Then, a region A of the single crystal silicon layer 501 was irradiated with a laser beam, so that the region A was melted and recrystallized (FIG. 52F). A region B of the single crystal silicon layer 501 was a region which is not irradiated with a laser beam, that is, a non-irradiated region.

For irradiation of the region A with a laser beam, a XeCl excimer laser which emits a beam at a wavelength of 308 nm was used. The pulse width of the laser beam is 25 nsec and the repetition rate is 30 Hz. Further, the energy density of the laser beam was set to be 782 mJ/cm$^2$. With an optical system, the laser beam was collected such that it has a linear beam shape on a surface irradiated with the laser beam, and scanning with the laser beam was performed in a width direction (a short-axis direction of the beam shape). The laser irradiation was performed with a nitrogen gas blown on an irradiated region at a room temperature.

After the surface of the single crystal silicon layer 501 was cleaned with pure water, the single crystal silicon layer 501 was treated with a 100-fold diluted hydrofluoric acid to remove a natural oxide film that was formed on the surface. Then, a surface of the single crystal silicon layer 501 was treated with ozone-containing water ($O_3$ water), whereby an oxide film was formed.

Figure 52G:
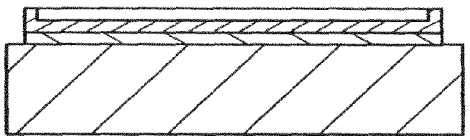

Then, the single crystal silicon layer 501 was subjected to second etching treatment, whereby the thickness of the single crystal silicon layer 501 was reduced to approximately 50 nm (FIG. 52G). Note that etching conditions are similar to the conditions of the first etching treatment which is shown in FIG. 52E.

After the second etching treatment was finished, the semiconductor substrate was subjected to heat treatment in a nitrogen atmosphere in a vertical resistance heating furnace. In this embodiment, heat treatment was performed at 600° C. for 4 hours.

Through the above-described processes, the semiconductor substrate of this embodiment which includes the region A irradiated with a laser beam and the region B which is not irradiated with a laser beam, was manufactured.

In this embodiment, each lifetime of the region A and the region B in the single crystal silicon layer in the processes described below was measured in order to show that the lifetime of the single crystal semiconductor layer is improved by laser irradiation treatment and subsequent heat treatment. The lifetime was measured by the above-described μ-PCD method. Further, in Conditions 1 to 5, the lifetime of one semiconductor substrate was measured.

Figure 52H:
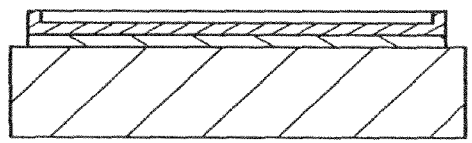

Condition 1: a single crystal silicon layer which was separated from a single crystal substrate (FIG. 52D)
Condition 2: the single crystal silicon layer which was subjected to first etching treatment (FIG. 52E)
Condition 3: the single crystal silicon layer which was subjected to laser irradiation treatment (FIG. 52F)
Condition 4: the single crystal silicon layer which was subjected to second etching treatment (FIG. 52G)
Condition 5: the single crystal silicon layer which was subjected to heat treatment (FIG. 52H)

Figure 53:
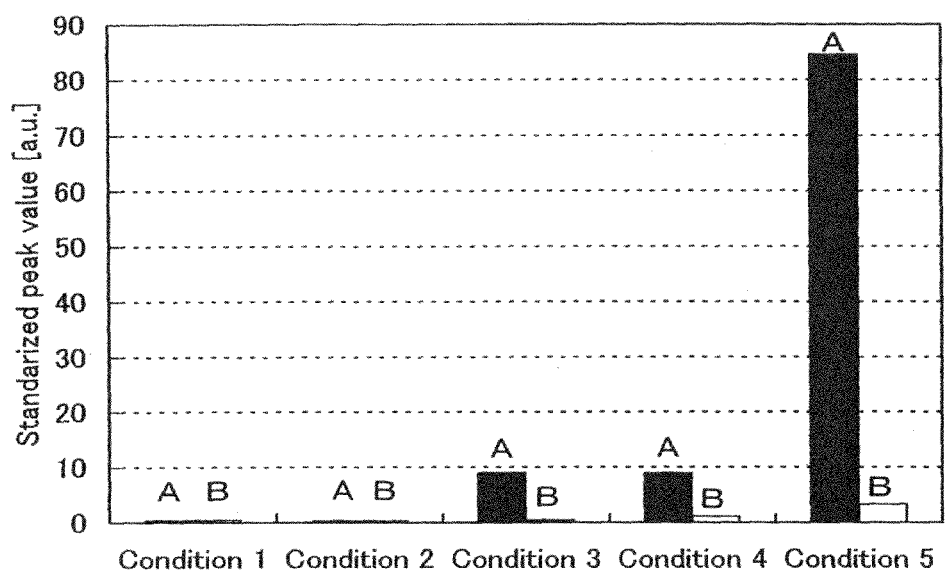
FIG. 53 is a graph showing a result of a lifetime evaluation of a single crystal silicon layer.

FIG. 53 shows the measurement result of the lifetime. In FIG. 53, the vertical axis represents a peak value of a detected signal of the reflected microwave. The larger the peak value, the longer the lifetime is; therefore, the lifetime can be evaluated based on the peak value. Note that the peak value is proportional to the thickness of the single crystal silicon layer; accordingly, in FIG. 53, a value which is normalized by dividing a peak value by a thickness is used for graphs. Further, in FIG. 53, a black bar graph represents a peak value in the region A, and a white bar graph represents a peak value in the region B. Note that the same value is shown in the regions A and B of Conditions 1 and 2 since there is no different between the conditions of the regions A and B.

By comparing the region A and the region B of Condition 3 in FIG. 53, it is found that the lifetime can be lengthened by laser irradiation treatment. Further, by comparing the region A of Condition 3 and the region A of Condition 5, it is found that the lifetime is greatly lengthened by performing heat treatment after laser irradiation treatment. Furthermore, by comparing the region B of Condition 3 and the region B of Condition 5, the lifetime is somewhat improved by heat treatment even in the case where laser irradiation is not performed; however, when the regions A and B of Condition 5 are compared, it is found that an effect of laser beam irradiation and heat treatment is greatly enhanced by combined use of laser beam irradiation and heat treatment.

As described above, by subjecting a single crystal silicon layer which is separated from a single crystal semiconductor substrate to laser irradiation treatment and subsequent heat treatment, the lifetime of the single crystal silicon layer can be greatly improved. Although the reason for the improvement has not been clear, it is likely that, by performing heat treatment on a single crystal silicon layer whose crystallinity has been recovered by laser irradiation treatment, the density of the charge trap center (for example, a dangling bond) which shortens the lifetime can be reduced in the single crystal silicon layer.

This application is based on Japanese Patent Application serial no. 2007-285591 filed with Japan Patent Office on Nov. 1, 2007, the entire contents of which are hereby incorporated by reference.

What is claimed is:

1. A method for manufacturing a semiconductor substrate comprising:
    irradiating a single crystal semiconductor substrate with accelerated ions, to form a damaged region in the single crystal semiconductor substrate at a predetermined depth from a surface of the single crystal semiconductor substrate;
    forming a buffer layer over at least one of a supporting substrate and the single crystal semiconductor substrate;
    disposing the supporting substrate and the single crystal semiconductor substrate in close contact with each other with the buffer layer interposed therebetween to fix the single crystal semiconductor substrate to the supporting substrate;
    causing a crack in the damaged region by heating of the single crystal semiconductor substrate and separating the single crystal semiconductor substrate from the supporting substrate at the damaged region to form a single crystal semiconductor layer separated from the single crystal semiconductor substrate;
    irradiating the single crystal semiconductor layer with a laser beam to melt the single crystal semiconductor layer for recrystallizing the single crystal semiconductor layer; and
    heating the recrystallized single crystal semiconductor layer at a temperature which is higher than or equal to 400° C. and at which the recrystallized single crystal semiconductor layer is not melted.

2. The method for manufacturing a semiconductor substrate according to claim 1, wherein a heating temperature of the recrystallized single crystal semiconductor layer is higher than or equal to 500° C.

3. The method for manufacturing a semiconductor substrate according to claim 1, wherein the supporting substrate has a strain point of higher than or equal to 650° C. and lower than or equal to 700° C.

4. The method for manufacturing a semiconductor substrate according to claim 1, wherein the supporting substrate is a glass substrate having a strain point of higher than or equal to 650° C. and lower than or equal to 700° C.

5. The method for manufacturing a semiconductor substrate according to claim 1, wherein a melted region in the irradiating of the single crystal semiconductor layer with the laser beam is shallower than a thickness of the single crystal semiconductor layer.

6. The method for manufacturing a semiconductor substrate according to claim 1, wherein the irradiating of the single crystal semiconductor layer with the laser beam is performed in an inert gas atmosphere.

7. The method for manufacturing a semiconductor substrate according to claim 6, wherein the inert gas is a nitrogen gas or a rare gas.

8. The method for manufacturing a semiconductor substrate according to claim 6, wherein an oxygen concentration of the inert gas atmosphere is lower than or equal to 30 ppm.

9. The method for manufacturing a semiconductor substrate according to claim 1, wherein the accelerated ions are formed by exciting hydrogen gas to generate plasma including $H_3^+$ and accelerating ions included in the plasma.

10. The method for manufacturing a semiconductor substrate according to claim 1, wherein the buffer layer includes a barrier layer for preventing sodium from penetrating the single crystal semiconductor layer.

11. The method for manufacturing a semiconductor substrate according to claim 1, wherein the buffer layer includes a layer formed of a silicon nitride film or a silicon nitride oxide film.

12. The method for manufacturing a semiconductor substrate according to claim 1, wherein the buffer layer includes an oxide film formed by oxidizing the single crystal semiconductor substrate.

13. The method for manufacturing a semiconductor substrate according to claim 1, wherein the buffer layer includes an insulating layer which is in contact with the single crystal semiconductor layer, and wherein the insulating layer comprises a silicon oxide film or a silicon oxynitride film.

14. A method for manufacturing a semiconductor substrate comprising:
    irradiating a single crystal semiconductor substrate with accelerated ions to form a damaged region in the single crystal semiconductor substrate at a predetermined depth from a surface of the single crystal semiconductor substrate;
    forming a buffer layer over at least one of a supporting substrate with a strain point of 700° C. or lower and the single crystal semiconductor substrate;
    disposing the supporting substrate and the single crystal semiconductor substrate in close contact with each other with the buffer layer interposed therebetween to fix the single crystal semiconductor substrate to the supporting substrate;
    causing a crack in the damaged region by heating of the single crystal semiconductor substrate and separating the single crystal semiconductor substrate from the supporting substrate at the damaged region to form a single crystal semiconductor layer separated from the single crystal semiconductor substrate;

irradiating the single crystal semiconductor layer with a laser beam to melt the single crystal semiconductor layer for recrystallizing the single crystal semiconductor layer; and heating the recrystallized single crystal semiconductor layer at a temperature which is higher than or equal to 400° C. and lower than or equal to the strain point and at which the recrystallized single crystal semiconductor layer is not melted.

15. The method for manufacturing a semiconductor substrate according to claim 14, wherein a heating temperature of the recrystallized single crystal semiconductor layer is higher than or equal to 500° C.

16. The method for manufacturing a semiconductor substrate according to claim 14, wherein the supporting substrate has the strain point of higher than or equal to 650° C. and lower than or equal to 700° C.

17. The method for manufacturing a semiconductor substrate according to claim 14, wherein the supporting substrate is a glass substrate having a strain point of higher than or equal to 650° C. and lower than or equal to 700° C.

18. The method for manufacturing a semiconductor substrate according to claim 14, wherein a melted region in the irradiating of the single crystal semiconductor layer with the laser beam is shallower than a thickness of the single crystal semiconductor layer.

19. The method for manufacturing a semiconductor substrate according to claim 14, wherein the irradiating of the single crystal semiconductor layer with the laser beam is performed in an inert gas atmosphere.

20. The method for manufacturing a semiconductor substrate according to claim 19, wherein the inert gas is a nitrogen gas or a rare gas.

21. The method for manufacturing a semiconductor substrate according to claim 19, wherein an oxygen concentration of the inert gas atmosphere is lower than or equal to 30 ppm.

22. The method for manufacturing a semiconductor substrate according to claim 14, wherein the accelerated ions are formed by exciting hydrogen gas to generate plasma including $H_3^+$ and accelerating ions included in the plasma.

23. The method for manufacturing a semiconductor substrate according to claim 14, wherein the buffer layer includes a barrier layer for preventing sodium from penetrating the single crystal semiconductor layer.

24. The method for manufacturing a semiconductor substrate according to claim 14, wherein the buffer layer includes a layer formed of a silicon nitride film or a silicon nitride oxide film.

25. The method for manufacturing a semiconductor substrate according to claim 14, wherein the buffer layer includes an oxide film formed by oxidizing the single crystal semiconductor substrate.

26. The method for manufacturing a semiconductor substrate according to claim 14, wherein the buffer layer includes an insulating layer which is in contact with the single crystal semiconductor layer, and wherein the insulating layer comprises a silicon oxide film or a silicon oxynitride film.

27. A method for manufacturing a semiconductor device comprising:

irradiating a single crystal semiconductor substrate with accelerated ions to form a damaged region in the single crystal semiconductor substrate at a predetermined depth from a surface of the single crystal semiconductor substrate;

forming a buffer layer over at least one of a supporting substrate with a strain point of 700° C. or lower and the single crystal semiconductor substrate;

disposing the supporting substrate and the single crystal semiconductor substrate in close contact with each other with the buffer layer interposed therebetween to fix the single crystal semiconductor substrate to the supporting substrate;

causing a crack in the damaged region by heating of the single crystal semiconductor substrate and separating the single crystal semiconductor substrate from the supporting substrate at the damaged region to form a single crystal semiconductor layer separated from the single crystal semiconductor substrate;

irradiating the single crystal semiconductor layer with a laser beam to melt the single crystal semiconductor layer for recrystallizing the single crystal semiconductor layer;

heating the recrystallized single crystal semiconductor layer at a temperature which is higher than or equal to 400° C. and lower than or equal to the strain point and at which the recrystallized single crystal semiconductor layer is not melted;

etching the heated single crystal semiconductor layer to be divided into a plurality of second single crystal semiconductor layers;

forming a gate insulating layer over the plurality of second single crystal semiconductor layers;

forming a gate electrode over the plurality of second single crystal semiconductor layers with the gate insulating layer interposed therebetween; and adding an impurity to be a donor or an acceptor to the plurality of second single crystal semiconductor layers.

28. The method for manufacturing a semiconductor device according to claim 27, wherein a heating temperature of the recrystallized single crystal semiconductor layer is higher than or equal to 500° C.

29. The method for manufacturing a semiconductor device according to claim 27, wherein the supporting substrate has the strain point of higher than or equal to 650° C. and lower than or equal to 700° C.

30. The method for manufacturing a semiconductor device according to claim 27, wherein the supporting substrate is a glass substrate having a strain point of higher than or equal to 650° C. and lower than or equal to 700° C.

31. The method for manufacturing a semiconductor device according to claim 27, wherein a melted region in the irradiating of the single crystal semiconductor layer with the laser beam is shallower than a thickness of the single crystal semiconductor layer.

32. The method for manufacturing a semiconductor device according to claim 27, wherein the irradiating of the single crystal semiconductor layer with the laser beam is performed in an inert gas atmosphere.

33. The method for manufacturing a semiconductor device according to claim 32, wherein the inert gas is a nitrogen gas or a rare gas.

34. The method for manufacturing a semiconductor device according to claim 32, wherein an oxygen concentration of the inert gas atmosphere is lower than or equal to 30 ppm.

35. The method for manufacturing a semiconductor device according to claim 27, wherein that the accelerated ions are formed by exciting hydrogen gas to generate plasma including $H_3^+$ and accelerating ions included in the plasma.

36. The method for manufacturing a semiconductor device according to claim 27, wherein the buffer layer includes a barrier layer for preventing sodium from penetrating the single crystal semiconductor layer.

37. The method for manufacturing a semiconductor device according to claim 27, wherein the buffer layer includes a layer formed of a silicon nitride film or a silicon nitride oxide film.

38. The method for manufacturing a semiconductor device according to claim 27, wherein the buffer layer includes a layer formed of an oxide film which is obtained by oxidizing the single crystal semiconductor substrate.

39. The method for manufacturing a semiconductor device according to claim 27, wherein the buffer layer includes an insulating layer which is in contact with the single crystal semiconductor layer, and wherein the insulating layer comprises a silicon oxide film or a silicon oxynitride film.

* * * * *

UNITED STATES PATENT AND TRADEMARK OFFICE
CERTIFICATE OF CORRECTION

PATENT NO.        : 7,851,318 B2
APPLICATION NO.   : 12/285924
DATED             : December 14, 2010
INVENTOR(S)       : Masaki Koyama et al.

It is certified that error appears in the above-identified patent and that said Letters Patent is hereby corrected as shown below:

At column 16, line 42, "$H_2^{+}$" should be -- $H_2^+$, --;

At column 16, line 50, "$H_2^{+}$" should be -- $H_3^+$ --;

At column 17, line 9, "$H_2+$" should be -- $H_2^+$ --;

At column 19, line 34, "$H_2^{+}$" should be -- $H_3^+$ --;

At column 20, line 28, "$H_2^{+}$" should be -- $H_3^+$ --;

At column 20, line 63, "do ping" should be -- doping --;

At column 42, line 47, "Across" should be -- A cross --;

At column 48, line 9, "FIG. 11" should be -- FIG. 1 --;

At column 79, line 44, "$R \geq 10$ nm" should be -- $R \leq 10$ nm --.

Signed and Sealed this
Twelfth Day of April, 2011

David J. Kappos
*Director of the United States Patent and Trademark Office*